US010411093B2

(12) United States Patent
Nakamura et al.

(10) Patent No.: US 10,411,093 B2
(45) Date of Patent: Sep. 10, 2019

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Katsumi Nakamura, Tokyo (JP); Tatsuo Harada, Tokyo (JP); Noritsugu Nomura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/755,098

(22) PCT Filed: Dec. 28, 2015

(86) PCT No.: PCT/JP2015/086557
§ 371 (c)(1),
(2) Date: Feb. 26, 2018

(87) PCT Pub. No.: WO2017/115434
PCT Pub. Date: Jul. 6, 2017

(65) Prior Publication Data
US 2018/0248003 A1    Aug. 30, 2018

(51) Int. Cl.
*H01L 29/08* (2006.01)
*H01L 29/78* (2006.01)
(Continued)

(52) U.S. Cl.
CPC .......... *H01L 29/083* (2013.01); *H01L 21/041* (2013.01); *H01L 21/0455* (2013.01);
(Continued)

(58) Field of Classification Search
None
See application file for complete search history.

(56) References Cited

U.S. PATENT DOCUMENTS

| 5,783,491 A | 7/1998 | Nakamura et al. |
| 2002/0117712 A1 | 8/2002 | Matsudai et al. |

(Continued)

FOREIGN PATENT DOCUMENTS

| JP | H07-263692 A | 10/1995 |
| JP | 2002-261282 A | 9/2002 |

(Continued)

OTHER PUBLICATIONS

International Search Report issued in PCT/JP2015/086557; dated Feb. 16, 2016.

(Continued)

*Primary Examiner* — Whitney Moore
(74) *Attorney, Agent, or Firm* — Studebaker & Brackett PC

(57) ABSTRACT

An active cell region, an edge termination region surrounding the active cell region and an intermediate region located at an intermediate position between these regions are provided, the active cell region has a trench gate type MOS structure on a top side, and a vertical structure on a bottom side includes a p-collector layer, an n-buffer layer on the p-collector layer, and an n-drift layer on the n-buffer layer, the n-buffer layer has a first buffer portion provided on the p-collector layer side, and a second buffer portion provided on the n-drift layer side, the peak impurity concentration of the first buffer portion is higher than the peak impurity concentration of the second buffer portion, and the impurity concentration gradient on the n-drift layer side of the second buffer portion is gentler than the impurity concentration gradient on the n-drift layer side of the first buffer portion.

28 Claims, 53 Drawing Sheets

(51) Int. Cl.
*H01L 29/861* (2006.01)
*H01L 29/868* (2006.01)
*H01L 21/04* (2006.01)
*H01L 21/225* (2006.01)
*H01L 29/06* (2006.01)
*H01L 29/739* (2006.01)
*H01L 29/36* (2006.01)
*H01L 29/66* (2006.01)
*H01L 29/16* (2006.01)
*H01L 29/20* (2006.01)
*H01L 21/263* (2006.01)

(52) U.S. Cl.
CPC ...... *H01L 21/2253* (2013.01); *H01L 21/2258* (2013.01); *H01L 29/0638* (2013.01); *H01L 29/36* (2013.01); *H01L 29/66128* (2013.01); *H01L 29/7397* (2013.01); *H01L 29/78* (2013.01); *H01L 29/861* (2013.01); *H01L 29/868* (2013.01); *H01L 29/8611* (2013.01); *H01L 21/263* (2013.01); *H01L 29/0688* (2013.01); *H01L 29/1602* (2013.01); *H01L 29/1608* (2013.01); *H01L 29/2003* (2013.01)

(56) References Cited

U.S. PATENT DOCUMENTS

| | | |
|---|---|---|
| 2011/0291223 A1 | 12/2011 | Nakamura |
| 2012/0267681 A1 | 10/2012 | Nemoto et al. |
| 2014/0070268 A1 | 3/2014 | Yoshimura et al. |
| 2014/0299915 A1 | 10/2014 | Kouno et al. |
| 2015/0235866 A1 | 8/2015 | Nakamura |
| 2016/0056306 A1 | 2/2016 | Masuoka et al. |
| 2016/0197143 A1* | 7/2016 | Naito ................ H01L 29/66348 257/334 |
| 2016/0260703 A1* | 9/2016 | Nakamura ............ H01L 29/404 |

FOREIGN PATENT DOCUMENTS

| | | |
|---|---|---|
| JP | 2009-176772 A | 8/2009 |
| JP | 2014-099643 A | 5/2014 |
| JP | 5622814 B2 | 11/2014 |
| JP | 2014-241433 A | 12/2014 |
| JP | 2015-179720 A | 10/2015 |
| WO | 2012/157772 A1 | 11/2012 |
| WO | 2013/080417 A1 | 6/2013 |
| WO | 2014/054121 A1 | 4/2014 |
| WO | 2014/199465 A1 | 12/2014 |
| WO | 2015/114748 A1 | 8/2015 |

OTHER PUBLICATIONS

Notification of Transmittal of Translation of the International Preliminary Report on Patentability issued in PCT/JP2015/086557; dated Jul. 12, 2018.

An Office Action mailed by the Japanese Patent Office dated Mar. 5, 2019, which corresponds to Japanese Patent Application No. 2017-558828 and is related to U.S. Appl. No. 15/755,098.

* cited by examiner

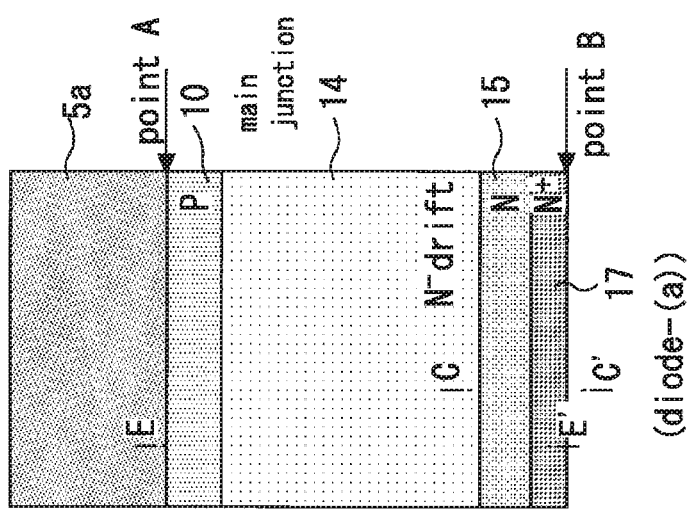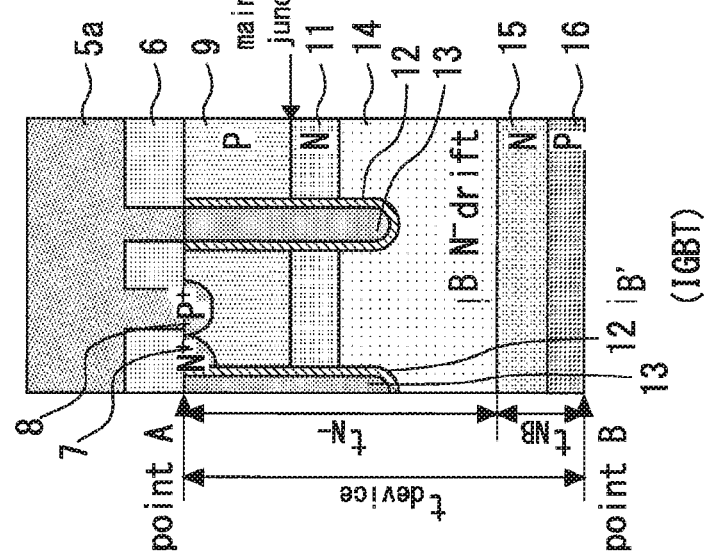

(a-2) under blocking voltage state

— : carrier concentration
······ : electric field
—·— : doping profile $$\frac{dE}{dx} = \frac{q}{\varepsilon_0 \varepsilon_r}(N^+_D + p - n)$$

here, $$p = \frac{J_p}{qv_{sat(p)}}$$

$$n = \frac{J_n}{qv_{sat(n)}}$$

(b) dynamic state

— : carrier concentration
······ : electric field
—·— : doping profile

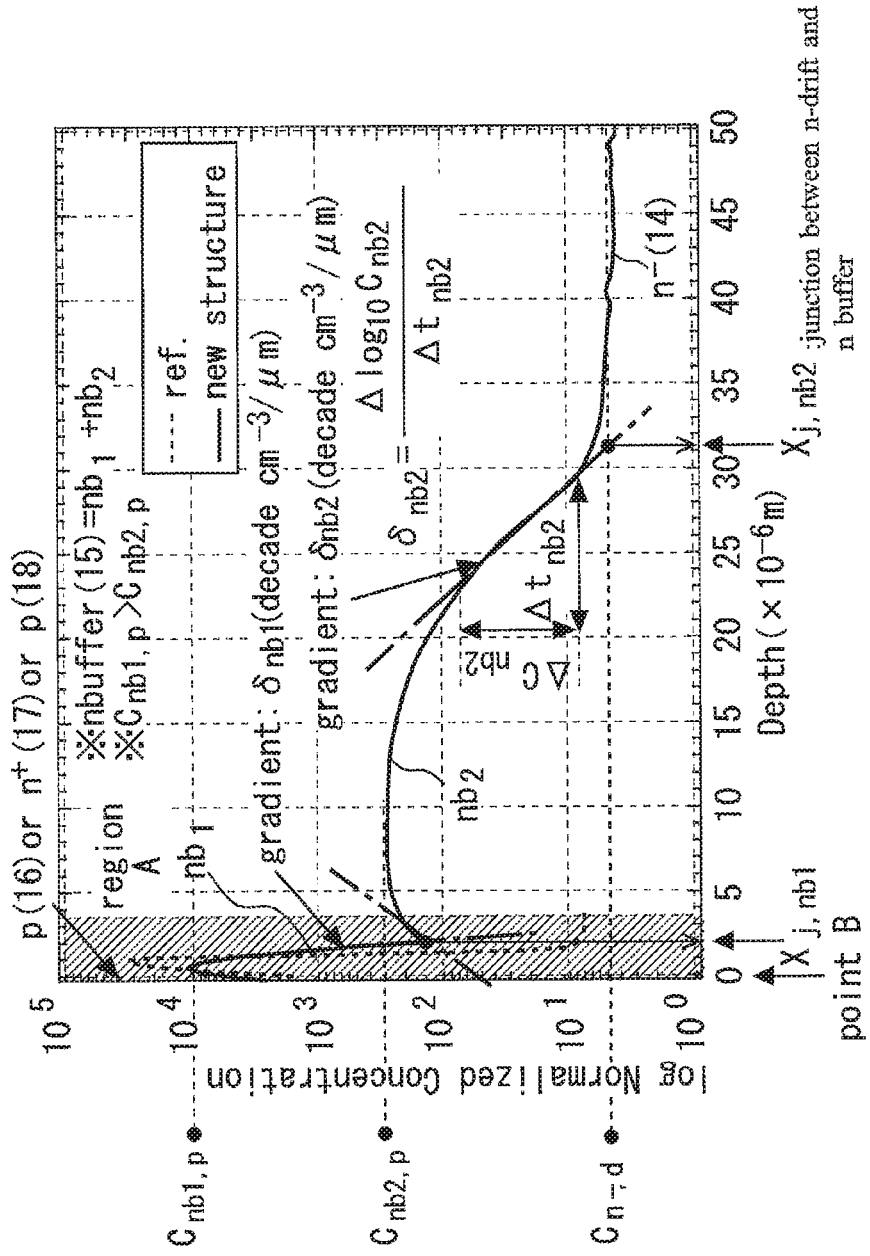

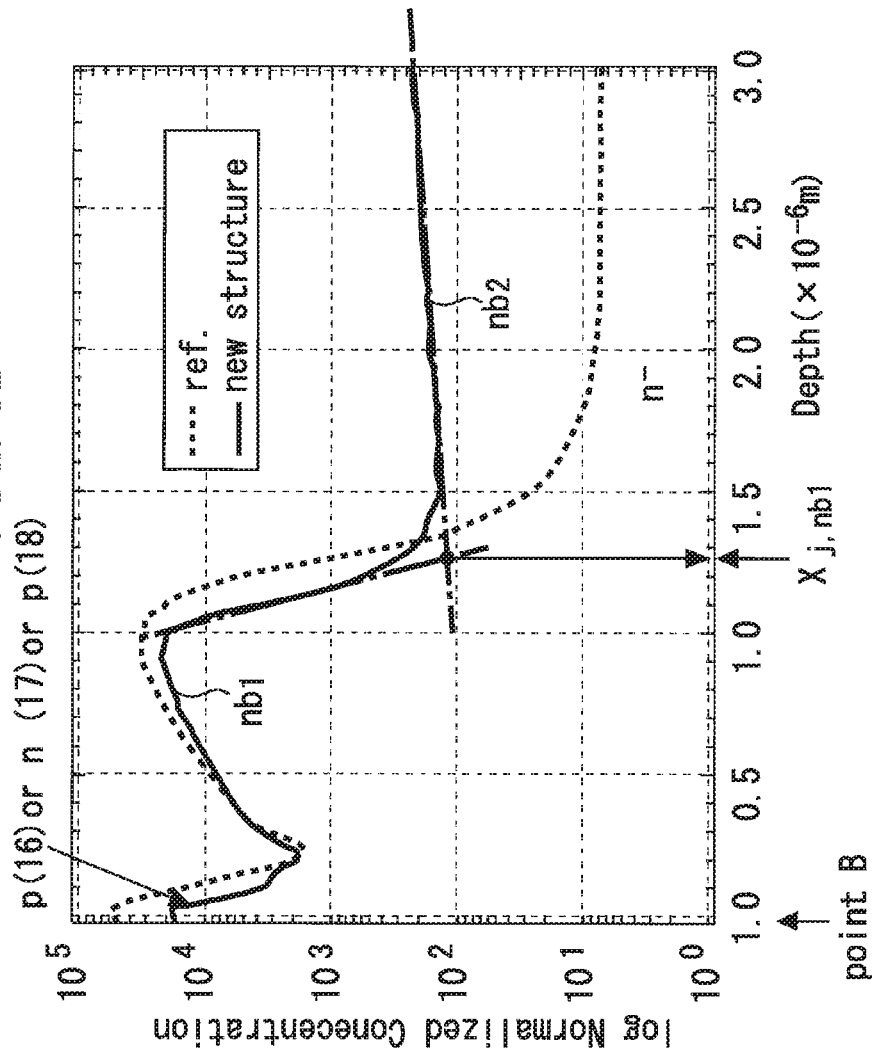

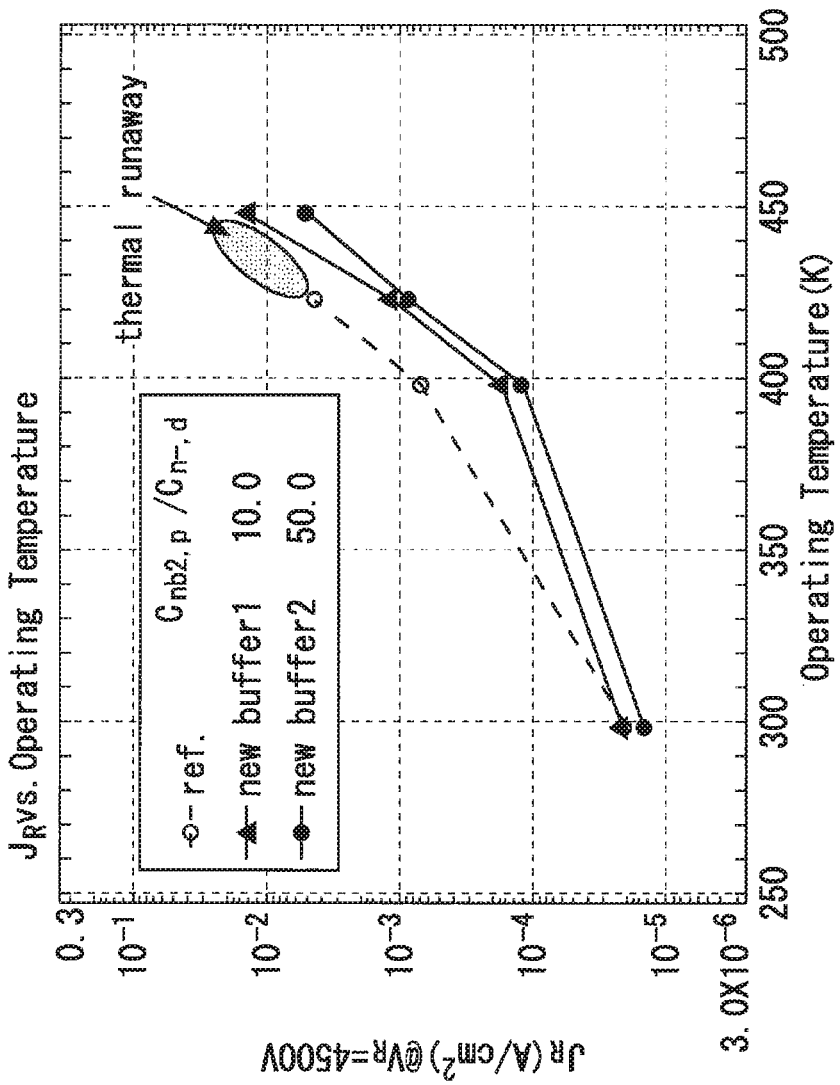

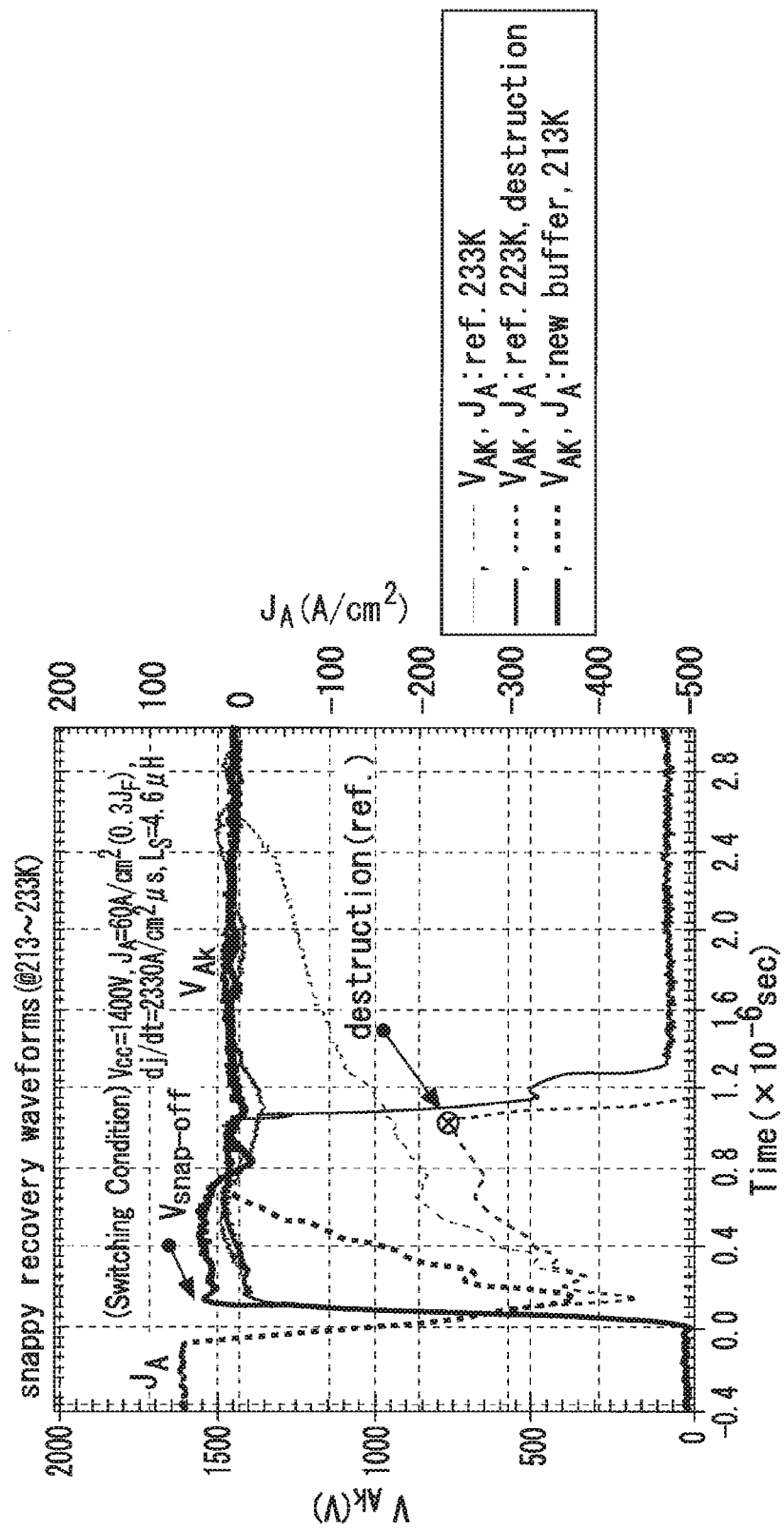

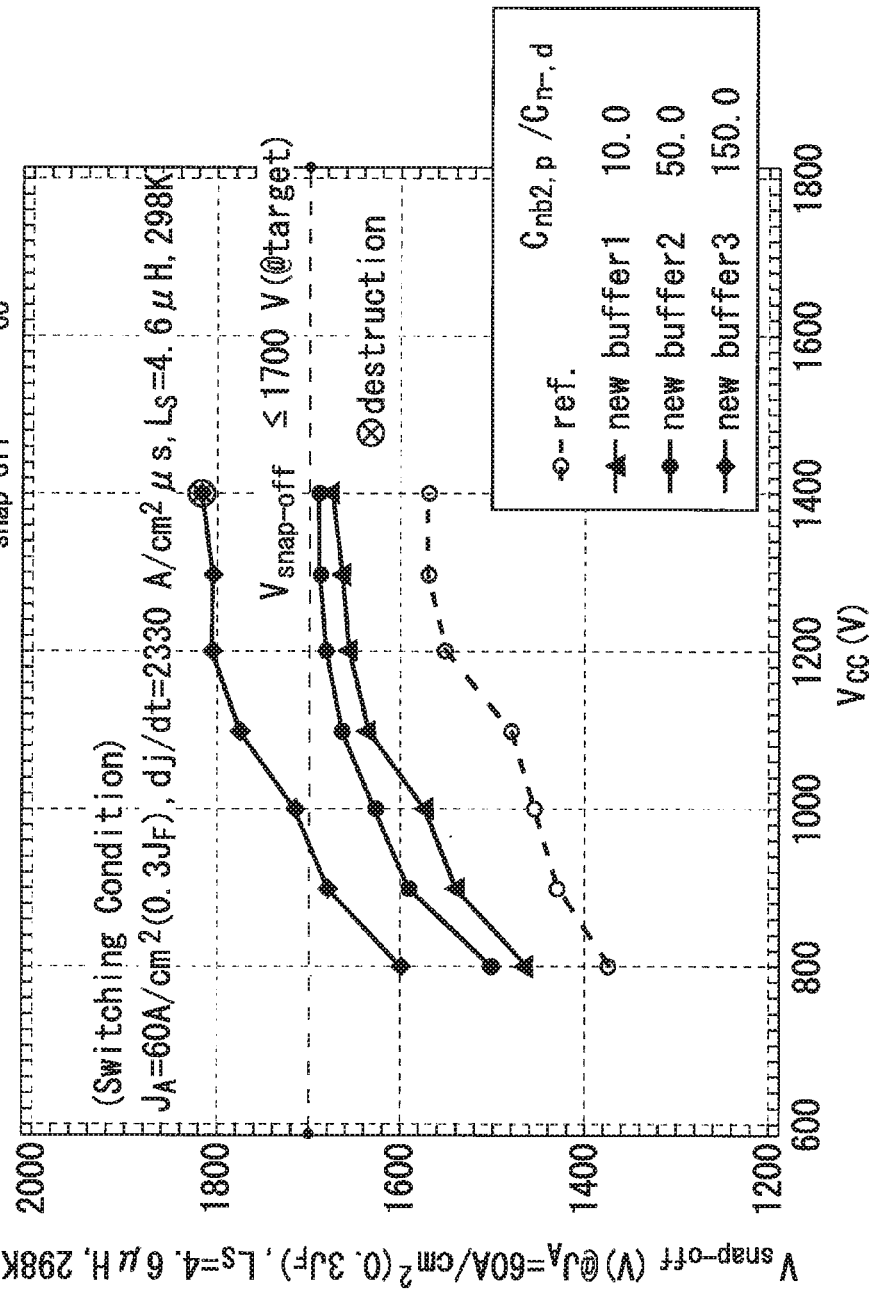

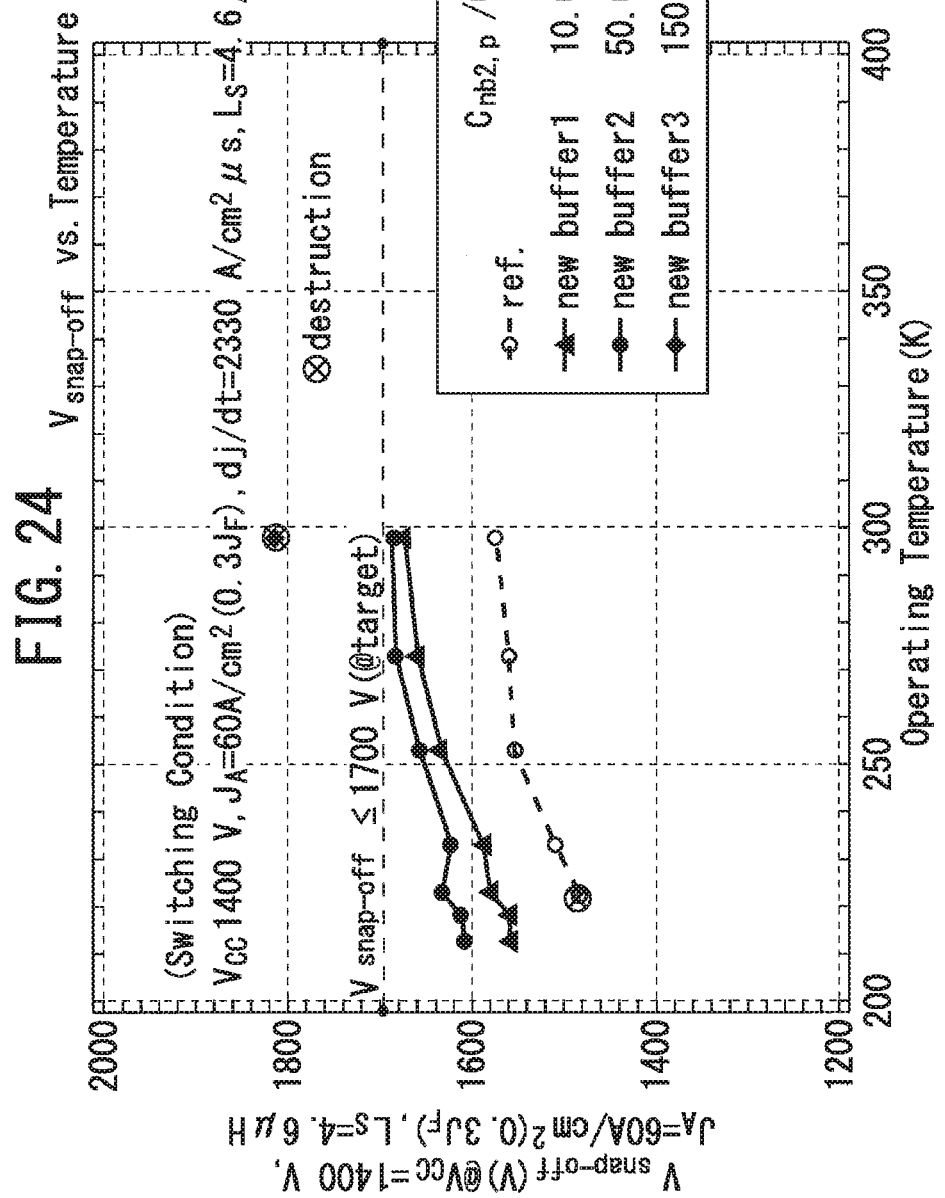

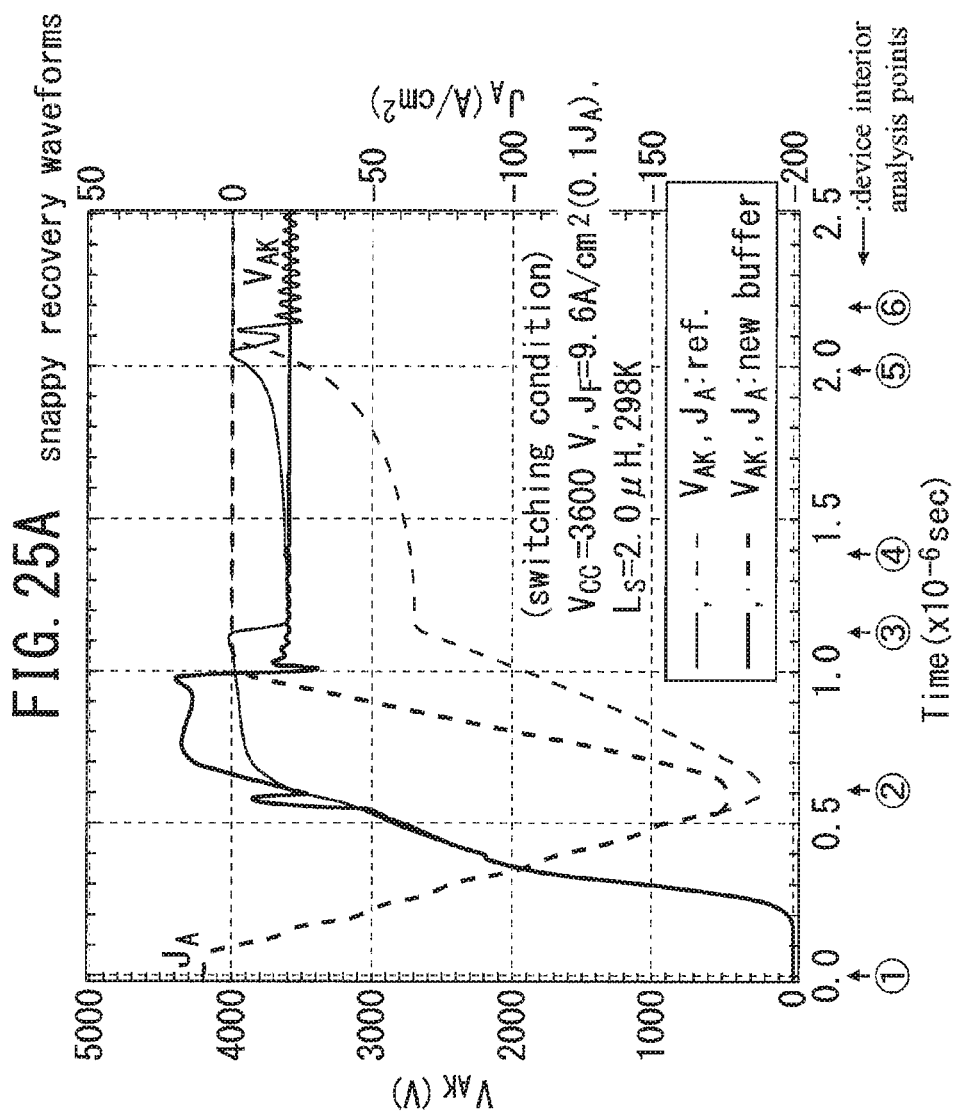

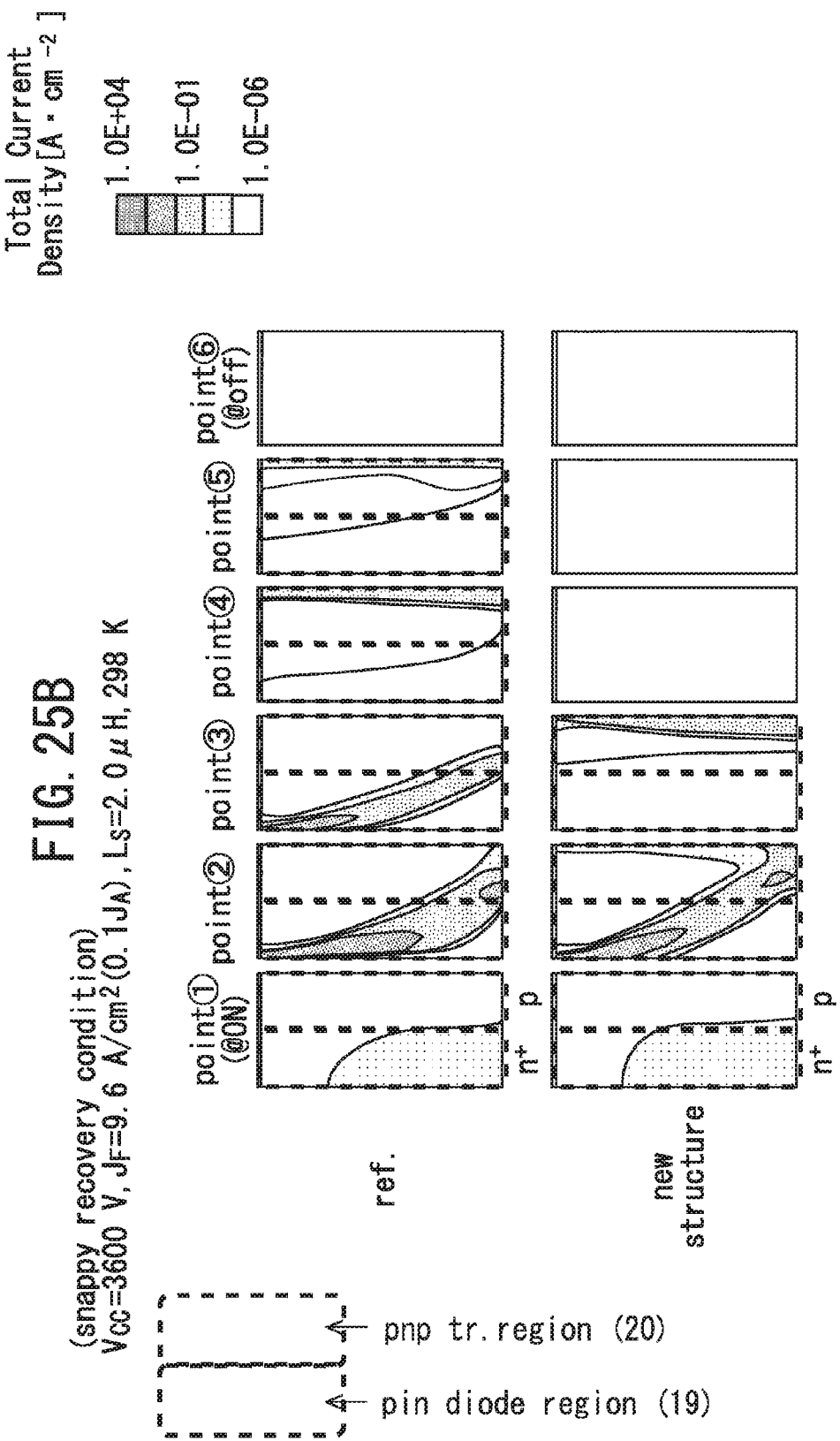

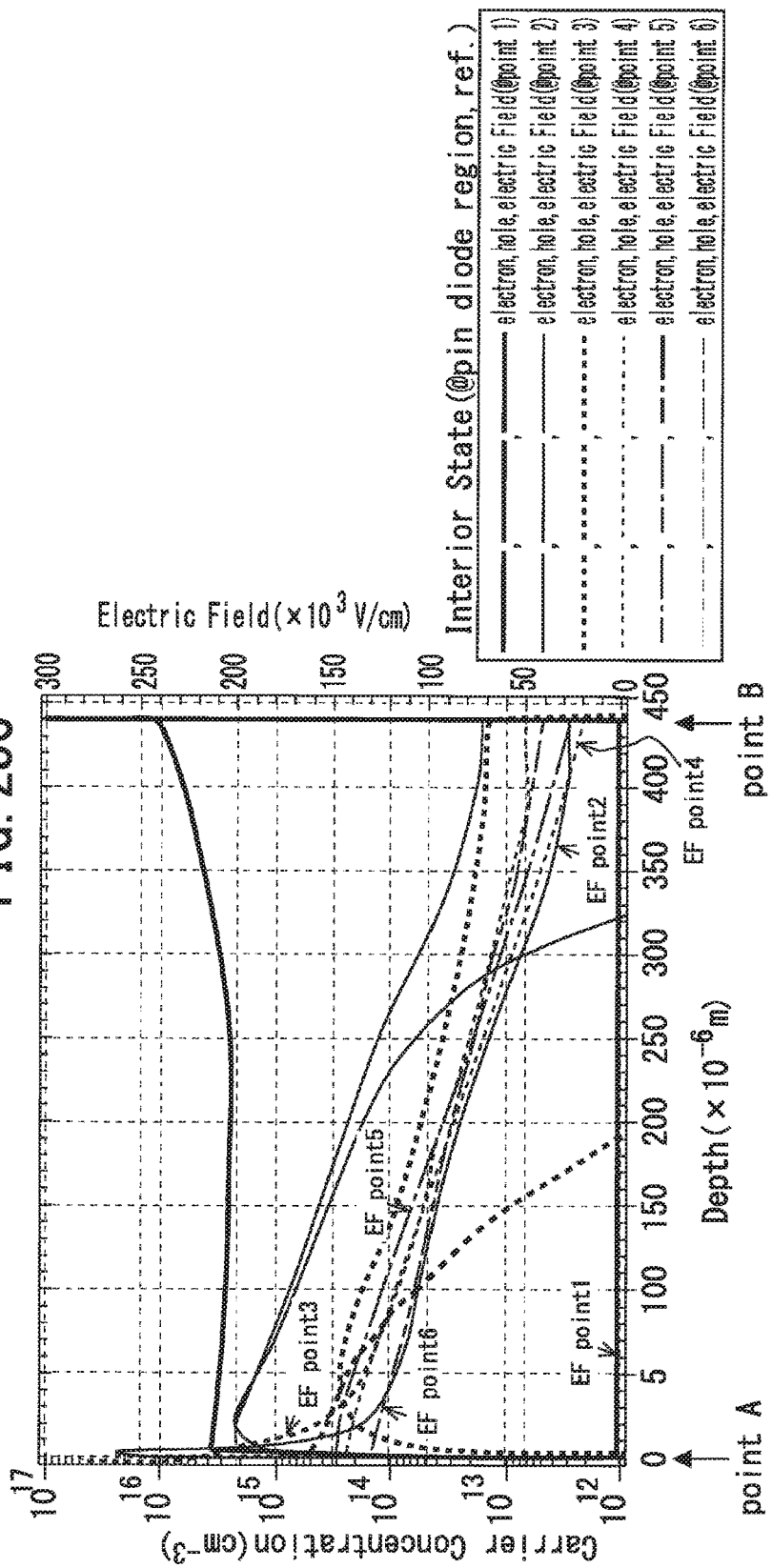

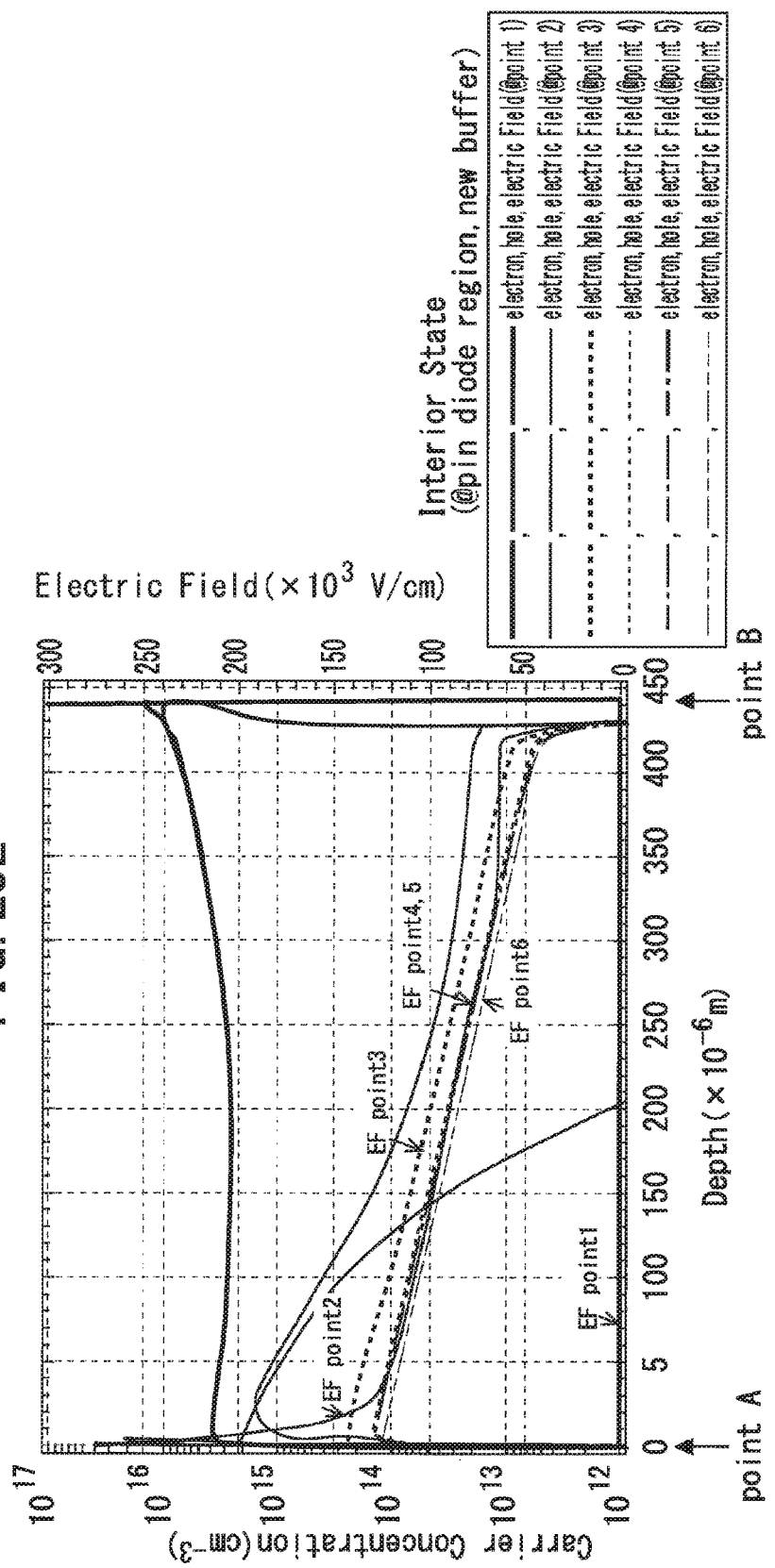

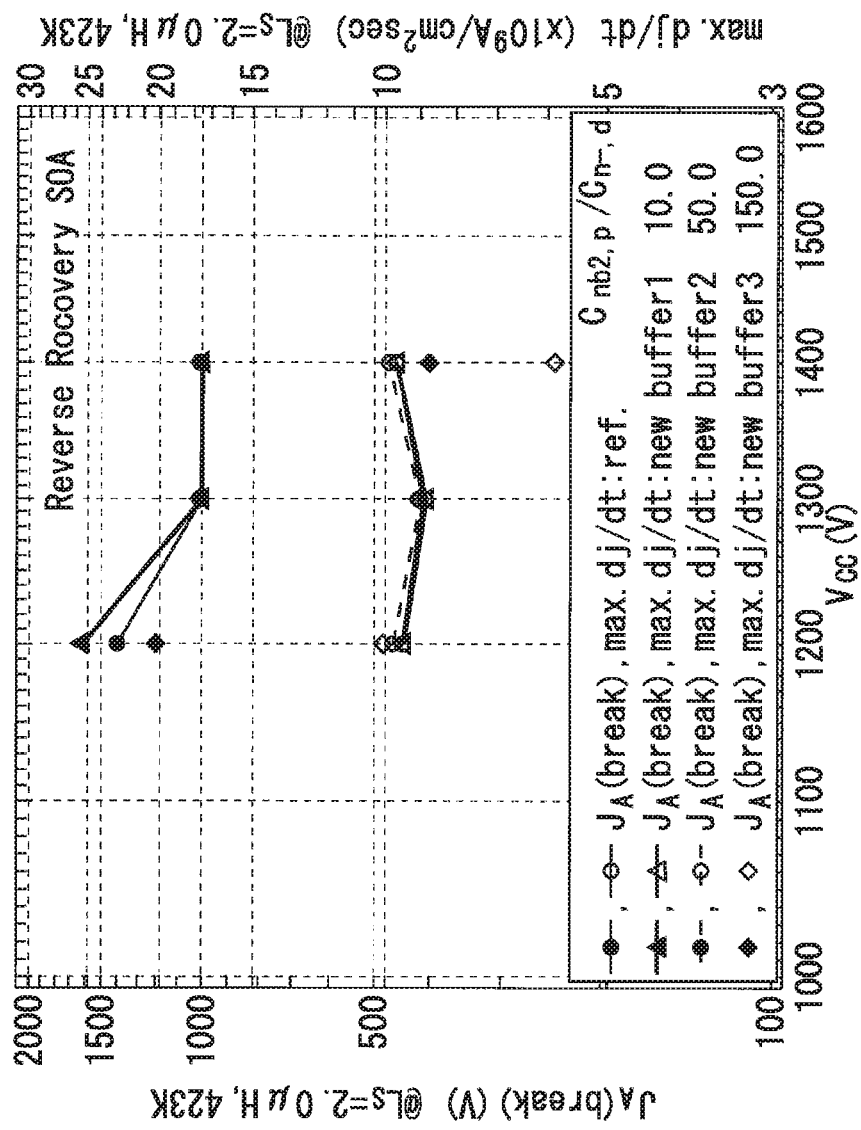

SEMICONDUCTOR DEVICE AND METHOD FOR MANUFACTURING SEMICONDUCTOR DEVICE

FIELD

The present invention relates to a semiconductor device such as an IGBT or a diode, for example, and a method for manufacturing the semiconductor device.

BACKGROUND

FIGS. 35A, B and C show a conventional trench gate type IGBT and two types of diode structures, respectively. An n-buffer layer 15 in FIG. 35 has an impurity profile of ref. in FIG. 6A. Furthermore, FIGS. 35A, B and C are cross-sectional structure diagrams of an A"-A'" line of a plan view of a power semiconductor chip shown in FIG. 1. As shown in FIGS. 1 and 35, the power semiconductor has the following four configurations.

Active cell region 1: a region for guaranteeing the basic performance of the power semiconductor chip.

Intermediate region 2: a region in which the active cell region 1 and an edge termination region 5 are joined to each other, and which is a region for guaranteeing breakdown resistance under dynamic operation of the power semiconductor and supporting the original performance of the active cell region 1.

Edge termination region 5: a region for retaining a withstand voltage under static state, guaranteeing the aspect of stability/reliability of a withstand voltage characteristic and suppressing breakdown resistance defective under dynamic operation to support the original performance of the active cell region.

Vertical Structure 35: a structure in which in addition to an n-drift layer 14, an n-buffer layer 15 and a p-collector layer 16 are contained in the IGBT of FIG. 35A, an n-buffer layer 15 and an n$^+$-cathode layer 17 are contained in a diode of FIG. 35B, and an n-buffer layer 15, an n$^+$-cathode layer 17 and a p-cathode layer 18 are contained in a diode of FIG. 35C. The n-drift layer is an n$^-$-layer, but it is transcribed as "n-drift layer" for simplification. This structure is a region for guaranteeing the performance on a total loss which is a loss obtained by adding a loss under ON state, a loss under turn-on state and a loss under turn-off state, withstand voltage retention under static state, stability of a withstand voltage characteristic, an off-loss which is a leak characteristic at high temperature under withstand voltage retention, and guarantee of reliability aspect, and controllability and breakdown resistance under dynamic operation to support the basic performance of the power semiconductor.

In the present IGBTs and diodes, Si wafers each of which is formed by an FZ (Floating Zone) method and typically has a concentration of an n-drift layer 14 required for each withstand voltage class of about $1.0 \times 10^{12}$ to $1.0 \times 10^{15}$ cm$^{-3}$ is used as an Si wafer material, and the wafer process as shown in FIGS. 4 and 5 is executed. In the used wafer process, the thickness of a device ($t_{device}$ in FIG. 2: 40 to 700 μm in FIG. 2) required to retain a voltage required for a withstand voltage class during this wafer process is formed with high accuracy as shown in FIG. 4L or FIG. 5H, and a vertical structure 35 is configured during a wafer process shown in FIG. 4M or FIG. 5I.

The following two points may be considered as a background under which the wafer process of configuring the vertical structure during the wafer process by using the FZ wafer as described above is becoming a mainstream.

A wafer in which an n-drift layer 14 is manufactured by an epitaxial method has a demerit that the Si wafer cost remarkably increases depending on an Si thickness formed by the epitaxial method. Only the concentration of the n-drift layer 14 is set to a proper value for each withstand voltage class by the FZ method, and Si wafers including n-drift layers 14 having the same thickness irrespective of the withstand voltage class are used at the start time of the wafer process so that the Si wafer cost does not change. Therefore, it is necessary to adopt wafers low in unit cost.

For the purpose of actively using wafers to be manufactured by the FZ method, the thickness is controlled to a thickness required for a withstand voltage class in the wafer process to configure a vertical structure, thereby minimizing, to the utmost, wafer process steps corresponding to various wafer thicknesses which cause problems as a wafer process using large-diameter wafers of 8 to 12 inches, and realizing the manufacturing of power semiconductors such as IGBTs, diodes, etc. at large diameters.

The impurity concentration of the n-drift layer 14 and the value of $t_{device}$ in FIG. 2 are device parameters which affect not only the withstand voltage characteristic of IGBTs or diodes, but also the total loss, and controllability and breakdown resistance under dynamic operation, and for which accuracy is required.

The details of the wafer process shown in FIGS. 4 and 5 have the same contents as described in PTLs 1 to 3. With respect to the vertical structure 35 configured in the wafer process as described above, the vertical structure 35 is formed in a step of FIG. 4L and a step of FIG. 5H and subsequently to an aluminum wiring step and a passivation film forming step. Therefore, for example in the case of IGBT, an MOS tr. structure is formed on a surface on which no vertical structure is formed, so that an aluminum wiring and a passivation film exist.

As a result, since an aluminum wiring exists on a surface on which no vertical structure is formed when diffusion layers 15 to 18 constituting a vertical structure are formed, the temperature is required to be set to a lower temperature than the melting point of metal. For example, the melting point of aluminum is equal to 660° C. There is used an annealing method for forming a temperature gradient in a device depth direction by using a laser having a wavelength at which no heat is transferred to a surface having no vertical structure thereon so that the temperature of the surface having no vertical structure thereon is set to a lower temperature than the melting point of metal. This annealing technique is a method called as laser anneal.

As a result, the impurity profile of the n-buffer layer 15 in an IGBT and a diode manufactured by the above-mentioned wafer process becomes a conspicuous impurity profile that has a shallow junction depth represented by Xj, nb1 which is equal to about 2.0 μm, and has a sharp impurity concentration gradient over the junction portion between the n-drift layer 14 and the n-buffer layer 15 like an impurity profile represented by ref. in FIGS. 6A and 6B. The impurity concentration gradient $\delta_{nb1}$ as described above is equal to 4.52 decade cm$^{-3}$/μm, for example.

In addition, the n-buffer layer 15 has such a feature on an n-layer forming process that an n-layer profile reproduces a profile in the depth direction in an ion implantation step of introducing impurities and diffusion in the depth direction and the lateral direction hardly occurs because the above-mentioned laser annealing technique is used.

PRIOR ART

Patent Literature

Patent literature 1: JP H7-263692A
Patent literature 2: Japanese Patent No. 5,622,814
Patent literature 3: International Publication No. WO2014/054121

SUMMARY

Technical Problem

In the IGBT and the diode which use the n-buffer layer 15 as described above, the following critical problems on performance exist. First, the power semiconductor may become uncontrollable due to increase of off-loss caused by increase of leak current under withstand voltage retention in a high-temperature state or due to thermal runaway caused by heat generation of the device itself at high temperature out of voltage retention capability (which may be hereinafter referred to as withstand voltage characteristic) which is important performance as the power semiconductor device, so that the semiconductor device falls into a state where it is impossible to guarantee the operation at high temperature.

Secondly, under dynamic operation such as turn-off operation of each of IGBT and a diode, a carrier plasma layer in the neighborhood of the junction portion between the n-drift layer 14 and the n-buffer layer 15 lacks due to the relationship between the carrier plasma state and the electric field strength distribution in the device, so that the electric field strength at the junction portion between the n-drift layer 14 and the n-buffer layer 15 increases, a voltage snap-off phenomenon (hereinafter referred to as snap-off phenomenon) at the termination of the turn-off operation on a turn-off waveform occurs, so that an oscillation phenomenon caused by the snap-off phenomenon occurs, or the snap-off phenomenon causes the voltage to increase to a voltage which is not less than a withstand voltage at which voltage retention can be performed, thereby destroying the device. The carrier plasma layer is a neutral layer having a high carrier concentration in which the electron and hole concentrations are substantially equal to each other, and also is a layer in which n≈p, the carrier density is higher than $10^{16}$ cm$^{-3}$, and the carrier concentration is higher by 2 to 3 orders than the doping carrier concentration of the n-drift layer 14.

As a result, in the conventional IGBT and diode, the controllability of the turn-off operation is bad, and deterioration of the breaking capability at the turn-off time is caused. An inverter system containing a power module in which an IGBT or a diode inducing the snap-off phenomenon and the subsequent oscillation phenomenon is installed contains a cause of occurrence of noise, which causes a malfunction.

Thirdly, from the feature in the process of forming the n-buffer layer 15, such a phenomenon as partial non-formation of the n-buffer layer 15 is likely to occur due to a scratch or a foreign matter on a surface on which the n-buffer layer 15 is formed, the scratch or the foreign matter occurring during the wafer process in the step of forming the vertical structures 35 shown in FIGS. 4 and 5. As a result, the IGBT and the diode become sensitized to a withstand voltage defective phenomenon, which causes increase of the proportion defective of the withstand voltage characteristic of the IGBT and diode chips.

As described above, under dynamic operation, the conventional IGBT and diode are in the state where the carrier plasma layer in the neighborhood of the junction portion between the n-drift layer 14 and the n-buffer layer 15 is liable to lack due to the relationship between the carrier plasma state and the electric field strength distribution in the device. When the carrier plasma layer in the neighborhood of the junction portion between the n-drift layer 14 and the n-buffer layer 15 lacks, it causes increase of the electric field strength at the junction portion between the n-drift layer 14 and the n-buffer layer 15 as a device interior state.

With respect to the waveform under turn-off operation, at the termination of the turn-off operation, the value of $dj_C/dt$ in the IGBT and the value of $dj_A/dt$ in the diode increase, and the snap-off phenomenon and then the oscillation phenomenon occur in the voltage waveform due to the relationship of $V=Ldj/dt$, and the device may be destroyed by the snap-off phenomenon. As a result, in both the IGBT and the diode, the controllability of the turn-off operation is degraded, and the breaking capability at the turn-off time is also degraded. The snap-off phenomenon and the oscillation phenomenon are also dependent on the turn-off operation condition. That is, these phenomena become remarkable under various conditions such as a high power supply voltage ($V_{CC}$) condition in which a depletion layer is liable to arrive at the junction portion between the n-drift layer 14 and the n-buffer layer 15, a low current density ($J_C$, $I_A$) condition in which the carrier density in the device decreases, or a high floating inductance ($L_S$) condition as a switching operation circuit parameter.

With respect to the voltage retention capability which is important performance as the power semiconductor, the power semiconductor becomes uncontrollable due to increase of off-loss caused by increase of leak current under withstand voltage retention in a high-temperature state, or due to thermal runaway caused by heat generation of the device itself at high temperature, so that the power semiconductor cannot operate at high temperature. Heat generating components of the power semiconductor contain a loss under ON-state, a switching loss as losses under ON and OFF of the switching operation, and an off-loss which is a loss under OFF-state. The foregoing situation means that the off-loss which is one of the three heat-generating components of the power semiconductor itself increases, and it becomes a problem in thermal design of a power module in which a power semiconductor is installed.

With respect to the foregoing problems, the conventional IGBT and diode have used means for appropriately adjusting the parameters of the n-drift layer 14 such as increase of the thickness of the n-drift layer 14, increase of the impurity concentration of the n-drift layer 14 to reduce the dispersion thereof or the like. However, when the thickness of the n-drift layer 14 is increased, both the IGBT and the diode have a trouble that ON-voltage increases and thus the total loss increases. On the other hand, reduction of the dispersion of the impurity concentration of the n-drift layer 14 causes restriction on Si-wafer manufacturing technique and Si-wafers used, which causes increase of the Si-wafer cost. As described above, a technical problem which is also to say as a dilemma on the improvement of the device performance exist in the conventional IGBT and diode.

As described above, it is difficult in the conventional IGBT and diode technique that the controllability of the turn-off operation and the turn-off breaking capability are enhanced while controlling the device interior state under dynamic operation, and the ON-voltage as the basic performance of the power semiconductor is lowered, and guarantee of the stable withstand voltage characteristic is realized. Therefore, there is required a structure of an n-buffer layer 15 in which the foregoing problem can be solved with a wafer manufactured by the FZ method and by a wafer process which is also adaptable to increase of the diameter of Si-wafers. Furthermore, there is also required an n-buffer layer which is insensitive to a phenomenon such as a withstand voltage defective of an IGBT and a diode caused by partial non-formation of the n-buffer layer 15, which occurs due to an adverse effect in the wafer process. That is, there is required an n-buffer layer which makes it difficult to induce the withstand voltage defective even when partial non-formation exists in the n-buffer layer 15.

The present invention has been implemented to solve the foregoing problem, and has an object to provide a semiconductor device and a method of manufacturing a semiconductor device that can solve the dilemma on an aspect of the device performance possessed by the conventional IGBT and diode, has a low ON-voltage and a stable withstand voltage characteristic, and can reduce the off-loss by reduced leak current under OFF-operation, enhance the controllability of the turn-off operation, and greatly enhance the turn-off breaking capability on the condition that a withstand voltage characteristic as basic performance of a power semiconductor is guaranteed.

Means for Solving the Problems

According to a present invention, a semiconductor device includes an active cell region, an edge termination region surrounding the active cell region, and an intermediate region located at an intermediate position between the active cell region and the edge termination region, wherein the active cell region has a trench gate type MOS structure on a top side thereof, and has a p-collector layer, an n-buffer layer on the p-collector layer and an n-drift layer on the n-buffer layer as a vertical structure on a bottom side thereof, and the n-buffer layer has a first buffer portion provided on a p-collector layer side, and a second buffer portion provided on an n-drift layer side, and wherein a peak impurity concentration of the first buffer portion is higher than a peak impurity concentration of the second buffer portion, and an impurity concentration gradient on the n-drift layer side of the second buffer portion is gentler than an impurity concentration gradient on the n-drift layer side of the first buffer portion.

According to another aspect of the present invention, a semiconductor device includes an active cell region, an edge termination region surrounding the active cell region, and an intermediate region located at an intermediate position between the active cell region and the edge termination region, wherein the active cell region has a p-anode layer on a top side, and has a cathode layer having an n-cathode layer, an n-buffer layer provided on the cathode layer and an n-drift layer on the n-buffer layer, wherein the n-buffer layer has a first buffer portion provided on a cathode layer side, and a second buffer portion provided on an n-drift layer side, and wherein a peak impurity concentration of the first buffer portion is higher than a peak impurity concentration of the second buffer portion, and an impurity concentration gradient on the n-drift layer side of the second buffer portion is gentler than an impurity concentration gradient on the n-drift layer side of the first buffer portion.

According to another aspect of the present invention, a semiconductor device includes an active cell region, an edge termination region surrounding the active cell region, and an intermediate region located at an intermediate position between the active cell region and the edge termination region, wherein the active cell region has a trench gate type MOS structure on a top side thereof, and has a p-collector layer, an n-buffer layer on the p-collector layer and an n-drift layer on the n-buffer layer as a vertical structure on a bottom side thereof, and the n-buffer layer has buffer portions of three or more layers that are different in peak impurity concentration and distance from a back surface of the n-buffer layer, and wherein the peak impurity concentration of the first buffer portion that is a buffer portion nearest to the p-collector layer is highest among a plurality of the buffer portions, and comparing impurity concentration gradients on the n-drift layer side of the plurality of buffer portions, the impurity concentration gradient of a buffer potion nearest to the n-drift layer is gentlest.

According to another aspect of the present invention, a semiconductor device includes an active cell region, an edge termination region surrounding the active cell region, and an intermediate region located at an intermediate position between the active cell region and the edge termination region, wherein the active cell region has a p-anode layer on a top side thereof, and has a cathode layer having an n-cathode layer, an n-buffer layer on the cathode layer and an n-drift layer on the n-buffer layer as a vertical structure on a bottom side thereof, and the n-buffer layer has buffer portions of three or more layers that are different in peak impurity concentration and distance from a back surface of the n-buffer layer, and wherein the peak impurity concentration of the first buffer portion that is a buffer portion nearest to the cathode layer is highest among a plurality of the buffer portions, and comparing impurity concentration gradients on the n-drift layer side of the plurality of buffer portions, the impurity concentration gradient of a buffer potion nearest to the n-drift layer is gentlest.

According to a present invention, method for manufacturing a semiconductor device can be characterized in that a vertical structure on a bottom side of a substrate includes an impurity layer doped with impurities, an n-buffer layer provided on the impurity layer, and an n-drift layer on the n-buffer layer, and the n-buffer layer having buffer portions of three or more layers that are different in peak impurity concentration and distance from a back surface of the n-buffer layer is formed by completing activation annealing on a first buffer portion which is a buffer portion nearest to the impurity layer among a plurality of the buffer portions, and then forming the remaining buffer portions.

Other features of the present invention will become apparent from the following description.

Advantageous Effects of Invention

According to the present invention, the impurity concentration gradient of a buffer layer in contact with an n-drift layer out of the buffer layer having plural buffer portions is gentle, and for example, the impurity concentration gradient is set to 0.05 to 0.50 decade $cm^{-3}/\mu m$, so that the characteristics of the semiconductor device can be improved.

BRIEF DESCRIPTION OF THE DRAWINGS

FIG. 2A is a cross-sectional view of an IGBT.
FIG. 2B is a cross-sectional view of a diode.

FIG. 2C is a cross-sectional view of a diode.

FIG. 6A is a diagram showing impurity concentration profiles along a B-B' line, a C-C' line, and a D-D' line in FIG. 2.

FIG. 6B is an enlarged view of an area A in FIG. 6A.

FIG. 21 is a diagram showing the n-buffer structure dependency of the $J_R$ vs. operation temperature characteristics of the 4500V class diode b structure in FIG. 2.

FIG. 22 is a diagram showing the n-buffer structure dependency with respect to the waveform at the snappy recovery operation of the 1700V class diode b structure in FIG. 2.

FIG. 23 is a diagram showing the n-buffer structure dependency of the relationship between $V_{snap-off}$ and Vcc in FIG. 22.

FIG. 24 is a diagram showing the n-buffer structure dependency of the relationship between $V_{snap-off}$ and operating temperature in FIG. 22.

FIG. 25A is a diagram showing the n-buffer structure dependency of simulation waveform at the snappy recovery operation of the 4500V class diode b structure in FIG. 2.

FIG. 25B shows a current density distribution within the 4500V class diode b in FIG. 2 at the inter-devise analysis points 1-6 in FIG. 25A.

FIG. 25C is a diagram showing a device interior state at the inter-devise analysis points 1-6 of FIG. 25A in a pin diode region within the 4500V class diode b structure in FIG. 2 using the conventional buffer structure of FIG. 6A.

FIG. 25E is a diagram showing a device interior state at the inter-devise analysis points 1-6 of FIG. 25A in a pin diode region within the 4500V class diode b structure in FIG. 2 using the buffer structure of present invention in FIG. 6A.

FIG. 26 is a diagram showing the n-buffer structure dependency of a recovery SOA characteristic in the 1700V class diode b structure of FIG. 2.

DESCRIPTION OF EMBODIMENTS

Figure 1:
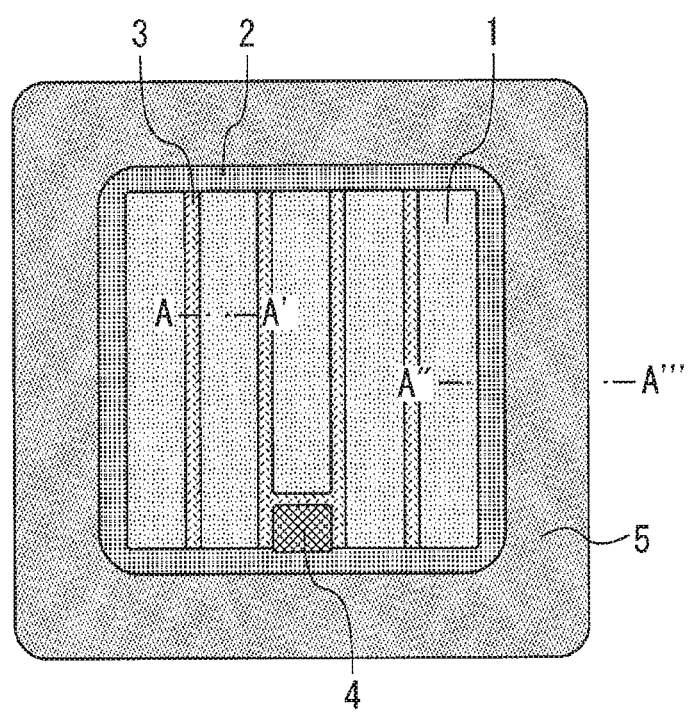
FIG. 1 is a plan view of a semiconductor device.

A semiconductor device and a method of manufacturing a semiconductor device according to an embodiment of the present invention will be described with reference to the drawings. The same or corresponding constituent elements are represented by the same reference numerals, and duplicative descriptions thereof may be omitted.

Embodiment 1

The present invention relates to a power semiconductor as a key component of a power module to which a voltage of, for example, 600V or more is applied. Particularly, the present invention relates to a bipolar type power semiconductor such as an IGBT and a diode that have the following structures, etc.:

(a) a vertical structure that enhances the voltage breaking capability under OFF-state, and reduces leak current at high temperature under withstand voltage retention to reduce off-loss and realize a high-temperature operation, (b) a vertical structure that suppresses a voltage snap-off phenomenon (hereinafter referred to as snap-off phenomenon) at the termination of the turn-off operation and the oscillation phenomenon caused by the snap-off phenomenon, (c) a vertical structure that enhances the breaking capability under turn-off operation which is a dynamic breakdown resistance, and (d) a vertical structure and a manufacturing technique that can be incorporated in a wafer process technique adaptable to increase of the diameter of wafers for manufacturing a semiconductor.

The vertical structure has an n-buffer layer 15 as a main constituent element out of constituent elements of an IGBT or a diode. The vertical structure means a structure formed at the bottom side of a substrate or wafer. Typically, the vertical structure of the IGBT contains a collector layer, an n-buffer layer and a drift layer. The vertical structure of a typical diode has a cathode layer containing only an n$^+$-cathode layer or an n$^+$-cathode layer and a p-cathode layer, an n-buffer layer provided on the cathode layer and an n-drift layer on the n-buffer layer.

Not only Si, but also a wideband gap semiconductor having a larger bandgap than Si may be used as the semiconductor material of an IGBT or a diode. For example, silicon carbide, a gallium-nitride based material or diamond may be used as the wide bandgap semiconductor. In the embodiment of the present invention, high withstand voltage classes of 1700 to 6500V will be exemplified. However, the present invention can obtain an effect for the foregoing object irrespective of the withstand voltage classes.

Figure 3A:
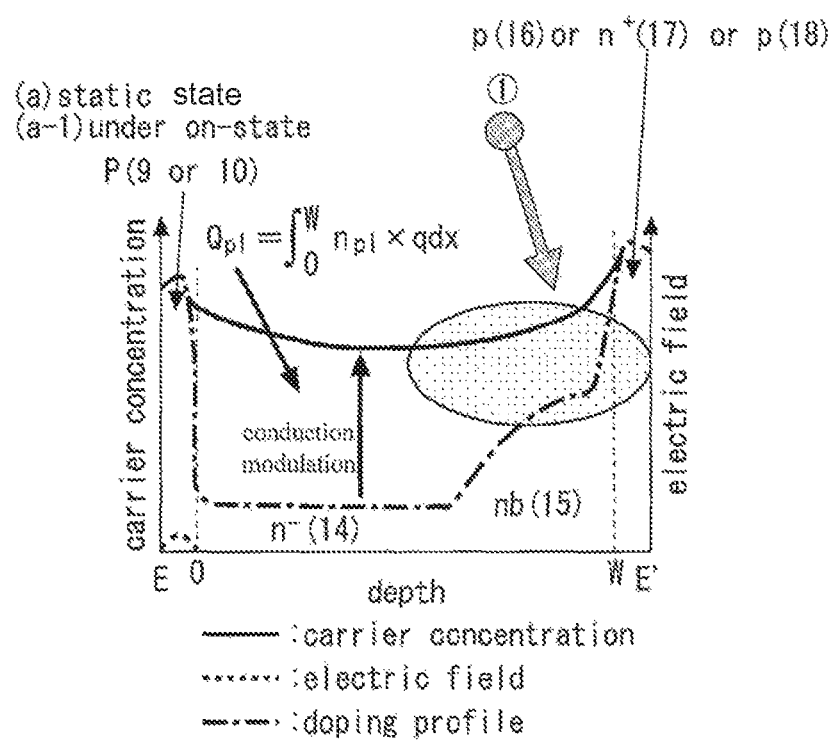
FIG. 3A is a figure explaining the function of the vertical structure.
Figure 3B:
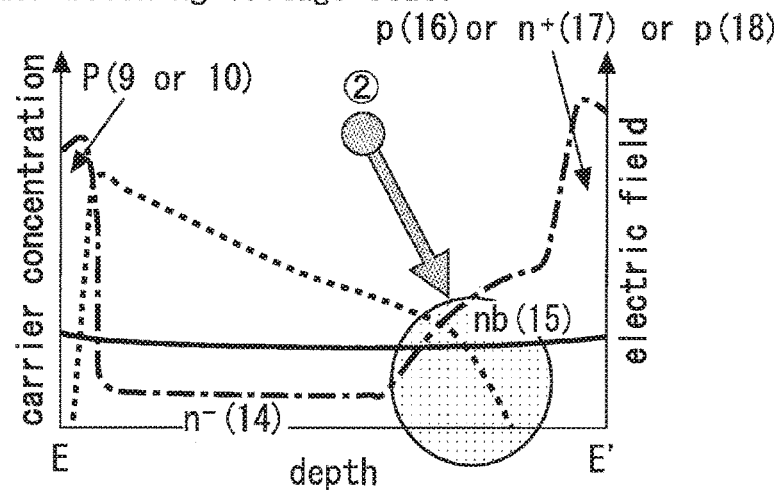
FIG. 3B is a figure explaining the function of the vertical structure.
Figure 3C:
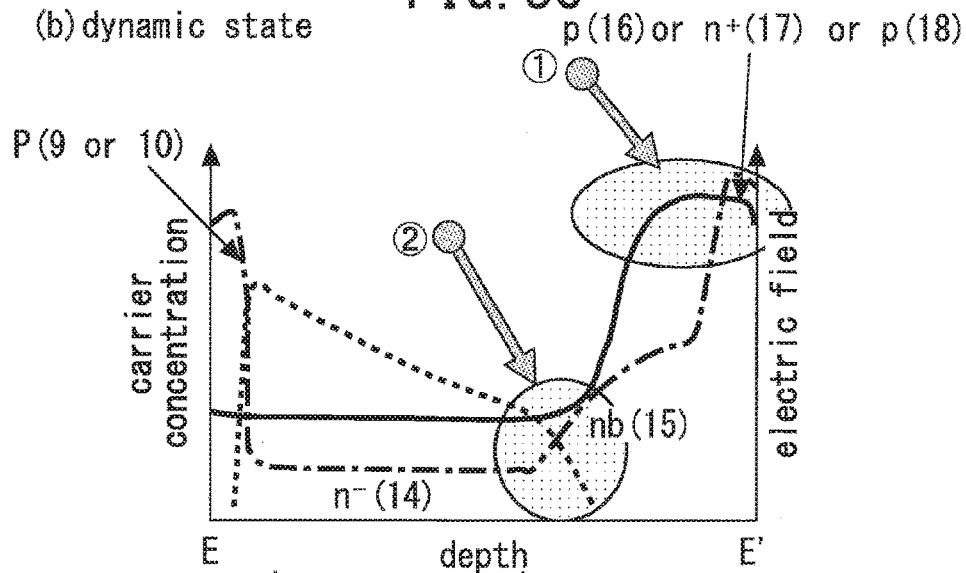
FIG. 3C is a figure explaining the function of the vertical structure.

An approach to a vertical structure proposed by the present invention is shown in FIG. 3.

The meanings of the respective symbols in FIG. 3 are as follows.

$Q_{pl}$: charge of plasma layer (charge of plasma layer)
$n_{pl}$: electron/hole concentration in plasma layer (electron/hole density in plasma layer)
V: potential
q: elementary charge (1.60218×10$^{-19}$ C)
$\varepsilon_0$: dielectric constant in vacuum (8.85418×10$^{-14}$ F/cm)
$\varepsilon_r$: relative dielectric constant (11.9 for Si)
$N^+_D$: ionized donor concentration (cm$^{-3}$)
n, p: free electron/hole concentration (cm$^{-3}$)
Jn, Jp: current density of electron/hole current (A/cm$^{-3}$)
vsat(n), vsat(p): saturation drift velocity of electron/hole (cm/s)

It is expected that the foregoing technical problem caused by the problem point of the vertical structures of the conventional IGBT and diode can be solved by realizing the following vertical structures which are particularly characterized by the n-buffer layer 15. The concept presented below is common to the IGBT and the diode. The approach to the n-buffer layer 15 constituting the vertical structure proposed by the present invention resides in the following (i), (ii) and (iii).

(i) With respect to the lacking phenomenon of the carrier plasma layer in the neighborhood of the junction portion between the n-drift layer 14 and the n-buffer layer 15 under turn-off operation, the carrier plasma layer is caused to remain as indicated by an arrow of (1) in FIG. 3A. That is, the concentration of the n-buffer layer 15 is reduced so that the carrier plasma layer exists by occurrence of a conductivity modulation phenomenon under device ON-state even in the n-buffer layer 15. Since the carrier plasma layer is a high concentration layer having a concentration of 10$^{16}$ cm$^{-3}$ or more, the concentration of the n-buffer layer 15 is set to $10^{15}$ cm$^{-3}$ order which is not more than the concentration of the carrier plasma layer.

(ii) The electric field strength is stopped in the n-buffer layer 15 under static state, and the concentration gradient in the neighborhood of the junction portion between the n-drift layer 14 and the n-buffer layer 15 is made moderate so that a depletion layer moderately extends in the n-buffer layer 15 under dynamic operation. Furthermore, the depletion layer is stopped in the n-buffer layer 15 due to the relationship with the carrier plasma layer remaining as indicated by an arrow of (2) in FIG. 3B. At this time, the gradient of an electric field strength distribution is expressed by a relational expression of dE/dx shown in FIG. 3B.

(iii) By forming the n-layer having a low concentration, a concentration gradient and a large thickness, the guarantee of the withstand voltage characteristic as the basic performance of the power semiconductor, that is, reduction of the off-loss based on low leak current under off-state by decreasing αpnp of pnp-tr. built in the IGBT of FIG. 2A and the diode of FIG. 2C under withstand voltage retention is realized.

That is, the n-buffer layer 15 of the present invention takes a role in controlling the carrier plasma state in the device during device operation under the condition that stabilization of the withstand voltage characteristic, reduction of the off-loss, etc. have been guaranteed. As a result, the snap-off phenomenon at the termination of the turn-off operation and the oscillation phenomenon caused by the snap-off phenomenon can be suppressed on the condition that the stabilization of the withstand voltage characteristic and the reduction of the off-loss of the IGBT and the diode have been guaranteed, so that a power semiconductor having excellent controllability for the switching operation is realized and the breakdown resistance under dynamic state can be enhanced. In addition, the IGBT and the diode are insensitive to the phenomenon such as the withstand voltage defective of the IGBT and the diode caused by partial non-formation of the n-buffer layer 15 which occurs due to an adverse effect in the wafer process, so that an effect of suppressing increase of the proportion defective of IGBT and diode chips is exhibited.

In an embodiment 1 of the present invention, there will be described an n-buffer layer 15 in which the snap-off phenomenon under turn-on operation and the subsequent oscillation phenomenon are suppressed, the breaking capability under short-circuit condition is enhanced, the withstand voltage breaking capability under off-state is enhanced, and the leak current at high temperature is reduced, and the low off-loss and the high-temperature operation are realized in the IGBT.

FIG. 1 is a plan view of an IGBT. FIG. 1 shows an edge termination region 5 surrounding an active cell region 1. An intermediate region 2 is provided at an intermediate position between the active cell region 1 and the edge termination region 5. In the active cell region 1 of FIG. 1, a surface gate wiring portion 3 and a gate pad portion 4 are shown, but in the case of a diode, these elements are replaced by an anode layer.

FIG. 2 is a cross-sectional view showing an IGBT having a trench gate structure containing the technique of the present invention along an A-A' line of FIG. 1. The "vertical structure" at the bottom side of the semiconductor device of the embodiment 1 has a p-collector layer 16, an n-buffer layer 15 provided on the p-collector layer 16 and an n-drift layer 14 on the n-buffer layer 15. The top side of the semiconductor device has a trench gate type MOS structure. The n-drift layer 14 shown in FIG. 2 is formed by using an FZ wafer which has an impurity concentration ($C_{n\text{-},d}$) of $1.0 \times 10^{12}$ to $1.0 \times 10^{15}$ cm$^{-3}$ and is manufactured by the FZ method. The final thickness ($t_{device}$ in FIG. 2) of the n-drift layer 14 ranges from 40 to 700 μm. The IGBT shown in FIGS. 2A and 4 has a structure in which a part of a trench portion 22 has the same potential as an aluminum wiring 5a of an emitter potential at an MOS tr. portion. The object and effect of this structure reside in suppression of the saturation current density, enhancement of short-circuit resistance by suppressing oscillation under a no-load end short-circuit condition based on capacity characteristic control, and realization of reduction of ON-voltage by enhancing the carrier concentration on the emitter side as disclosed in Japanese Patent No. 4,205,128 or Japanese Patent No. 4,785,334. The respective diffusion layers constituting an IGBT in FIG. 2A are formed by using ion implantation and the annealing technique in the wafer process shown in FIG. 4 so as to obtain the following parameters.

p-base layer 9: the peak impurity concentration ranges from $1.0 \times 10^{16}$ to $1.0E^{18}$ cm$^{-3}$, and the depth is a junction depth which is deeper than the n$^+$-emitter layer 7 and shallower than the N-layer 11.

n-layer 11: the peak impurity concentration ranges from $1.0 \times 10^{15}$ to $1.0E^{17}$ cm$^{-3}$, and the depth is deeper than the p-base layer 9 and shallower than the trench.

n$^+$-emitter layer 7: the peak impurity concentration ranges from $1.0 \times 10^{18}$ to $1.0E^{21}$ cm$^{-3}$, and the depth ranges from 0.2 to 1.0 μm.

p$^+$-layer 8: the surface impurity concentration ranges from $1.0 \times 10^{18}$ to $1.0E^{21}$ cm$^{-3}$, and the depth is a junction depth which is equal to or deeper than the n$^+$-emitter layer 7.

p-collector layer 16: the surface impurity concentration ranges from $1.0 \times 10^{16}$ to $1.0 \times 10^{20}$ cm$^{-3}$, and the depth ranges from 0.3 to 1.0 μm.

The n-buffer layer 15 has a first buffer portion nb1 provided on the side of the p-collector layer 16, and a second buffer portion nb2 provided on the side of the n-drift layer 14. That is, the n-buffer layer 15 has two n-layers of the first buffer portion nb1 and the second buffer portion nb2. The peak impurity concentration ($C_{nb1,p}$) of the first buffer portion nb1 ranges from $1.0 \times 10^{16}$ to $5.0 \times 10^{16}$ cm$^{-3}$. The depth ($X_{j,nb1}$) of the first buffer portion nb1 ranges from 1.2 to 5.0 μm. The peak impurity concentration ($C_{nb2,p}$) of the second buffer portion nb2 ranges from $5.0 \times 10^{13}$ to $5.0 \times 10^{14}$ cm$^{-3}$. The depth ($X_{j,nb2}$) of the second buffer portion nb2 ranges from 10.0 to 50.0 μm. $X_{j,nb1}$ and $X_{j,nb2}$ are shown in FIG. 6A.

Accordingly, the peak impurity concentration ($C_{cb1,p}$) of the first buffer portion nb1 is higher than the peak impurity concentration ($C_{nb2,p}$) of the second buffer portion nb2. It is preferable that the value obtained by dividing the peak impurity concentration ($C_{nb1,p}$) of the first buffer portion nb1 by the peak impurity concentration ($C_{nb2,p}$) of the second buffer portion nb2 is set in the range from 20 to 1000.

FIG. 6A shows impurity profiles in the depth direction along a B-B' line in FIG. 2A which is a cross-sectional view of an IGBT, a C-C' line in FIGS. 2B and 2C which are cross-sectional views of diodes, and a D-D' line in FIG. 2C. $C_{n\text{-},d}$ in FIG. 6A represents the impurity concentration of the n-drift layer 14. FIG. 6B is an enlarged view of an area A in FIG. 6A. Points of 0 μm on the abscissa axes of FIGS. 6A and 6B correspond to the respective surfaces (point B) of the p-collector layer 16, the n$^+$-cathode layer 17 and the p-cathode layer 18 in FIG. 3.

The curve of "new structure" in FIGS. 6A, 6B represents an impurity profile of the present invention, and the curve of "ref." represents a conventional impurity profile at the similar site. The n-buffer layer 15 has two n-layers of the first buffer portion nb1 and the second buffer portion nb2 which are different in peak impurity concentration ($C_{nb1,p}$, $C_{nb2,p}$) and depth ($X_{j,nb1}$, $X_{j,nb2}$). The first buffer portion nb1 has an impurity profile which has a concentration gradient ($\delta_{nb1}$) similar to that of the conventional n-buffer layer 15, and is similar to the impurity profile of the conventional n-buffer layer 15.

The second buffer portion nb2 has the following features. The position of the peak impurity concentration ($C_{nb2,p}$) is located to be nearer to the junction portion ($X_{j, nb1}$) between the first buffer portion nb1 and the second buffer portion nb2 than the center portion of the second buffer portion nb2. The impurity profile of the second buffer portion nb2 has a low concentration. Furthermore, the impurity profile of the second buffer portion nb2 has a concentration gradient ($\delta_{nb2}$) which is gentle in the depth direction to the junction portion ($X_{j,nb2}$) between the n-drift layer 14 and the second buffer portion nb2, and is formed deeply to the extent that it reaches the n-drift layer 14.

In order to cause the position of the peak impurity concentration ($C_{nb2,p}$) to be nearer to the junction portion ($X_{j,nb1}$) than the center portion of the second buffer portion nb2, the peak position when ion species are introduced into Si by ion implantation, an irradiation technique or the like to form the second buffer portion nb2 is set to be deeper than the junction portion ($X_{j, nb1}$). This setting is performed to stably form the second buffer portion nb2 without being affected by the first buffer portion nb1 and also to realize a desired impurity concentration gradient in the neighborhood of the junction between the second buffer portion nb2 and the n-drift layer 14 described later.

In order to quantitatively represent the relationship between the electrical characteristic of an IGBT and the concentration gradient of the second buffer portion nb2 being gentle in the depth direction, the definition of the impurity concentration gradient ($\delta_{nb2} = \Delta \log_{10} C_{nb2}/\Delta t_{nb2}$) in the neighborhood of the junction portion ($X_{j,nb2}$) of the second buffer portion nb2 is shown in FIG. 6A. The term $\Delta \log_{10} C_{nb2}$ represents the amount of change of the impurity concentration ($C_{nb2}$) of the second buffer portion nb2 shown in FIG. 6A, and log represents the common logarithm with base of 10. The term $\Delta t_{nb2}$ represents the amount of change of the depth ($t_{nb2}$) of the second buffer portion nb2 shown in FIG. 6A.

The respective junction depths of the first buffer portion nb1 and the second buffer portion nb2 are defined as follows. As shown in FIG. 6B, the junction portion ($X_{j,nb1}$) is defined as a point at which the tangential line of an inclined portion of the first buffer portion nb1 and the tangential line of an inclined portion on the side of the first buffer portion nb1 of the second buffer portion nb2 intersect to each other, that is, a point at which the gradient of the impurity concentration profile changes from negative to positive.

With respect to the junction portion ($X_{j,nb2}$), it is defined as a point at which a concentration extension line of the n-drift layer 14 and the tangential line of the inclined portion of the second buffer portion nb2 intersect to each other on a graph showing the relationship between the impurity concentration represented in a common logarithm expression and the depth shown in FIG. 6A. The n-buffer layer 15 of the present invention and the first buffer portion nb1 and the second buffer portion nb2 which constitute the n-buffer layer 15 satisfy the following relationship.

With respect to the peak impurity concentration ($C_{nb1,p}$) of the first buffer portion nb1 and the peak impurity concentration ($C_{nb2,p}$) of the second buffer portion nb2, $C_{nb1,p} > C_{nb2,p}$ is satisfied.

With respect to the junction portion ($X_{j,nb1}$) and the junction portion ($X_{j,nb2}$), $X_{j,nb1} < X_{j,nb2}$ is satisfied.

With respect to the impurity concentration gradient ($\delta_{nb1}$) of the first buffer portion nb1 and the impurity concentration gradient ($\delta_{nb2}$) of the second buffer portion nb2, $\delta_{nb1} > \delta_{nb2}$ is satisfied. It is shown in FIG. 6A that the impurity concentration gradient ($\delta_{nb1}$) on the junction portion $X_{j,nb1}$ side of the first buffer portion nb1 is larger than the impurity concentration gradient ($\delta_{nb2}$) on the junction portion $X_{j,nb2}$ side of the second buffer portion nb2.

From the foregoing relationship, the relationship between the role of each of the first buffer portion nb1 and the second buffer portion nb2 of the present invention and the role of the n-buffer layer as a target shown in FIG. 3 is as follows.

The first buffer portion nb1: takes a role in stopping a depletion layer extending from a main junction under static state, and exhibiting a stable withstand voltage characteristic and an off-loss decreasing effect based on low leak current under off-operation, that is, under withstand voltage retention. The decrease of the off-loss based on low leak current is more remarkable as the temperature increases to a high temperature of 398K or more, for example.

The second buffer portion nb2: takes a role in increasing the base width of pnp tr., resulting in decrease of αpnp, and exhibiting an off-loss decreasing effect based on low leak current under off-operation, that is, under withstand voltage retention. This effect is more remarkable as the temperature increases to a high temperature of 398K or more, for example. In addition, the second buffer portion nb2 takes a role in making the extending speed of the depletion layer extending from the main junction under static and dynamic states slower than that when moving in the n-drift layer 14, and causing a residual carrier plasma layer to maintain its existence from ON-state to control an electric field strength distribution. As a result, the snap-off phenomenon at the termination of the turn-off operation and the oscillation phenomenon caused by the snap-off phenomenon can be suppressed, the controllability for the switching operation can be enhanced, and the breakdown resistance under dynamic state can be enhanced.

Figure 7A:
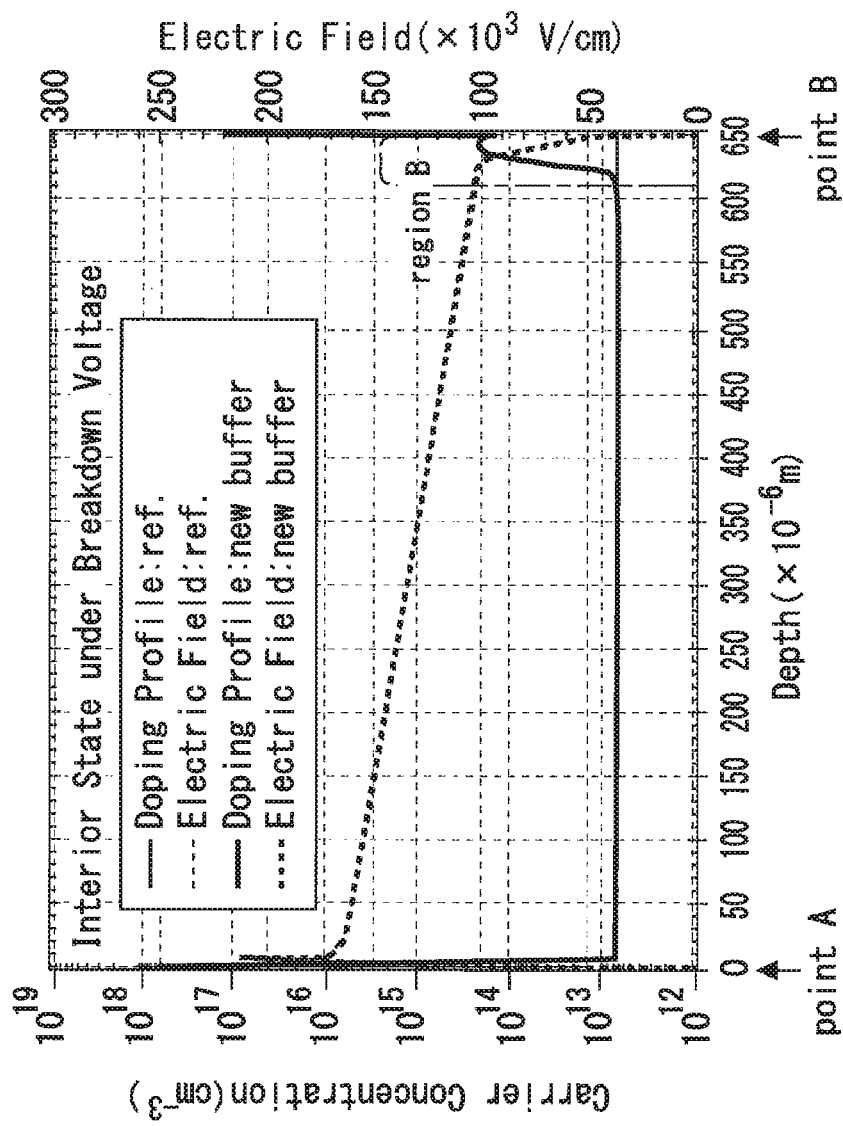
FIG. 7A is a diagram showing the simulation result concerning the electric field strength distribution in the device at the time of break down with regard to the IGBT structure of 6500V class in FIG. 2 having the buffer structure of FIG. 6A. Simulation conditions are $BV_{CES}=8400V$, $J_{CES}=1.0\times10^{-1}$ A/cm$^2$, and 298K.

FIG. 7A shows a simulation result concerning the electric field strength distribution in the device under voltage retention when the trench gate structure IGBT shown in FIG. 2A using the n-buffer layer 15 of the present invention is under static state. Since the simulated device is a 6500V-class device, the voltage under static state is equal to 8400V at 298K. The point at 0 μm on the abscissa axis of FIG. 7A corresponds to a point A site of FIG. 2A (the outermost surface of MOS tr.), and the point at 650 μm on the abscissa axis of FIG. 7A indicates a point B site as the surface of the p-collector layer 16 in FIG. 2A.

Figure 7B:
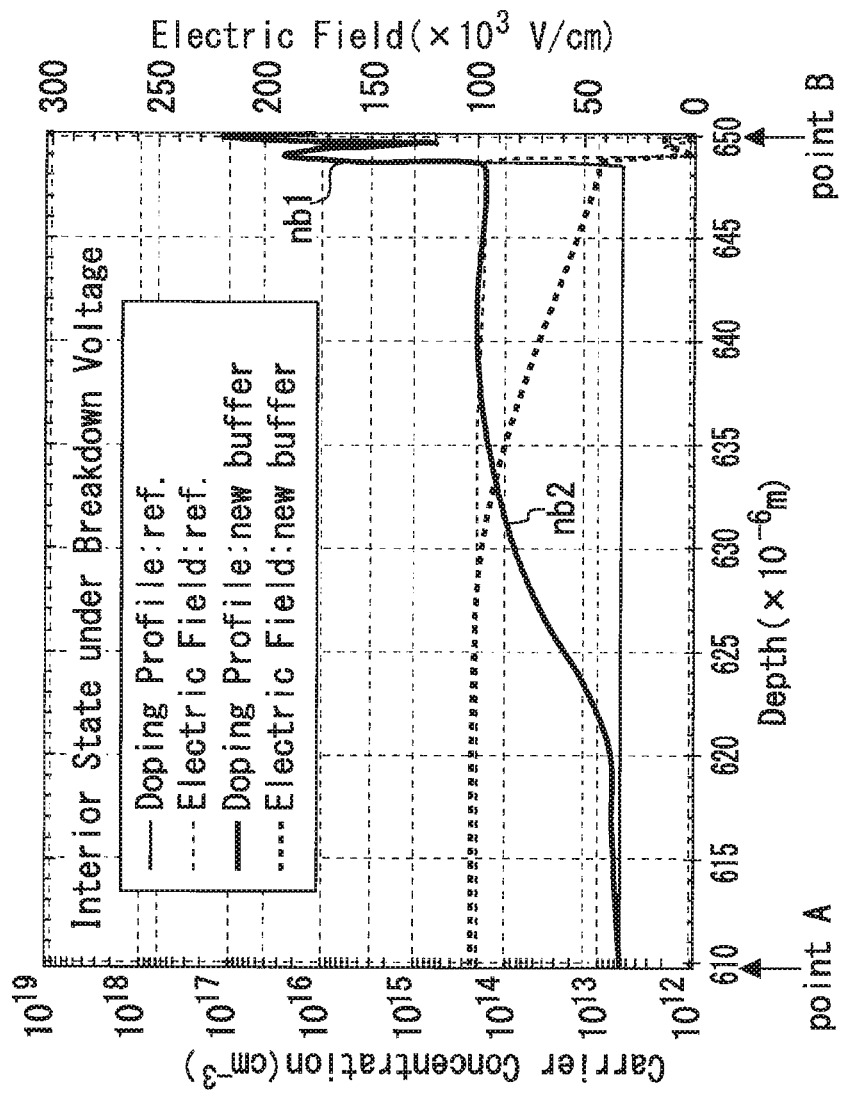
FIG. 7B is an enlarged view of an area B in FIG. 7A.

FIG. 7B is an enlarged view of an area B in FIG. 7A. It is understood from FIG. 7B that the depletion layer is stopped at the first buffer portion nb1 in both of the conventional structure represented by "ref." and the structure using the n-buffer layer 15 of the present invention represented by "new buffer" under the voltage retention of the device. It is further understood that the gradient of the electric field strength distribution varies more greatly in the second buffer portion nb2 than that in the n-drift layer 14 with respect to "new buffer". That is, the extending speed of the depletion layer is reduced by the second buffer portion nb2.

Figure 4A:
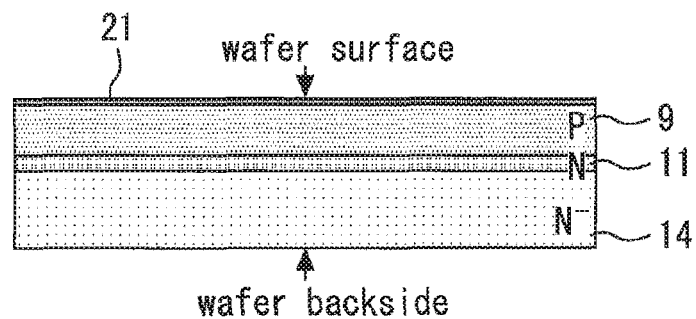
FIG. 4A is a process flow diagram of IGBT.
Figure 4B:
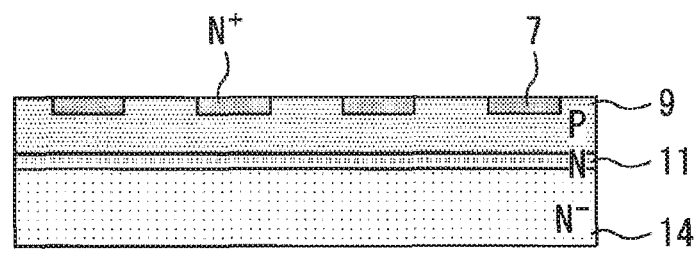
FIG. 4B is a process flow diagram of IGBT.
Figure 4C:
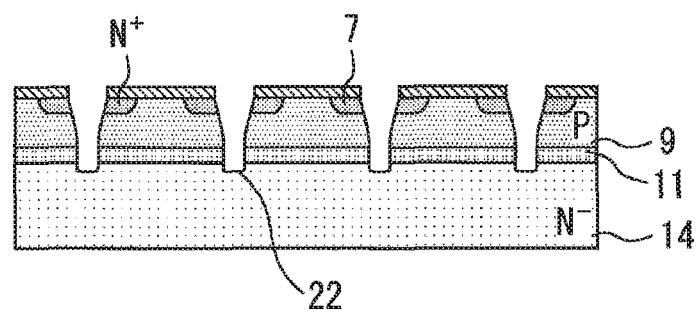
FIG. 4C is a process flow diagram of IGBT.
Figure 4D:
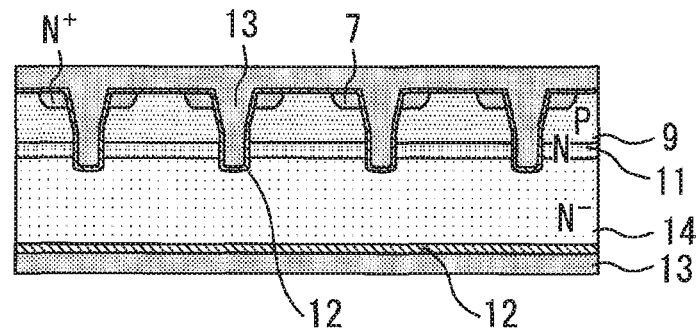
FIG. 4D is a process flow diagram of IGBT.
Figure 4E:
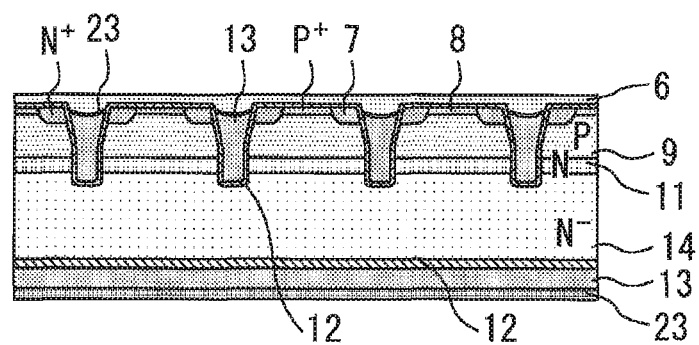
FIG. 4E is a process flow diagram of IGBT.
Figure 4F:
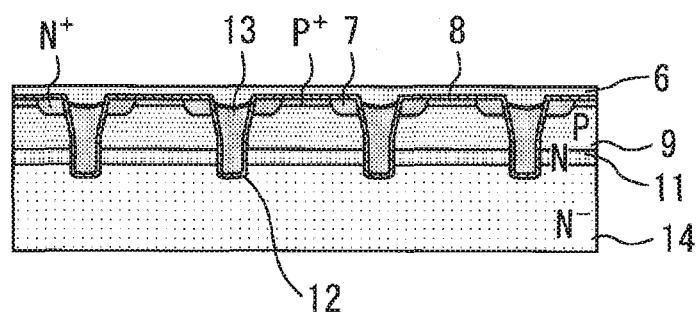
FIG. 4F is a process flow diagram of IGBT.
Figure 4G:
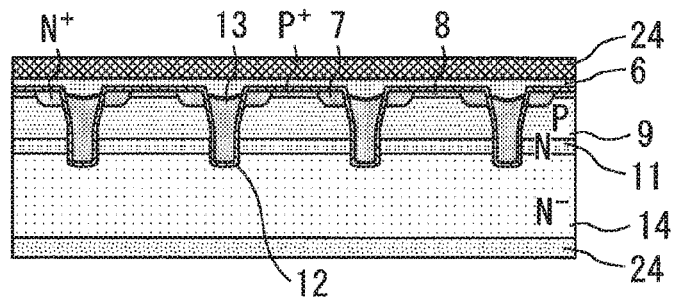
FIG. 4G is a process flow diagram of IGBT.
Figure 4H:
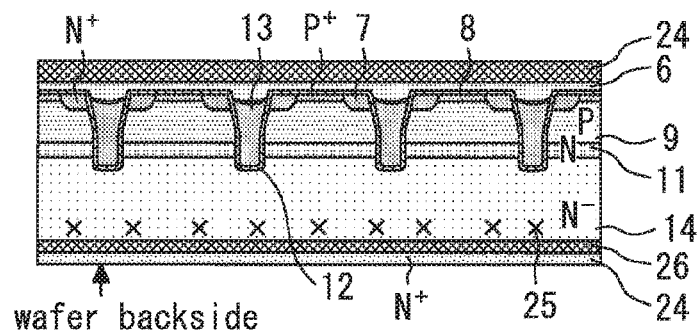
FIG. 4H is a process flow diagram of IGBT.
Figure 4I:
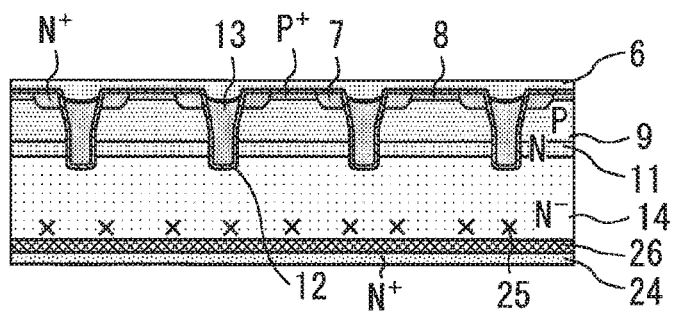
FIG. 4I is a process flow diagram of IGBT.
Figure 4J:
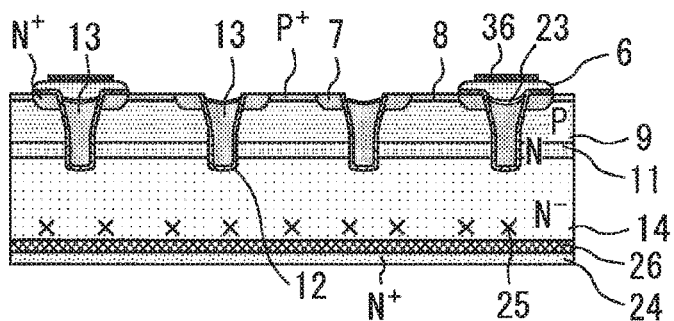
FIG. 4J is a process flow diagram of IGBT.
Figure 4K:
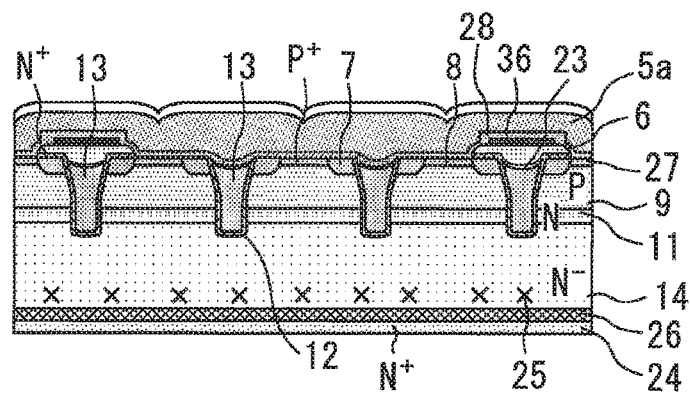
FIG. 4K is a process flow diagram of IGBT.
Figure 4L:
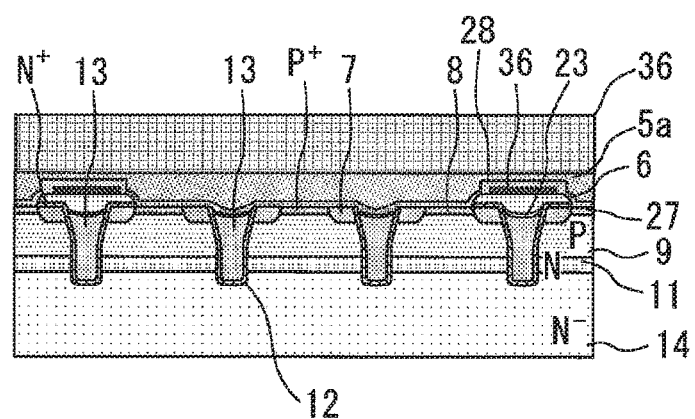
FIG. 4L is a process flow diagram of IGBT.
Figure 4M:
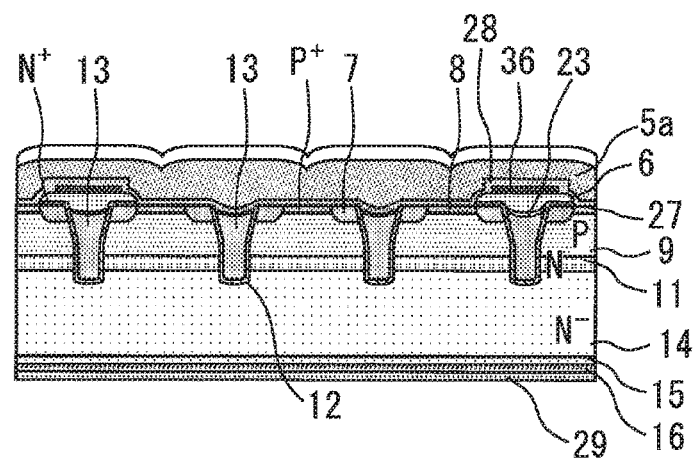
FIG. 4M is a process flow diagram of IGBT.
Figure 5A:
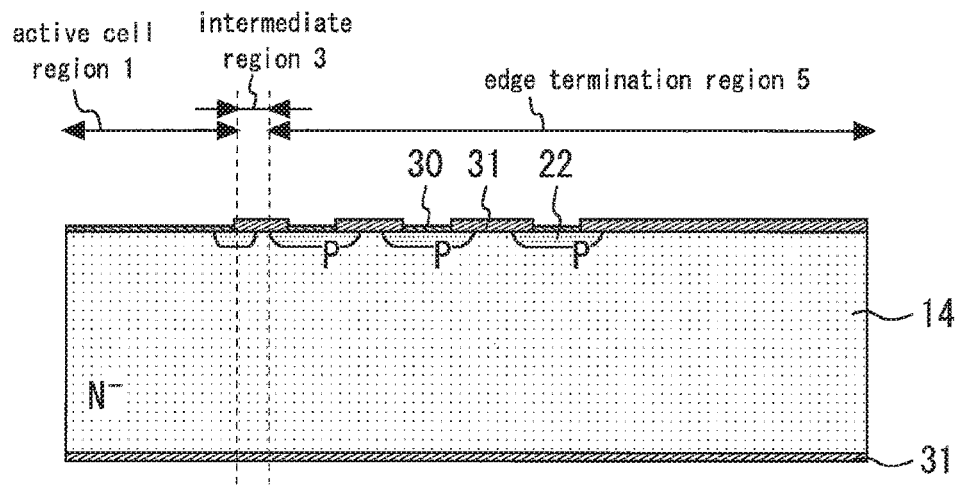
FIG. 5A is a process flow diagram of diode.
Figure 5B:
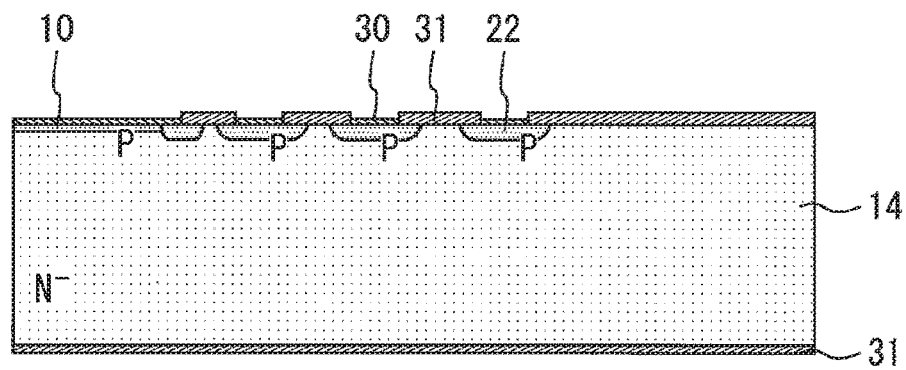
FIG. 5B is a process flow diagram of diode.
Figure 5C:
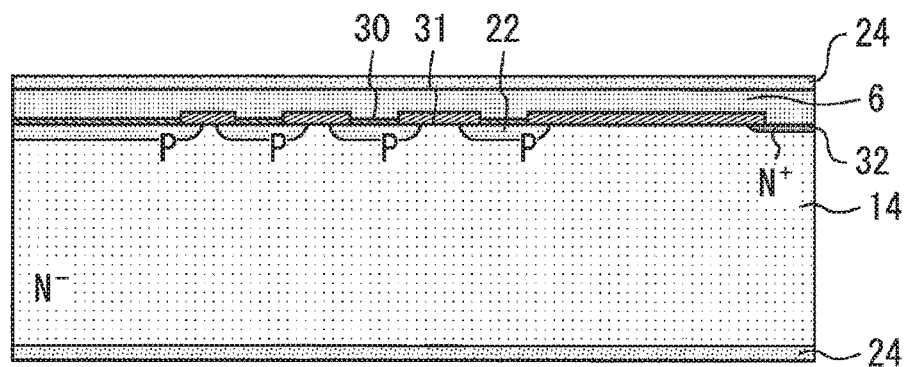
FIG. 5C is a process flow diagram of diode.
Figure 5D:
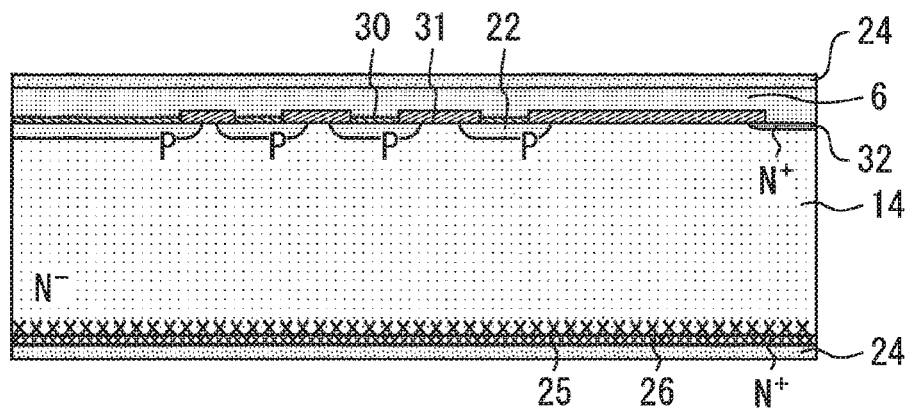
FIG. 5D is a process flow diagram of diode.
Figure 5E:
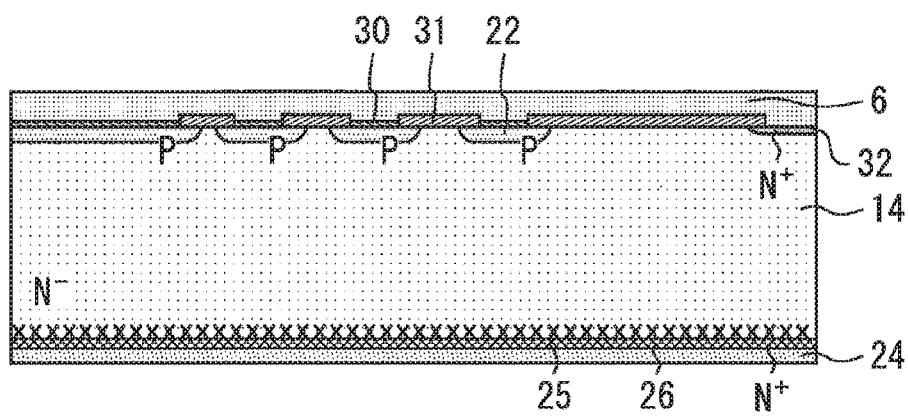
FIG. 5E is a process flow diagram of diode.
Figure 5F:
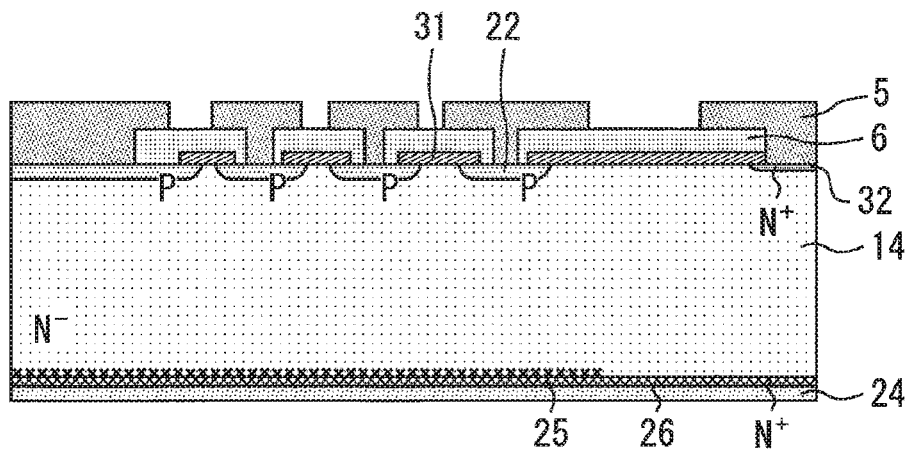
FIG. 5F is a process flow diagram of diode.
Figure 5G:
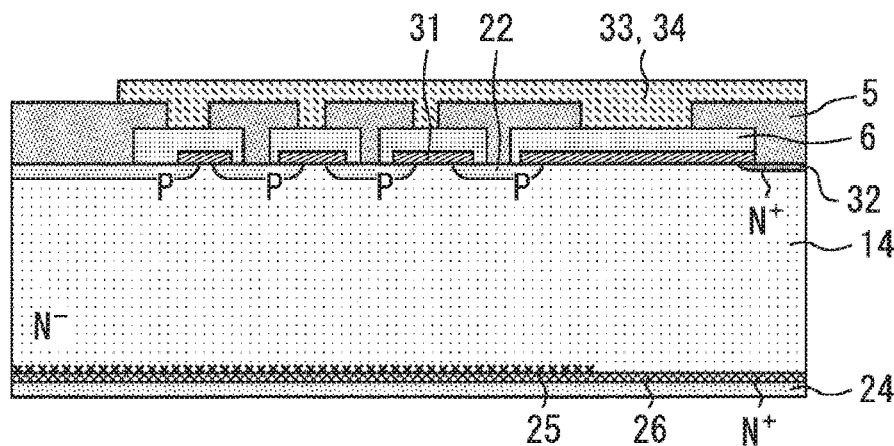
FIG. 5G is a process flow diagram of diode.
Figure 5H:
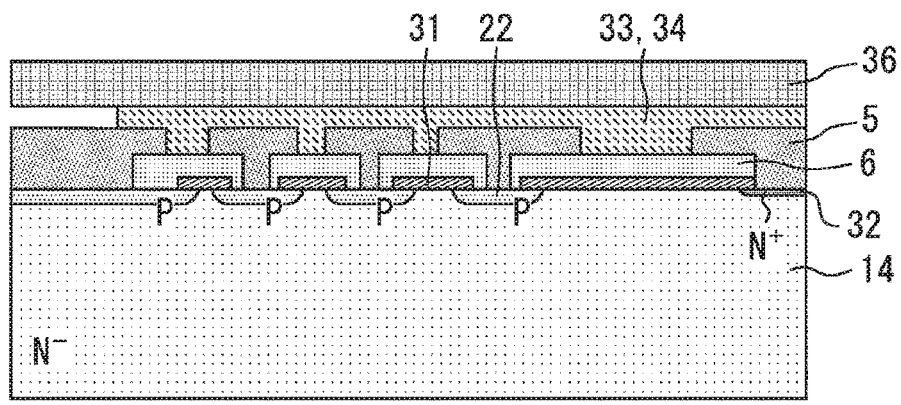
FIG. 5H is a process flow diagram of diode.
Figure 5I:
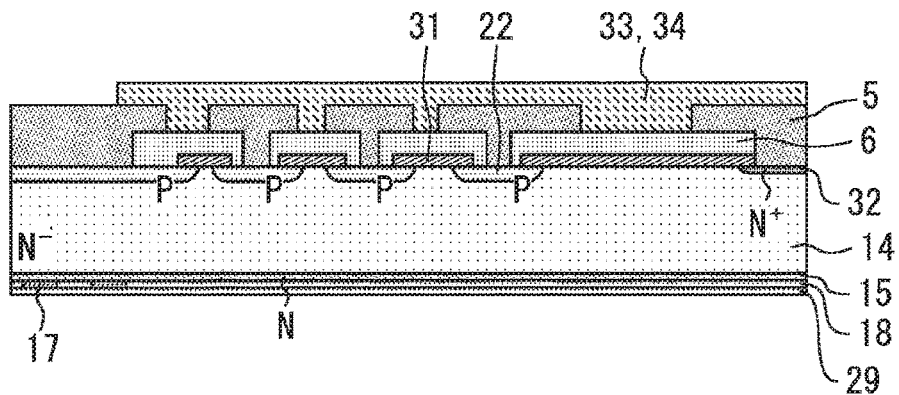
FIG. 5I is a process flow diagram of diode.

The first buffer portion nb1 and the second buffer portion nb2 are formed after a step of FIG. 4L or a step of FIG. 5H which is a step of forming the thickness of the device with high accuracy in the wafer process shown in FIGS. 4 and 5. For example, $t_{device}$ is equal to 40 to 700 μm. With respect to the first buffer portion nb1 and the second buffer portion nb2, the order of forming these portions and the setting of the peak position of acceleration energy when the second buffer portion nb2 is introduced are important. After the first buffer portion nb1 is formed by the ion implantation and the annealing technique, the second buffer portion nb2 is formed by the ion implantation and the annealing technique.

The annealing temperature when the first buffer portion nb1 is formed is higher than the annealing temperature when the second buffer portion nb2 is formed. Therefore, when the first buffer portion nb1 is formed after the second buffer portion nb2 is formed, it adversely affects the impurity profile after activation of the second buffer portion nb2 and the type of crystal defects introduced to form the second buffer portion nb2, and also adversely affects the lifetime of carriers under device ON-state. Therefore, the second buffer portion nb2 is formed after the first buffer portion nb1 is formed. Here, the carriers under device ON-state are holes.

With respect to the second buffer portion nb2, ions are introduced into Si after formation of the first buffer portion nb1, and after the p-collector layer 16 is formed by the ion implantation or the annealing technique or after metal 29 is formed, the annealing step is executed, whereby the second buffer portion nb2 as the above-mentioned target can be formed.

The peak position of the ion species to be introduced into Si to form the second buffer portion nb2 is set to be nearer to the junction portion (Xj,nb1) than the center portion of the second buffer portion nb2, thereby enabling formation of the second buffer portion nb2 that satisfies the relationship between the targeted first buffer portion nb1 and second buffer portion nb2 layers.

With respect to the ion species for forming the first buffer portion nb1 and the second buffer portion nb2, phosphorus is used for the first buffer portion nb1, and selenium, sulfur, phosphorus, proton (hydrogen) or helium is introduced into Si with high acceleration energy for the second buffer portion nb2. When proton (hydrogen) or helium is used, for example, a diffusion layer forming process technique for forming an n-layer by donor-formation based on annealing at 350 to 450° C. is used. Proton and helium can be introduced into Si by an irradiation technique using cyclotron as well as the ion implantation. When proton is introduced into Si, hydrogen atoms and oxygen atoms are bonded to vacancies occurring in the introduction step to form complex defects. These complex defects contain hydrogen, and thus become donors as electron supply sources, so that the complex defect density is increased by the annealing and the donor concentration increases. As a result, a layer which becomes a donor having a higher impurity concentration than the n-drift layer 14 is formed, and it contributes to the operation of the device as the second buffer portion nb2. However, defects serving as lifetime killers for reducing the lifetime of the carriers also exist in the formed complex defects. Therefore, introduction of impurity ions into the second buffer portion nb2 with high acceleration energy after the formation of the first buffer portion nb1, and an annealing condition under which the second buffer portion nb2 is made to become a donor is important.

Figure 13:
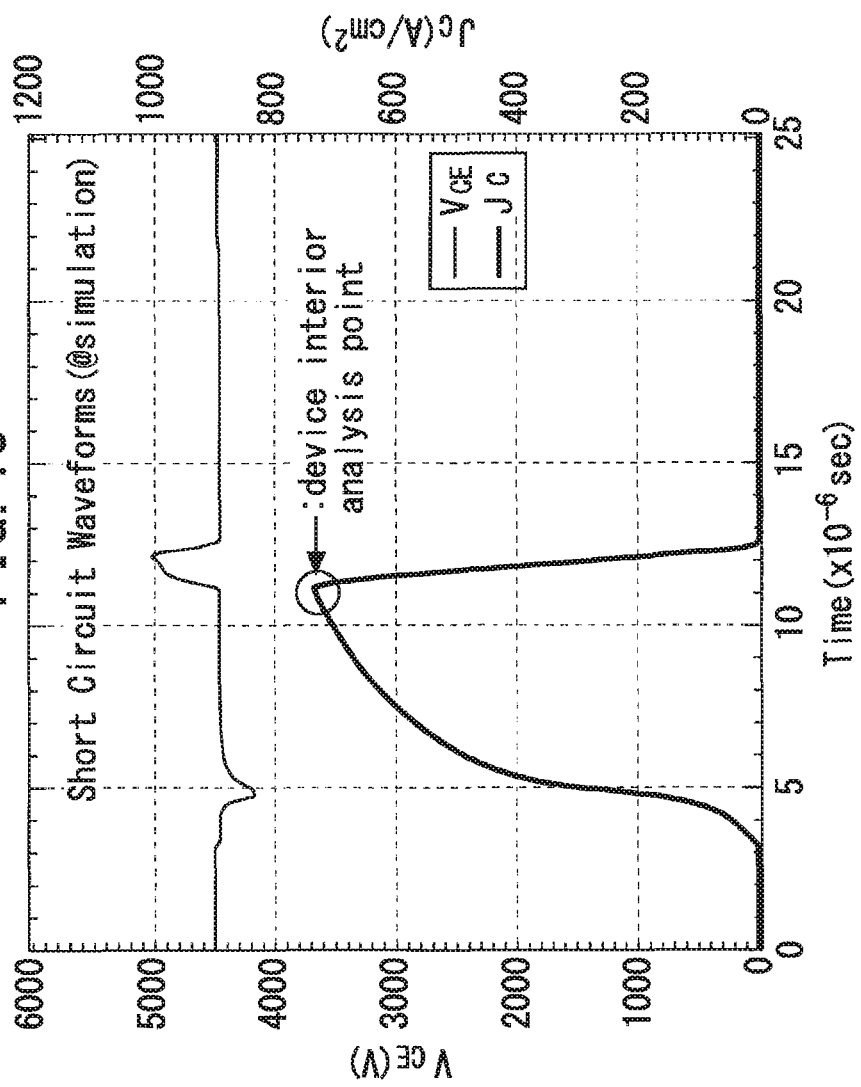
FIG. 13 shows a simulation result of the short circuit waveforms under no-load short-circuit condition of the 6500V class IGBT of FIG. 2.
Figure 14:
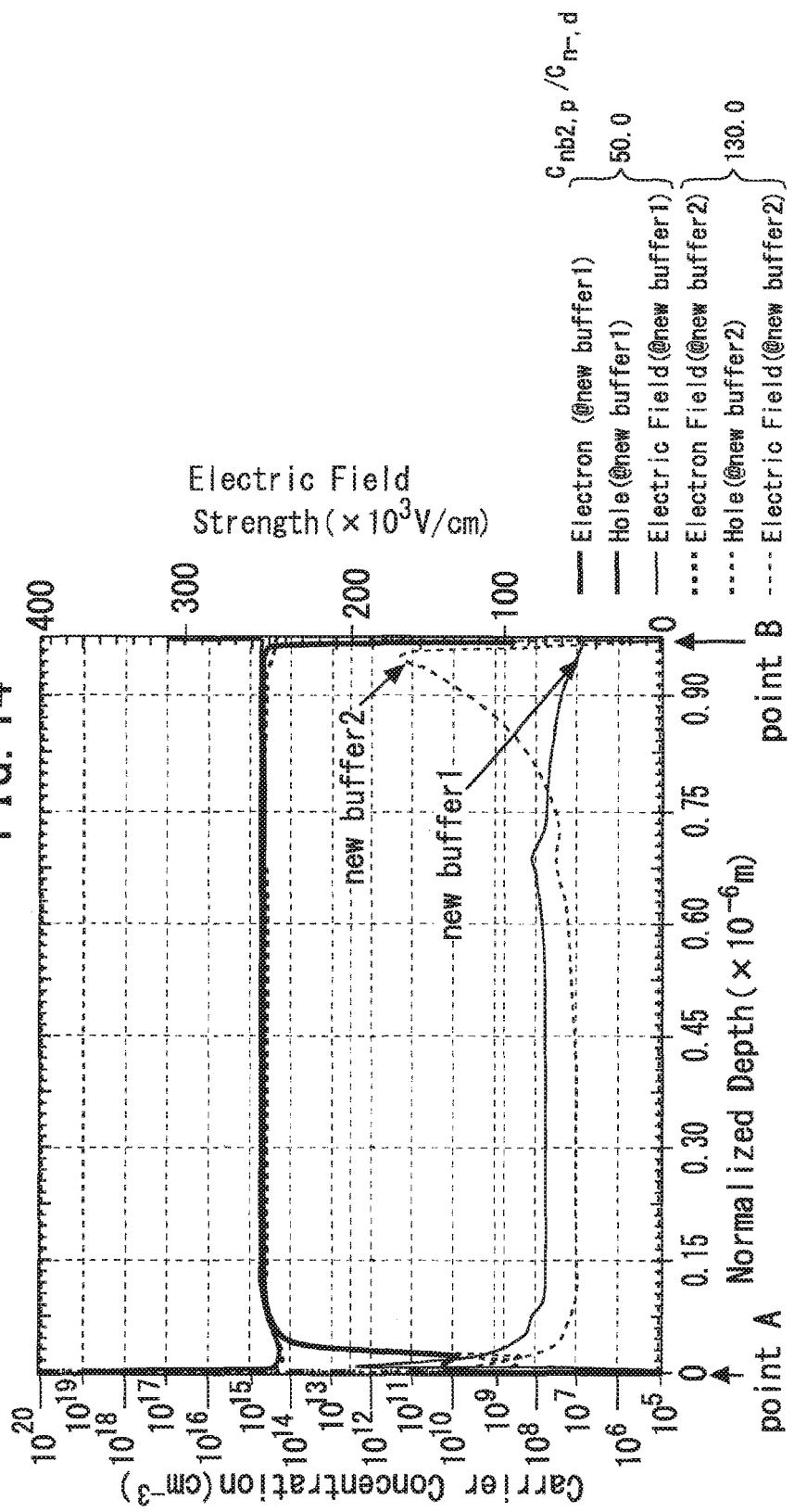
FIG. 14 is a diagram showing the n-buffer structure dependency of device interior state at a device interior analysis point shown in FIG. 13.
Figure 15:
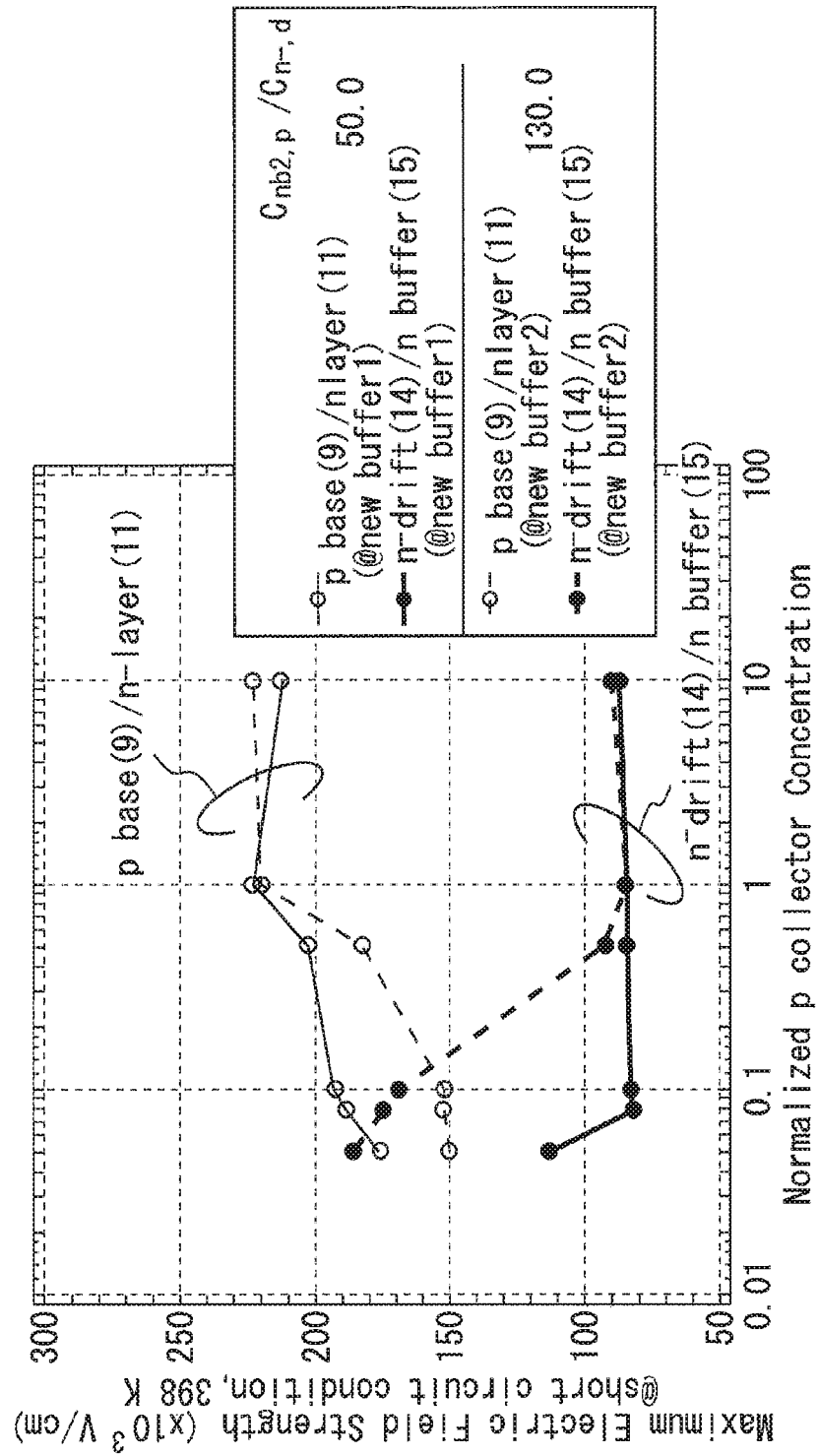
FIG. 15 is a diagram showing the n-buffer structure dependency of p-collector layer concentration dependency in maximum electric field strength under short-circuit condition at junction portion between the P-base layer and n-layer which is main junction portion of FIG. 2A and junction portion between n-drift layer and n-buffer layer.
Figure 35A:
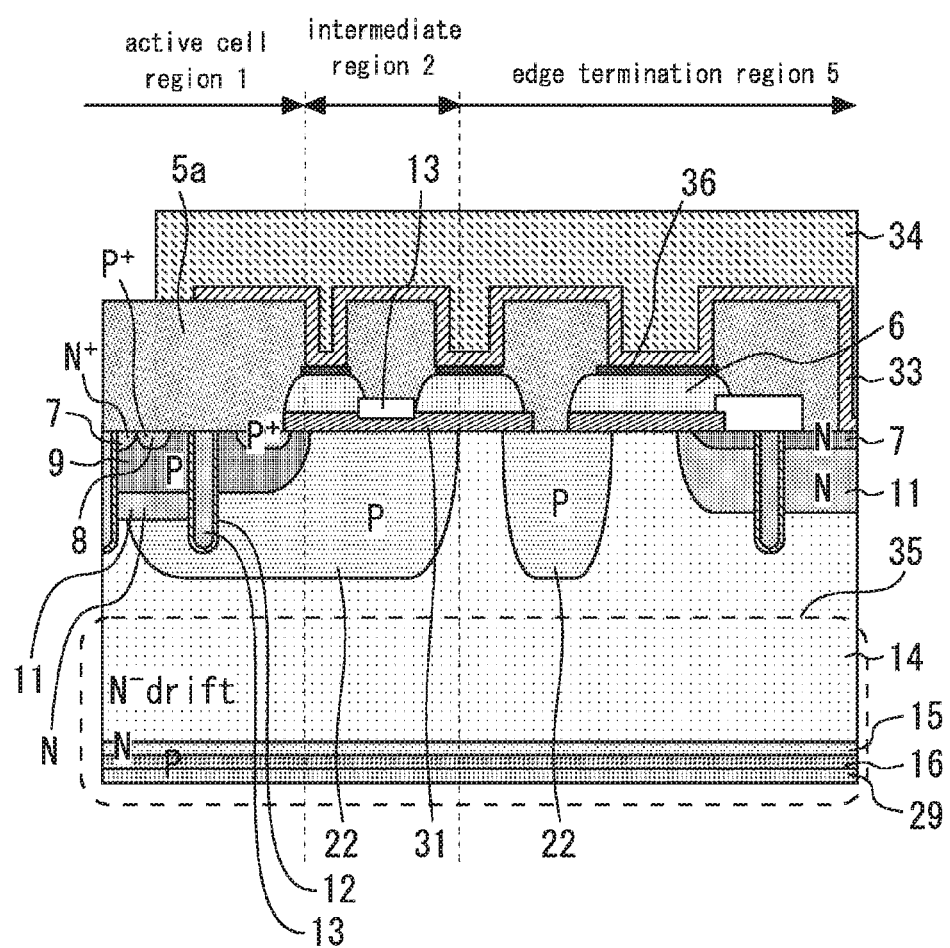
FIG. 35A is a structural diagram of trench gate type IGBT having a conventional n-buffer layer of FIG. 6A.

FIGS. 8 to 12 and 17 to 19 are diagrams showing characteristics associated with a test device adopting the IGBT structure shown in FIG. 2A of 6500V class. The IGBT structure of the test devices is shown in FIG. 35A which is a cross-sectional view of an A"-A'" line of FIG. 1. FIGS. 13 to 15 show simulation results of the operation under no-load short-circuit condition of the 6500V trench gate structure IGBT described above and the device interior state under operation. The curve of "ref." in FIGS. 8 to 11, 16 and 17 represent the result of a sample using the conventional n-buffer layer, and the curve of "new buffer" represents the result of a sample using the n-buffer layer 15 of the present invention.

Figure 8:
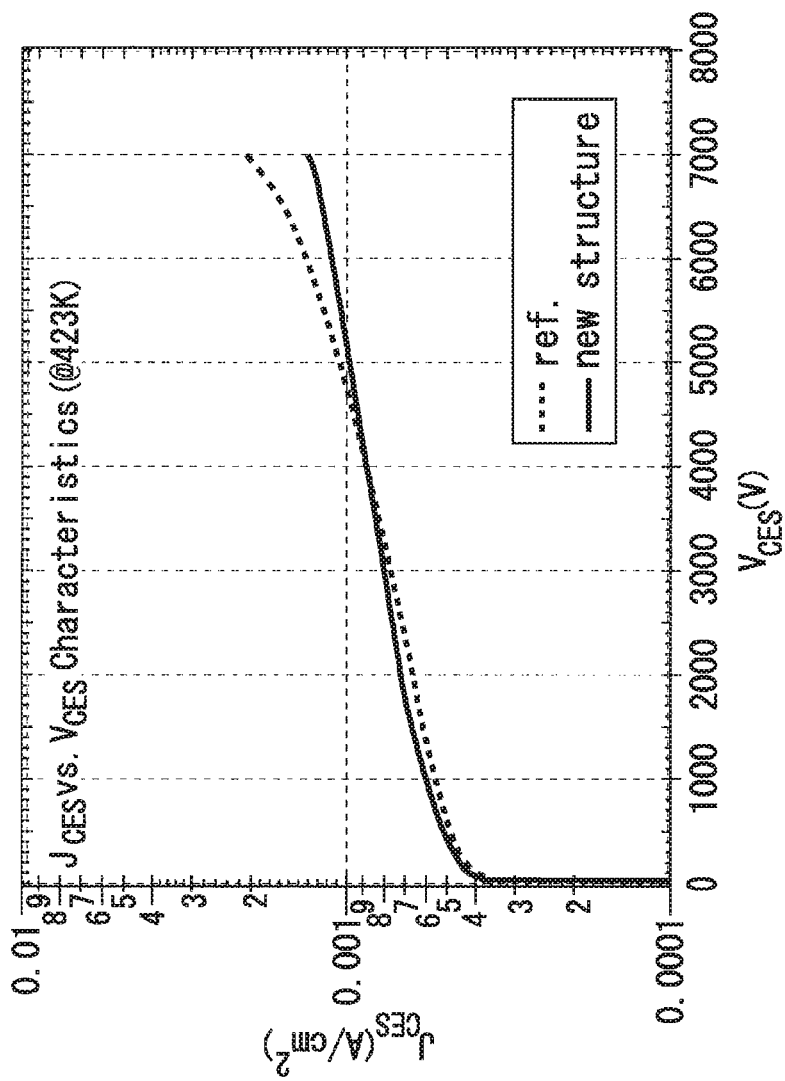
FIG. 8 is a diagram showing the n-buffer structure dependency of $J_{CES}$ vs. $V_{CES}$ characteristics at 423K concerning the 6500V class IGBT of FIG. 2.
Figure 9:
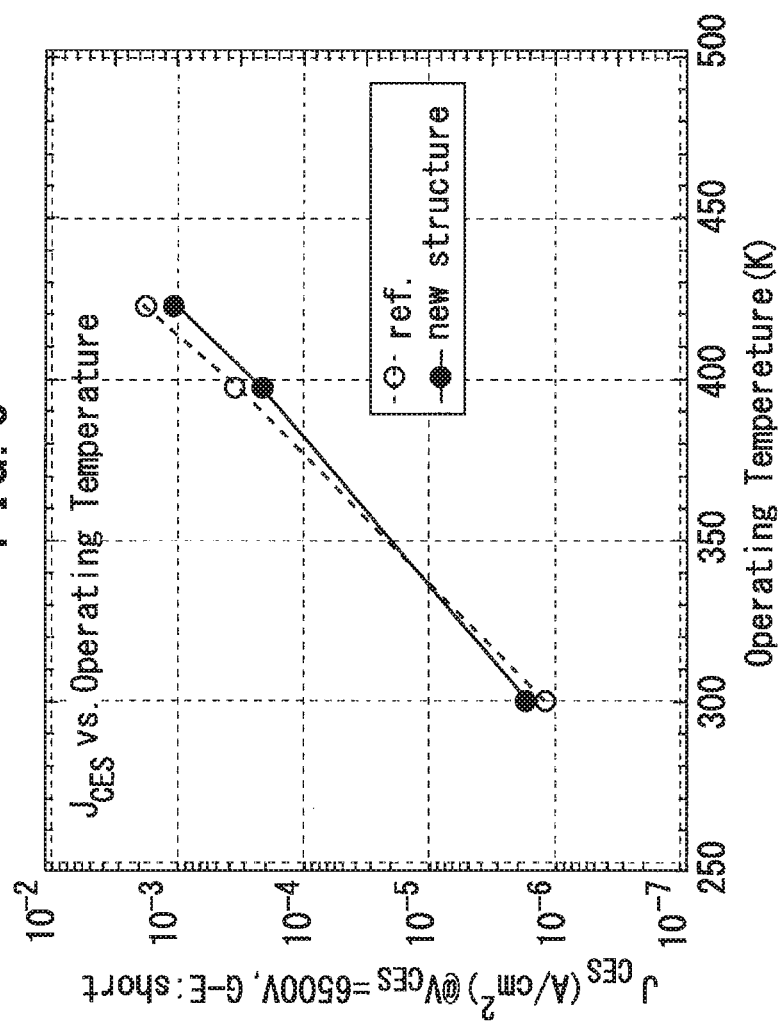
FIG. 9 is a diagram showing the n-buffer structure dependency of $J_{CES}$ vs. operating temperature characteristic concerning the 6500V class IGBT of FIG. 2.

FIG. 8 is a diagram showing the n-buffer structure dependency of $J_{CES}$ vs. $V_{CES}$ characteristics at 423K of the 6500V trench gate structure IGBT under static state. FIG. 9 is a diagram showing the n-buffer structure dependency of the relationship between $J_{CES}$ and the operating temperature under $V_{CES}$=6500V retention in static state. Samples to be compared are samples having substantially the same ON-voltage. From FIGS. 8 and 9, αpnp of pnp tr. contained in an IGBT decreases by using the n-buffer layer 15 of the present invention, and the leak current under off-operation, that is, under withstand voltage retention decreases. As a result, the amount of heat generated by a chip itself under off-operation can be reduced by reducing the off-loss.

Figure 10:
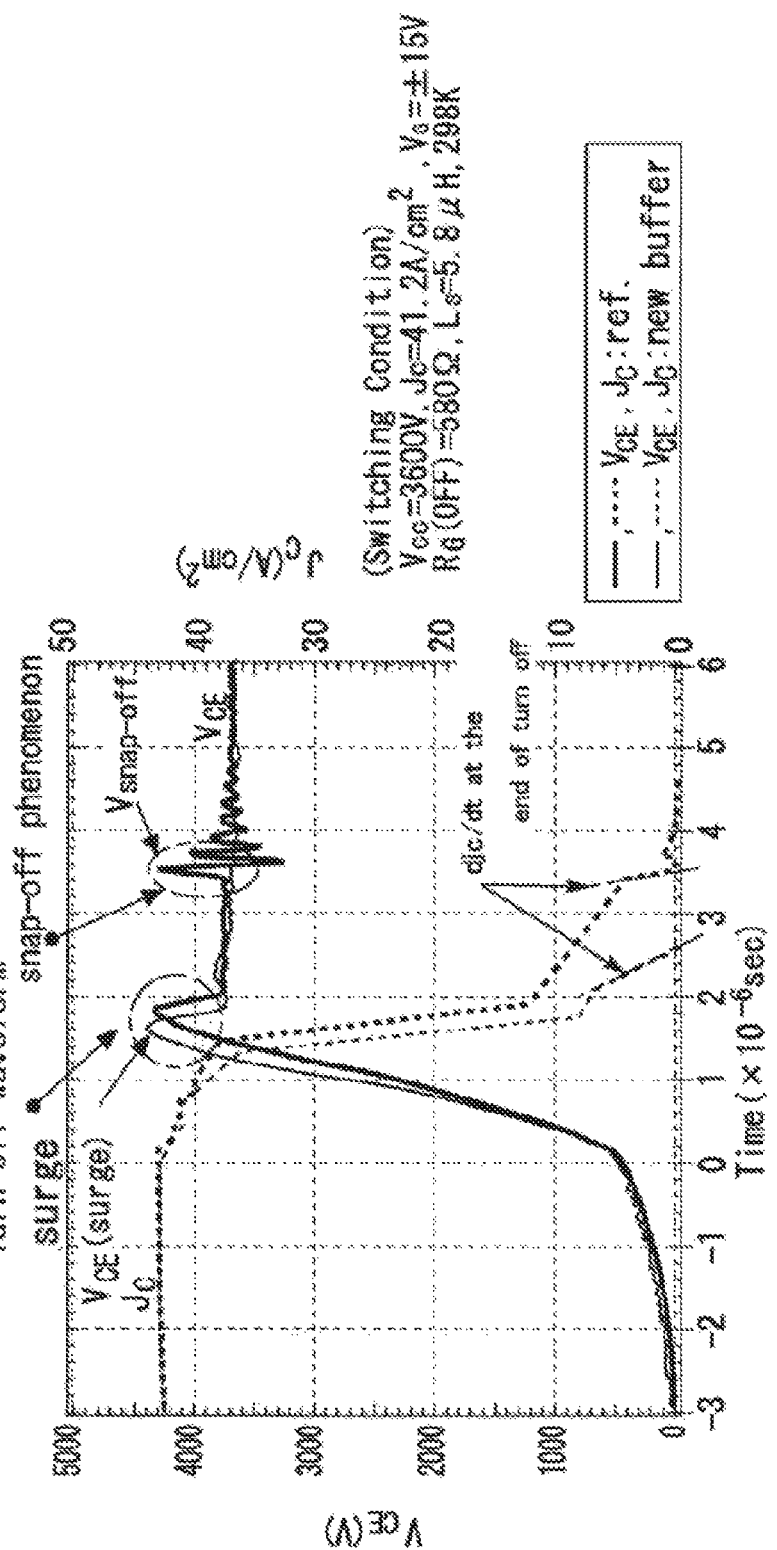
FIG. 10 is a diagram showing the n-buffer structure dependency of the turn-off waveform under a condition of $L_S=5.8$ µm for the 6500V class IGBT structure in FIG. 2.

FIG. 10 is a diagram showing the n-buffer structure dependency of the turn-off operation waveform in an induced load state under a high $L_S$ condition of, for example about 5.8 μH for the 6500V trench gate structure IGBT. $V_{CE}$ (surge) and $V_{snap-off}$ in FIG. 10 represent a surge voltage as the maximum $V_{CE}$ value under a surge phenomenon during the turn-off operation and the maximum $V_{CE}$ value when the snap-off phenomenon occurs, respectively. From FIG. 10, djc/dt at the termination of the turn-off operation is equal to $3.49 \times 10^7$ A/cm² sec in the case of "ref.", but it is equal to a smaller value of $1.40 \times 10^7$ A/cm² sec in the case of "new buffer", which makes it understandable that the snap-off phenomenon can be suppressed by using the n-buffer layer 15 of the present invention.

Figure 11:
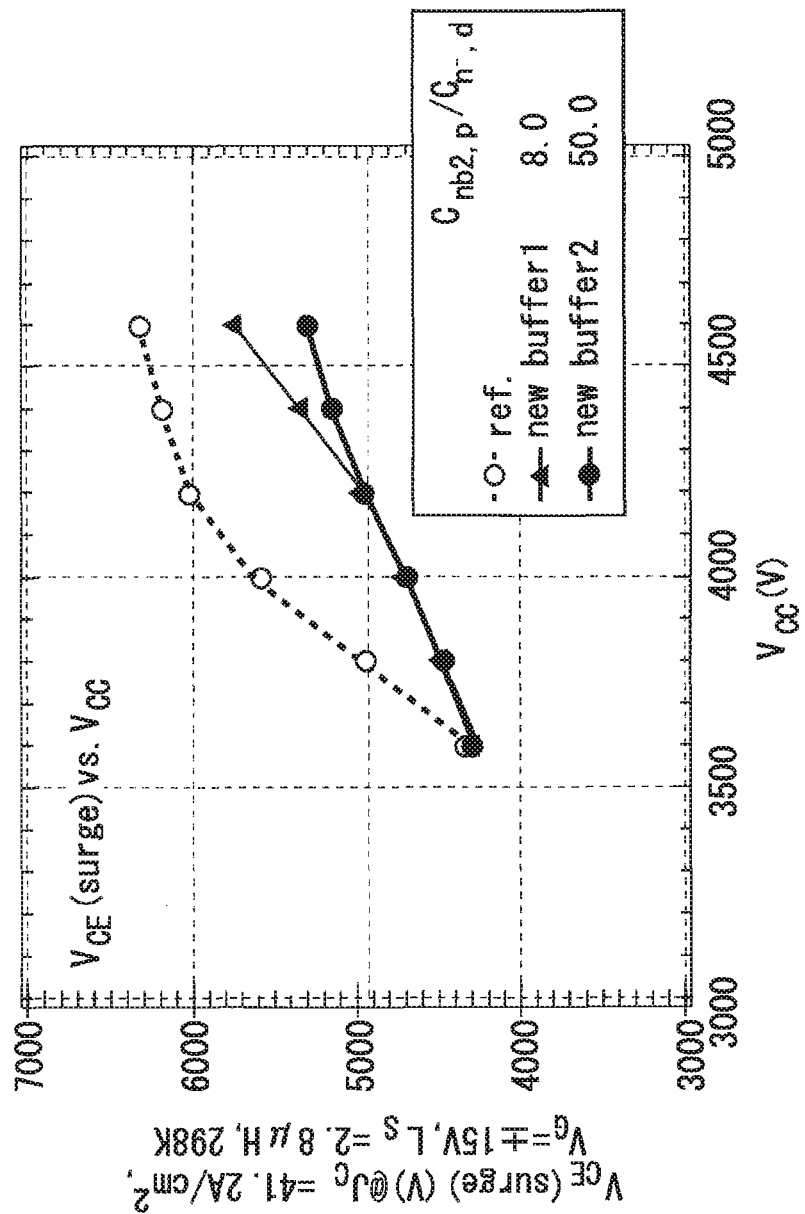
FIG. 11 is a diagram showing the n-buffer structure dependency of the relationship between $V_{CE}$(surge) in FIG. 10 and the power supply voltage $V_{CC}$ under turn-off operation concerning the 6500V class IGBT of FIG. 2.

FIG. 11 is a diagram showing the n-buffer structure dependency of $V_{CE}$(surge) in FIG. 10 and the power supply voltage ($V_{CC}$) under turn-off operation. From FIG. 11, it is understood that use of the n-buffer layer 15 of the present invention makes it possible to suppress the surge voltage under turn-off operation of an IGBT as compared with the conventional n-buffer layer.

It is understood from FIGS. 10 and 11 that, by the foregoing roles, the n-buffer layer 15 of the present invention can suppress the surge voltage and the snap-off phenomenon at the termination of the turn-off operation of the IGBT, make the voltage dependency of the surge voltage insensitive and realize a power semiconductor having excellent controllability for the switching operation.

Figure 12:
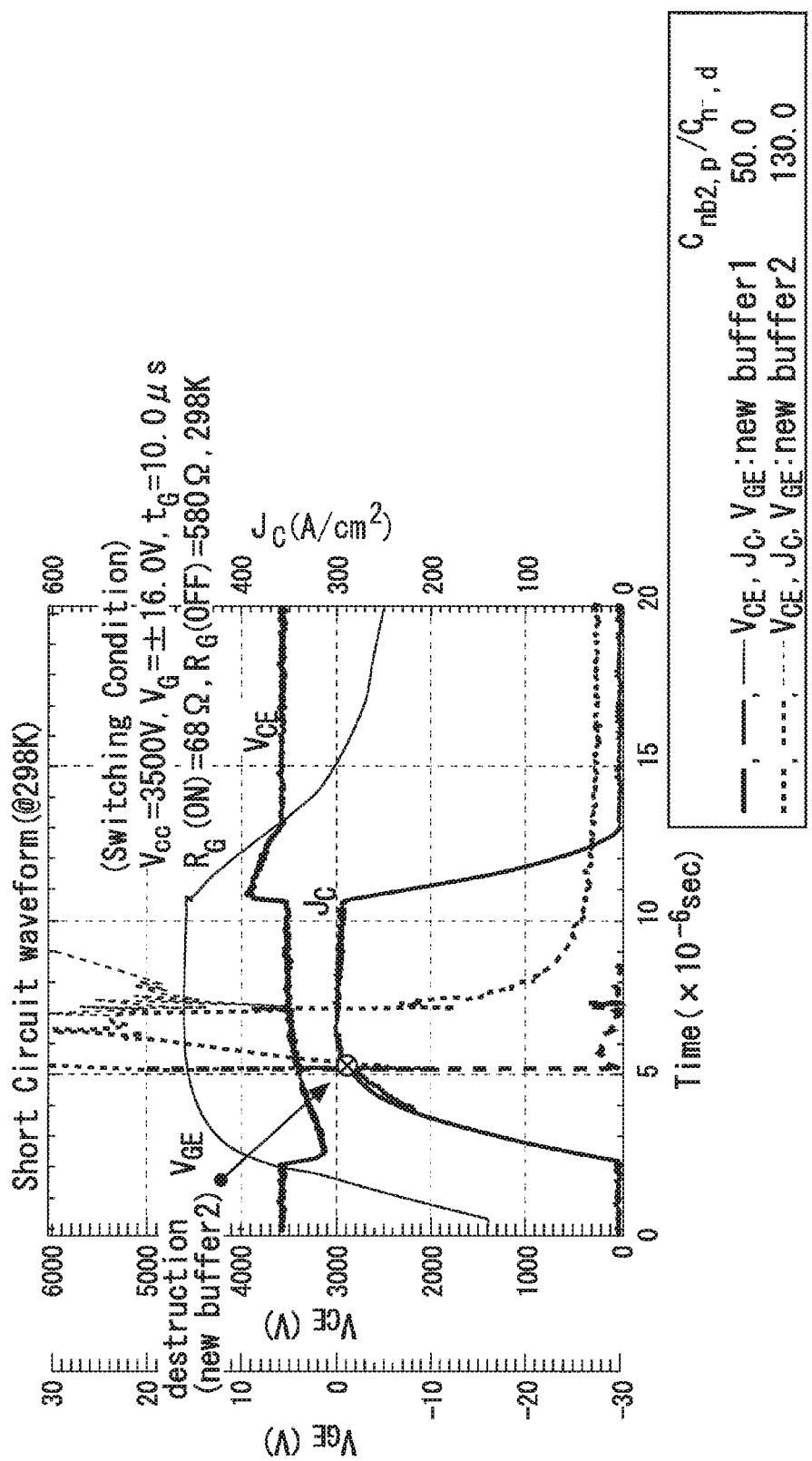
FIG. 12 is a diagram showing the n-buffer structure dependency of short circuit waveform under no-load short-circuit condition of the 6500V class IGBT of FIG. 2.

FIG. 12 shows turn-off waveforms under no-load short-circuit condition of the 6500V trench gate structure IGBT using the n-buffer layer 15 of the present invention. It is understood from FIG. 12 that the turn-off operation under short-circuit condition of an IGBT using the n-buffer layer 15 of the present invention has conditional dependency of the n-buffer layer of the present invention, and the breaking capability under short-circuit condition deteriorates in the n-buffer layer in which the value of $C_{nb2,p}/C_{n-,d}$ increases.

FIG. 13 shows a simulation result of the turn-off waveforms under no-load short-circuit condition of the 6500V trench gate structure IGBT which is performed to clarify the mechanism of the phenomenon of FIG. 12. FIG. 14 is a diagram showing the device interior state at a device interior analysis point shown in FIG. 13. It is understood from FIG. 14 that a peculiar electric field strength distribution in which the electric field strength in the device under short-circuit condition increases, not at the main junction portion as the junction portion of the p-base layer 9 and the n-drift layer 14, but at the junction portion $X_{j,nb2}$ between the n-drift layer 14 and the second buffer portion nb2 is exhibited under such a condition that the concentration of the n-buffer layer 15 increases so that $C_{nb2,p}/C_{n-,d}$=130.0 is satisfied. In this case, it is understood that unbalancing of the device interior state occurs.

When unbalancing of the electric field strength distribution occurs, a place at which local heat generation occurs exists in the neighborhood of the junction portion between the n-drift layer 14 and the n-buffer layer 15 in the case of an IGBT, which consequently leads to thermal destruction, and deteriorates the breaking capability under short-circuit condition. That is, falling into such a device interior state as described above is a cause of "deterioration of the breaking capability under short-circuit condition" shown in FIG. 12. Furthermore, the unbalancing of the electric field strength distribution in the device as described above is associated with the electric field strength under short-circuit condition and the dose amount of the p-collector layer 16 shown in FIG. 15, and it is understood that the unbalancing of the electric field strength occurs when the value of $C_{nb2,p}/C_{n-,d}$ increases and the dose amount of the p-collector layer 16 decreases. That is, with respect to the remaining of the carrier plasma layer in the neighborhood of the junction portion between the n-drift layer 14 and the n-buffer layer 15 which is one of the roles of the targeted n-buffer layer 15, a condition that the concentration of the n-buffer layer 15 is high and the value of $C_{nb2,p}/C_{n-,d}$ increases conversely means that a lacking phenomenon of the carrier plasma layer occurs.

Figure 16:
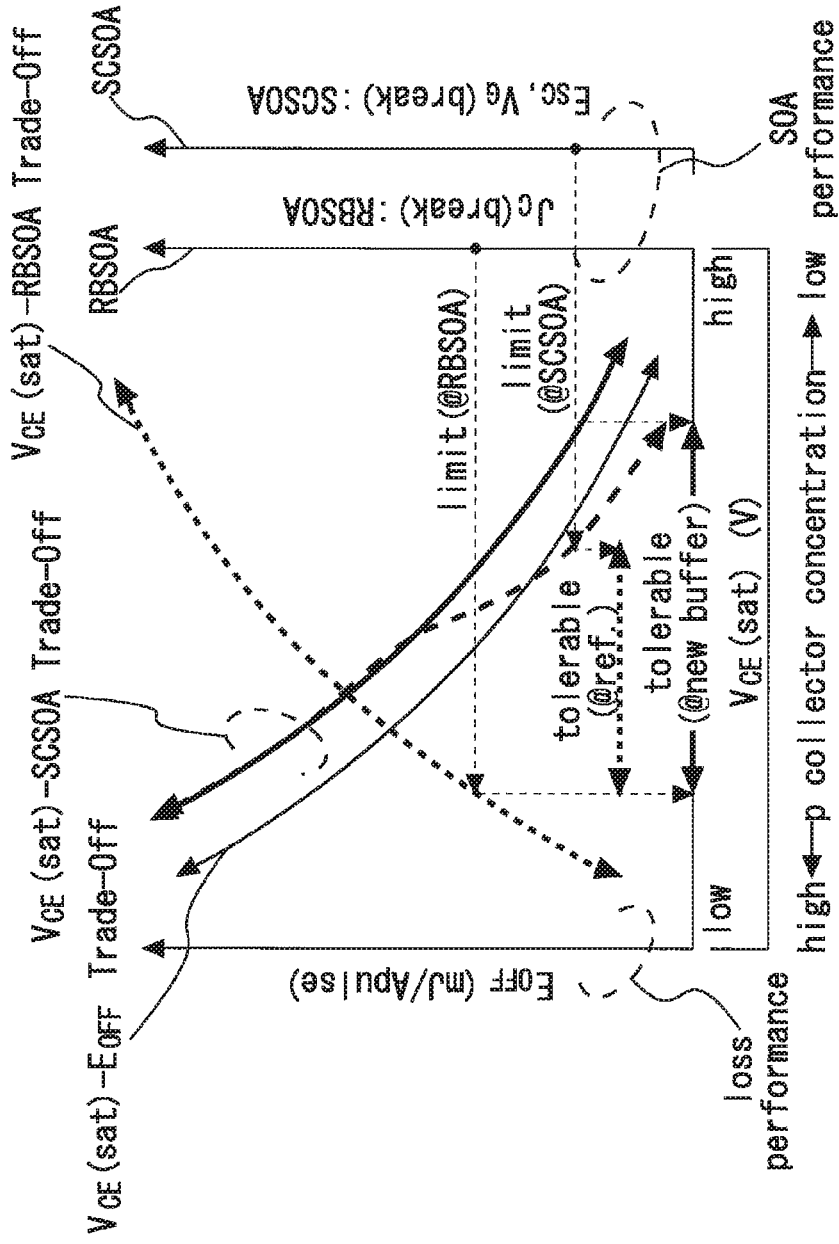
FIG. 16 shows the trade-off relationship existing among various device characteristics of an IGBT of FIG. 2.

FIG. 16 is an imaginary diagram showing the trade-off relationship existing among various device characteristics of an IGBT. $J_C$(break) represented on an RBSOA (Reverse Bias Safe Operating Area) performance axis in FIG. 16 represents the maximum breaking current density under turn-off operation in an inductive load state. $E_{SC}$ and $V_G$(break) shown on an SCSOA (Short-circuit Safe Operating Area) performance axis represent short-circuit energy and the maximum breaking gate voltage at the maximum breaking time under turn-off operation in the no-load short-circuit condition, respectively.

With respect to the latest IGBTs, ON-voltage ($V_{CE}$(sat)), $J_{CES}$ characteristics, turn-off loss ($E_{OFF}$), RBSOA and SCSOA can be controlled with the dose amount of the p-collector layer 16 as a parameter. As a result, when the unbalancing of the device interior state under the non-load short-circuit condition as shown in FIG. 15 has the dependency on the dose amount of the p-collector layer 16, it means that the permissible ranges of various device characteristics of an IGBT as shown in FIG. 16 are narrowed. The narrowing of the permissible ranges of the various device characteristics means that the performance as an IGBT deteriorates. Accordingly, when the n-buffer layer 15 of the present invention is used for an IGBT, it is necessary to set the parameters of the n-buffer layer 15 in a region where the events as shown in FIGS. 12, 14 to 16 do not occur.

Figure 17:
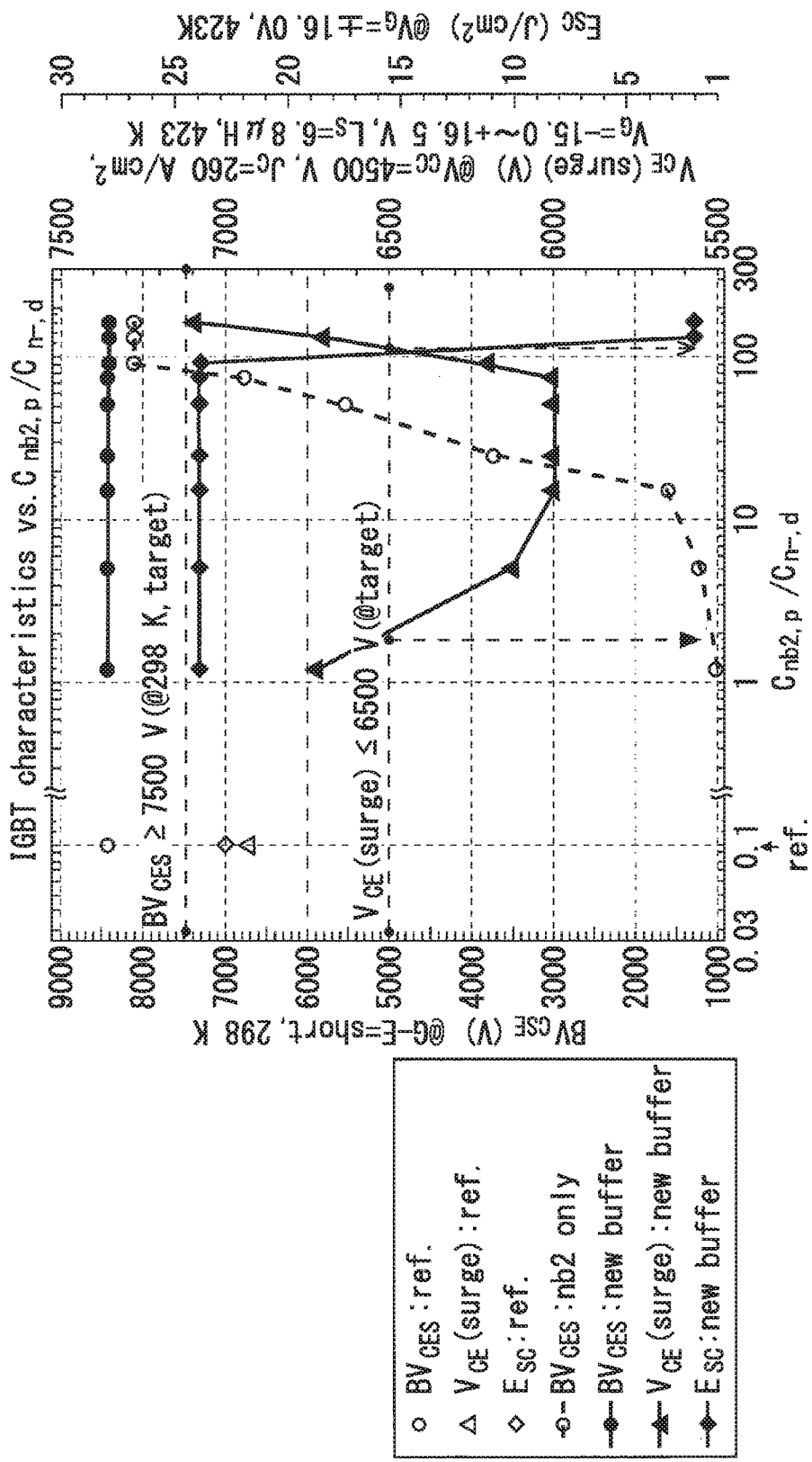
FIG. 17 is a diagram showing the relationship between $C_{nb2,p}/C_{n-,d}$ and the device characteristics of the 6500V class IGBT in FIG. 2.

FIG. 17 is a diagram showing the relationship between $C_{nb2,p}/C_{n-,d}$ and the various device characteristics of the 6500V trench gate structure IGBT using the n-buffer layer 15 of the present invention. Targets of the $BV_{CES}$ and $V_{CE}$(surge) characteristics are shown in FIG. 17. The target of $BV_{CES}$ is set to 7500V or more at 298K from the viewpoint that the rated withstand voltage of, for example, 6500V at 213K is guaranteed. The target of $V_{CE}$(surge) is set to 6500V or less from the viewpoint of the performance index which targets the rated withstand voltage or less.

A result for the conventional n-buffer layer is plotted at the point of $C_{nb2,p}/C_{n-,d}$=0.1 in FIG. 17. From the relationship between $C_{nb2,p}/C_{n-,d}$ and the various device characteristics of an IGBT shown in FIG. 17, it is understood that the range of $C_{nb2,p}/C_{n-,d}$ satisfying the various device characteristics of an IGBT is from 2.0 to 100.0. When the value of $C_{nb2,p}/C_{n-,d}$ increases, the electric field strength of the junction portion between the n-drift layer 14 and the second buffer portion nb2 under dynamic state increases, the surge voltage under turn-off increases, and turn-off breaking in the no-load short-circuit condition deteriorates. Furthermore, when the value of $C_{nb2,p}/C_{n-,d}$ decreases, the depletion layer is liable to extend into the n-buffer layer 15 and impinge against the first buffer portion nb1, so that the n-buffer layer 15 exhibits a behavior close to the characteristic exhibited by the conventional n-buffer layer. The n-buffer layer 15 of the present invention is particularly designed so that $C_{nb2,p}/C_{n-,d}$ ranges from 10.0 to 90.0, whereby the various device characteristics of an IGBT can be balanced. In addition, according to the n-buffer layer 15 of the present invention, it is understood from FIG. 17 that the dependency of the $BV_{CES}$ characteristic on the concentration of the second buffer portion nb2 vanishes. That is, there is a merit that the withstand voltage characteristic becomes insensitive to the concentration of the n-buffer layer 15.

Figure 18:
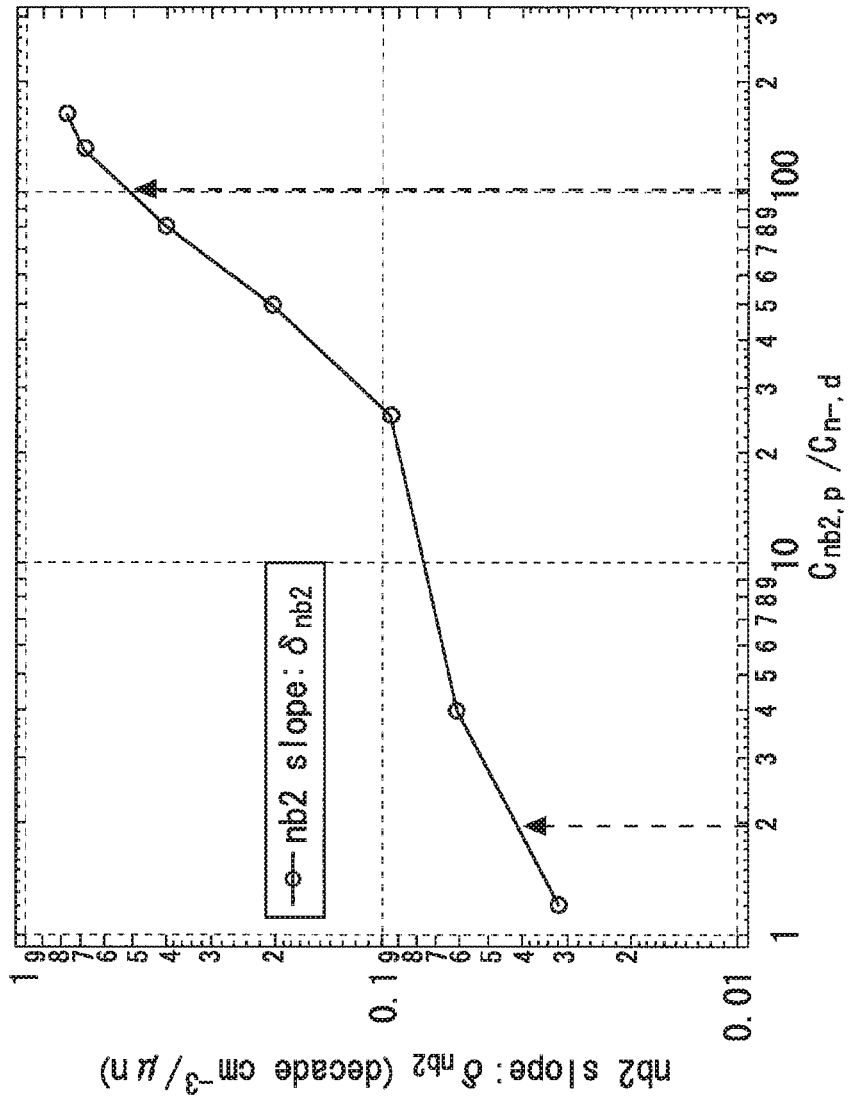
FIG. 18 is a diagram showing the relationship between $C_{nb2,p}/C_{n-,d}$ and the impurity concentration gradient $\delta_{nb2}$ of the second buffer portion in FIG. 6A.
Figure 19:
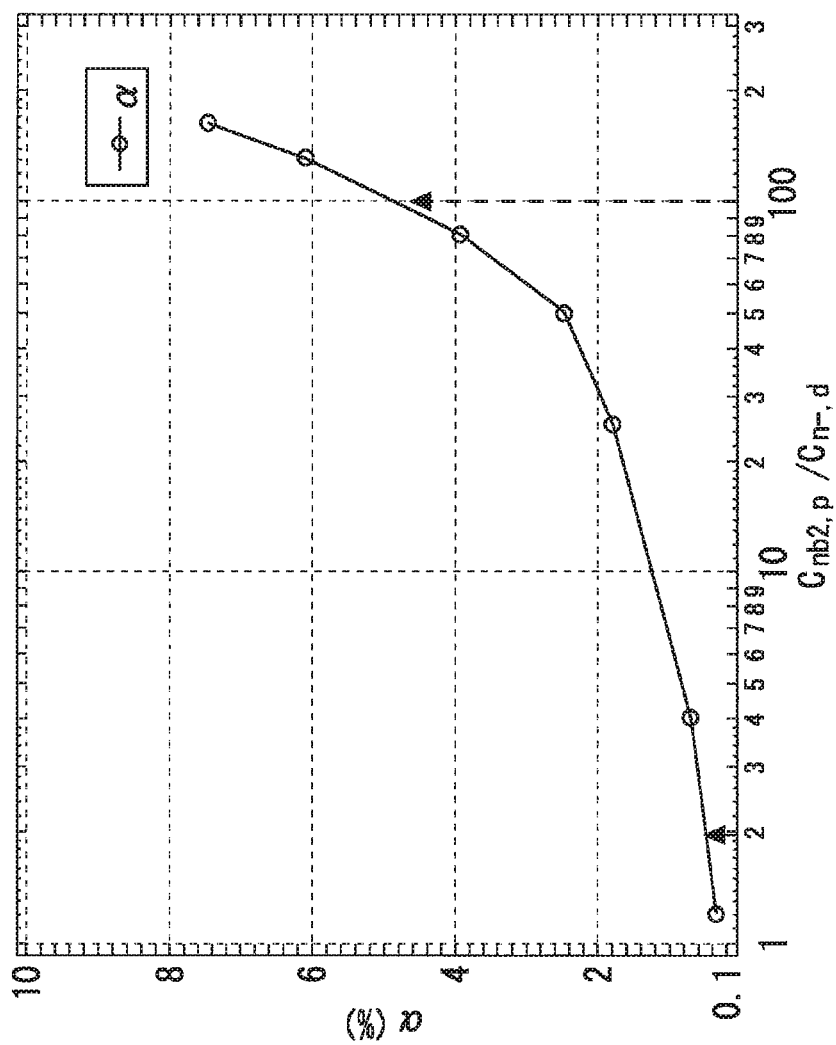
FIG. 19 is a diagram showing the relationship between $C_{nb2,p}/C_{n-,d}$ and the rate α of an effective dose amount after activation of the second buffer portion which occupies the effective total dose amount after activation of the n-buffer layer in FIG. 6A.

FIGS. 18 and 19 are diagrams showing optimum regions of various parameters associated with the n-buffer layer 15 of the present invention from the relationship between the device characteristics of the foregoing IGBT and $C_{nb2,p}/C_{n-,d}$, thereby clarifying the structure parameters of the n-buffer layer 15 with which the various device characteristics of an IGBT can be balanced.

FIG. 18 is a diagram showing the relationship between $C_{nb2,p}/C_{n-,d}$ and the impurity concentration gradient ($\delta_{nb2}$=$\Delta \log_{10} C_{nb2}/\Delta t_{nb2}$) of the second buffer portion nb2 in the neighborhood of the junction portion $X_{j,nb2}$ shown in FIG. 6A. From FIG. 18, the range of $C_{nb2,p}/C_{n-,d}$ in which the various device characteristics of an IGBT can be balanced is from 2.0 to 100.0. As a result, the permissible range of the impurity concentration gradient $\delta_{nb2}$ at a portion on the n-drift layer side of the second buffer portion nb2 is from 0.05 to 0.50 decade cm$^{-3}$/μm. Here, "decade cm$^{-3}$/μm" represents the gradient when log 10 (common logarithm) is set to the ordinate axis. The common logarithm (log 10) of the impurity concentration is set on the ordinate axes of FIGS. 6A and 6B.

FIG. 19 is a diagram showing the relationship between $C_{nb2,p}/C_{n-,d}$ and the rate (α) of an effective dose amount after activation of the second buffer portion nb2 which occupies the effective total dose amount after activation of the n-buffer layer 15 of the present invention. The α value of the ordinate axis is calculated from the following relational expression.

[Math.1]

$$\alpha = \frac{Dose_{nb2,effect}}{Dose_{nb1,effect} + Dose_{nb2,effect}} \times 100 \quad \text{Math. 1}$$

Here,

Dose$_{nb1,effect}$: the effective dose amount after activation of the first buffer portion nb1, and Dose$_{nb2,effect}$: the effective dose amount after activation of the second buffer portion nb2.

Furthermore, the effective dose amount of each diffusion layer is not the dose amount under ion implantation of each diffusion layer, but an impurity concentration [cm$^{-3}$] obtained by spreading resistance measurement (Spreading Resistance Analysis) after activation of each diffusion layer. From FIG. 17, the range of $C_{nb2,p}/C_{n-,d}$ in which the various device characteristics of an IGBT can be balanced is from 2.0 to 100.0, and as a result the parameter of α has a permissible range from 0.5 to 5.0%. That is, the rate α of the effective dose amount after activation of the second buffer portion nb2 which occupies the effective dose amount after activation of the n-buffer layer is set in the range from 0.5 to 5.0%. Accordingly, the effective dose amount after activation of the first buffer portion nb1 is larger than the effective dose amount after activation of the second buffer portion nb2.

From the foregoing, the n-buffer layer 15 having the impurity profile shown in FIG. 6A can perform great improvement on the stable withstand voltage characteristic, decrease of off-loss based on low leak current under off-operation, that is, under withstand voltage retention, enhancement of controllability under turn-off operation and turn-off breaking capability in non-load state of the IGBT, which are technical targets of the present invention.

The process of forming the n-buffer layer 15 according to the present invention is characterized in that the impurities for forming the n-type diffusion layer diffuse not only in the depth direction, but also in the lateral direction when the second buffer portion nb2 is formed. As a result, with respect to the withstand voltage defective phenomenon of an IGBT or a diode caused by partial non-formation of the n-buffer layer 15 which occurs due to the feature under formation of the n-buffer layer and the adverse effect in the wafer process and is one of the foregoing problems of the conventional n-buffer layer, the non-formation region of the n-buffer layer is vanished by forming the second buffer portion nb2. Accordingly, increase of the proportion defective of IGBT or diode chips can be suppressed, and increase of the yield can be expected.

The embodiment 1 of the present invention and a semiconductor device and a method of manufacturing the semiconductor device according to the following embodiments can be modified without losing the features of the present invention. With respect to the semiconductor device and the method of manufacturing the semiconductor device according to the following embodiments, different points from the embodiment 1 will be mainly described because there are many common points to the embodiment 1.

Embodiment 2

A semiconductor device according to an embodiment 2 has an n-buffer layer 15 for improving the withstand voltage breaking capability under off-state, realizing low off-loss based on reduction of leak current at high temperature and high-temperature operation, enlarging a guarantee temperature of a safe operation region in which the snap-off phenomenon under turn-on or recovery operation and the subsequent oscillation phenomenon are suppressed, and realizing enhancement of the breakdown resistance under recovery in a diode having an n$^+$-cathode layer 17 and a p-cathode layer 18 as a cathode-side structure.

FIG. 2C is a cross-sectional view taken along an A-A' line when FIG. 1 is viewed as being imitated as a plan view of the diode. The n-drift layer 14 shown in FIG. 2C has an impurity concentration $C_{n-,d}$ of $1.0 \times 10^{12}$ to $1.0 \times 10^{15}$ cm$^{-3}$, and is formed by using an FZ wafer manufactured by the FZ method. The final thickness of the n-drift layer 14, that is, $t_{device}$ in FIG. 2 is equal to 40 to 700 μm. Each diffusion layer constituting the diode in FIG. 2C is formed by using the ion implantation and the annealing technique in the wafer process shown in FIG. 5 so as to have the following parameters.

p-anode layer 10: the surface impurity concentration is equal to $1.0 \times 10^{16}$ cm$^{-3}$ or more, the peak impurity concentration ranges from $2.0 \times 10^{16}$ to $1.0E^{18}$ cm$^{-3}$, the depth ranges from 2.0 to 10.0 μm, and the p-anode layer 10 is formed on the top side of the substrate.

n$^+$-cathode layer 17: the surface impurity concentration ranges from $1.0 \times 10^{18}$ to $1.0 \times 10^{21}$ cm$^{-3}$, and the depth ranges from 0.3 to 1.0 μm.

p-cathode layer 18: the surface impurity concentration ranges from $1.0 \times 10^{16}$ to $1.0 \times 10^{20}$ cm$^{-3}$, and the depth ranges from 0.3 to 1.0 μm.

The n-buffer layer 15 has a first buffer portion nb1 provided on the side of the p-cathode layer 18, and a second buffer portion nb2 provided on the side of the n-drift layer 14. The peak impurity concentration $C_{nb1,p}$ of the first buffer portion nb1 ranges from $1.0 \times 10^{16}$ to $5.0 \times 10^{16}$ cm$^{-3}$. The depth $X_{j,nb1}$ of the first buffer portion nb1 ranges from 1.2 to 5.0 μm. The peak impurity concentration $C_{nb2,p}$ of the second buffer portion nb2 ranges from $5.0 \times 10^{13}$ to $5.0 \times 10^{14}$ cm$^{-3}$. The depth $X_{j,nb2}$ of the second buffer portion nb2 ranges from 4.0 to 50 μm. Accordingly, the peak impurity concentration of the first buffer portion nb1 is higher than the peak impurity concentration of the second buffer portion nb2.

The diode structure of FIG. 2C has a p-cathode layer 18 with respect to the diode structure of FIG. 2B, thereby enabling promotion of hole injection from the p-cathode layer 18 in the last half of the recovery operation, suppression of the snap-off phenomenon during the recovery operation and the subsequent oscillation phenomenon by relaxation of the electric field strength on the cathode side, and the enhancement of the breakdown resistance during the recovery operation as shown in Japanese Patent No. 5,256,357 or JP2014-241433A (U.S. Pat. No. 8,686,469).

The p-cathode layer 18 and the n$^+$-cathode layer 17 are arranged so as to satisfy the relationship shown in Japanese Patent No. 5,256,357 or JP2014-241433A (U.S. Pat. No. 8,686,469) from the viewpoint that an excellent diode operation is guaranteed while keeping the effect of suppressing the snap-off phenomenon under the recovery operation and the subsequent oscillation phenomenon. Furthermore, when the diode of FIG. 2C is expressed by an equivalent circuit, it is equivalent to a circuit in which a pin diode and a pnp tr. are connected to each other in parallel. At that time, the n-drift layer 14 is a variable resistance region.

FIGS. 20 to 24 and 26 show results of a prototype device produced with the diode structure shown in FIG. 2C of 1700V or 4500V class by way of trial. This device has a cross-sectional structure shown in FIG. 35C which is a cross-sectional view taken along an A''-A''' line of FIG. 1. FIG. 25 is a diagram showing simulation results of a snappy recovery operation and a device interior state during the operation for the diode of FIG. 2C having the withstand voltage of the foregoing 4500V class. In the figures, "ref." represents a simulation result of a sample using the conventional n-buffer layer 15, and "new buffer" represents a simulation result of a sample using the n-buffer layer 15 of the present invention.

Figure 20:
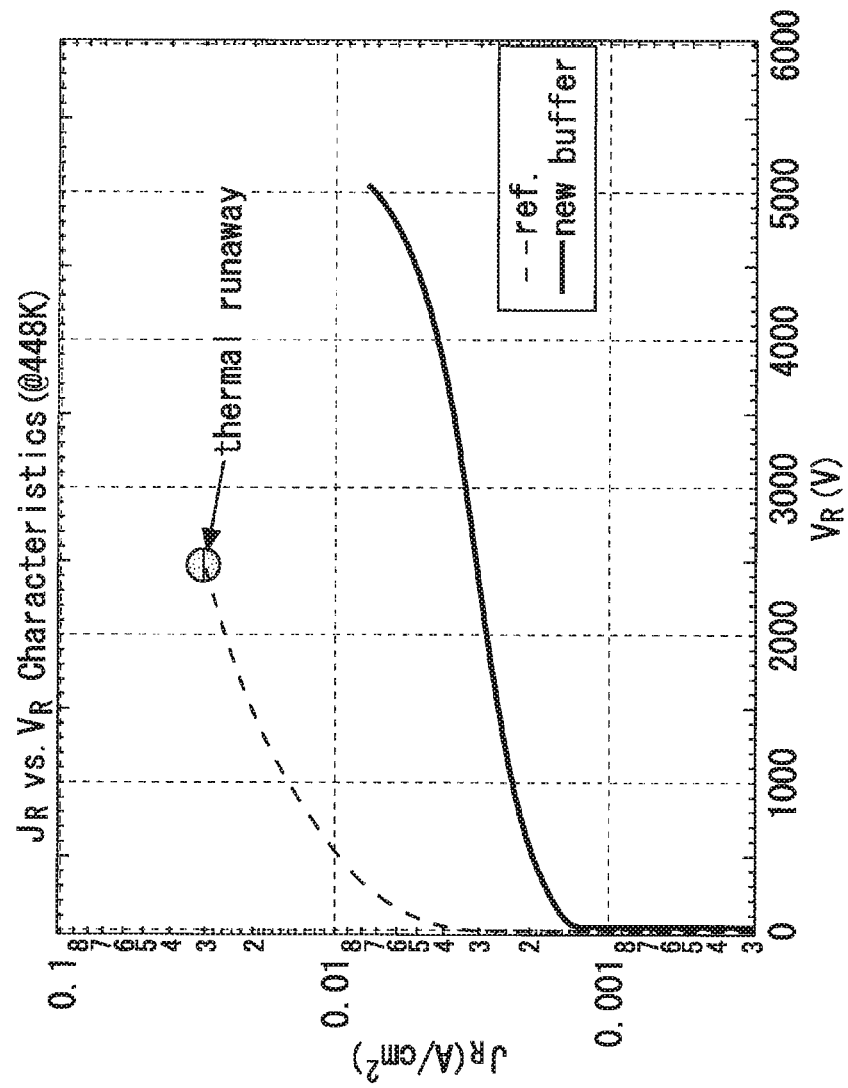
FIG. 20 is a diagram showing the n-buffer structure dependency of the $J_R$ vs. $V_R$ characteristics at 448K of the 4500V class diode b structure in FIG. 2.

FIG. 20 is a diagram showing the n-buffer structure dependency of the $J_R$ vs. $V_R$ characteristics at 448K of the diode of FIG. 2C which has the withstand voltage of 4500V class and is produced by way of trial. FIG. 21 shows the relationship between the leak current density $J_R$ and the operating temperature when the reverse voltage $V_R$ is retained at 4500V. Samples to be compared are samples having substantially the same ON-voltage. From FIGS. 20 and 21, αpnp of pnp tr. contained in the diode shown in FIG. 2C decreases by using the n-buffer layer 15 of the present invention, and the leak current under off-operation, that is, under withstand voltage retention decreases, so that the amount of heat generation of the chip under off-operation can be reduced by the reduction of off-loss. Furthermore, by using the n-buffer layer 15 of the present invention, it is possible to retain the voltage of 5000V or more without occurrence of thermal runaway at 448K even in the 4500V class.

FIG. 22 is a diagram showing the dependency on the n-buffer structure with respect to the snappy recovery operation at a low temperature ranging from 213 to 233K of the diode of FIG. 2C having the withstand voltage of 1700V class. $V_{snap-off}$ in FIG. 22 represents an overshoot voltage during recovery operation. Since the diode of FIG. 2C has an effect of suppressing the snap-off phenomenon during the recovery operation, the snap-off phenomenon observed during the recovery operation of FIG. 2B described later is not observed. However, by adopting the conventional n-buffer layer for the configuration of FIG. 2C, tremendous tail current occurs in the last half of the recovery operation, and when the diode is further operated at low temperature, it leads the diode to destruction in a tremendous tail current region as shown in FIG. 22. By using the n-buffer layer 15 of the present invention for the configuration of FIG. 2C, the phenomenon as shown above does not occur as shown in FIG. 22, resulting in guarantee of the recovery operation of the diode even in a low temperature state of 213K.

FIG. 23 is a diagram showing the n-buffer structure dependency of the relationship between $V_{snap-off}$ and Vcc in the diode shown in FIG. 2C having the withstand voltage of 1700V class. The operating temperature of the device is set to 298K. A mark x surrounded by a circle in FIG. 23 represents a point at which the device was destroyed. Furthermore, since $V_{snap-off}$ represents a performance index targeting the rated withstand voltage or less, it is clarified in FIG. 23 that the value of the $V_{snap-off}$ is equal to 1700V or less as a target value. With respect to the n-buffer layer 15 of the present invention, the results of samples with the parameter $C_{nb2,p}/C_{n-,d}$ shown in the embodiment 1 as a variable are shown. From FIG. 23, in the diode of FIG. 2C adopting the n-buffer layer 15 of the present invention, the value of $V_{snap-off}$ is higher than 1700V as a target value in a sample of $C_{nb2,p}/C_{n-,d}=130$, and it is finally led to device destruction. This behavior results from the following matter: under the condition that the concentration of the n-buffer layer 15 increases such that the value of $C_{nb2,p}/C_{n-,d}$ increases, the hole injection from the p-cathode layer 18 is suppressed in the last half of the recovery operation, the carrier plasma layer in the neighborhood of the junction portion between the n-drift layer 14 and the second buffer portion nb2 lacks, and the electric field strength of the junction portion increases. As described later, with respect to the diode using the n-buffer layer 15 of the present invention, the permissible range of $C_{nb2,p}/C_{n-,d}$ must be limited to make the characteristics excellent as in the case of the embodiment 1.

FIG. 24 is a diagram showing the n-buffer structure dependency of the relationship between $V_{snap-off}$ and the operating temperature in the diode shown in FIG. 2C having the withstand voltage of 1700V class. A mark x surrounded by a circle in FIG. 24 represents a point at which the device is destroyed. From FIG. 24, with respect to the diode of FIG. 2C using the n-buffer layer 15 of the present invention, $V_{snap-off}$ increases at a temperature of 298K in a sample of $C_{nb2,p}/C_{n-,d}=130$, and the sample is destroyed. Even in the case where the conventional n-buffer layer is used, it is apparent from FIG. 22 that the sample is destroyed at 233K. However, in the case where the n-buffer layer 15 of the present invention in which the value of $C_{nb2,p}/C_{n-,d}$ is set to a proper value is used, no tremendous tail current occurs during the recovery operation as shown in FIG. 22, and a normal recovery operation is exhibited even at a low temperature of 213K. That is, according to the diode of FIG. 2C using the n-buffer layer 15 of the present invention, an operation guarantee temperature range for guaranteeing the recovery operation can be enlarged to a low temperature side.

As described above, in order to guarantee the snappy recovery operation on the low temperature side in the diode structure of FIG. 2C, it is necessary to suppress tremendous tail current in the last half of the recovery operation. FIG. 25 shows simulation results of the device interior state during operation, that is, the current density distribution, the electric field strength distribution and the carrier concentration distribution for the diode of FIG. 2C of 4500V class using the conventional n-buffer layer and the diode of FIG. 2C of 4500V class using the n-buffer layer 15 of the present invention.

Figure 25D:
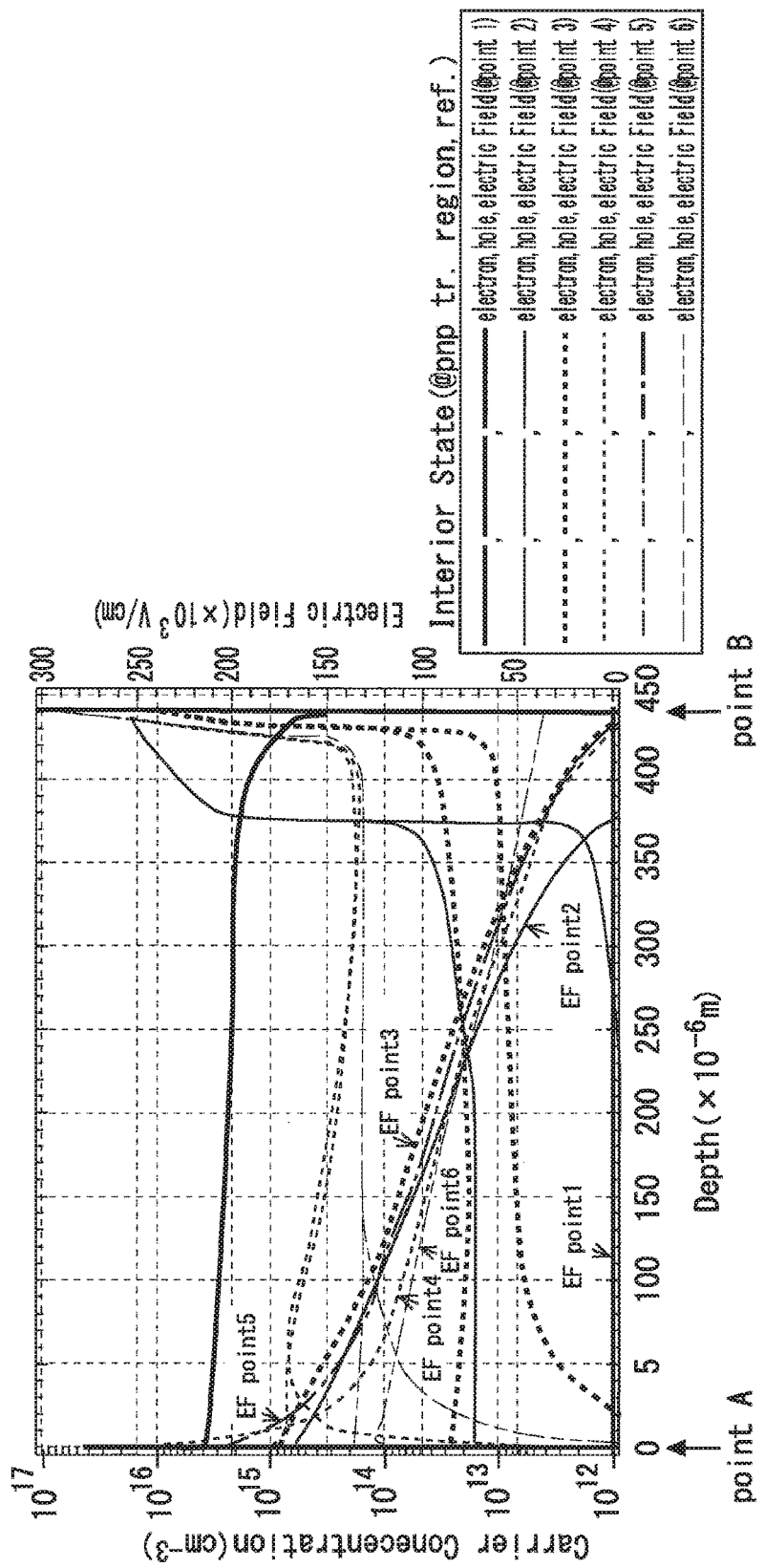
FIG. 25D is a diagram showing a device interior state at the inter-devise analysis points 1-6 of FIG. 25A in a pnp tr region within the 4500V class diode b structure in FIG. 2 using the conventional buffer structure of FIG. 6A.
Figure 25F:
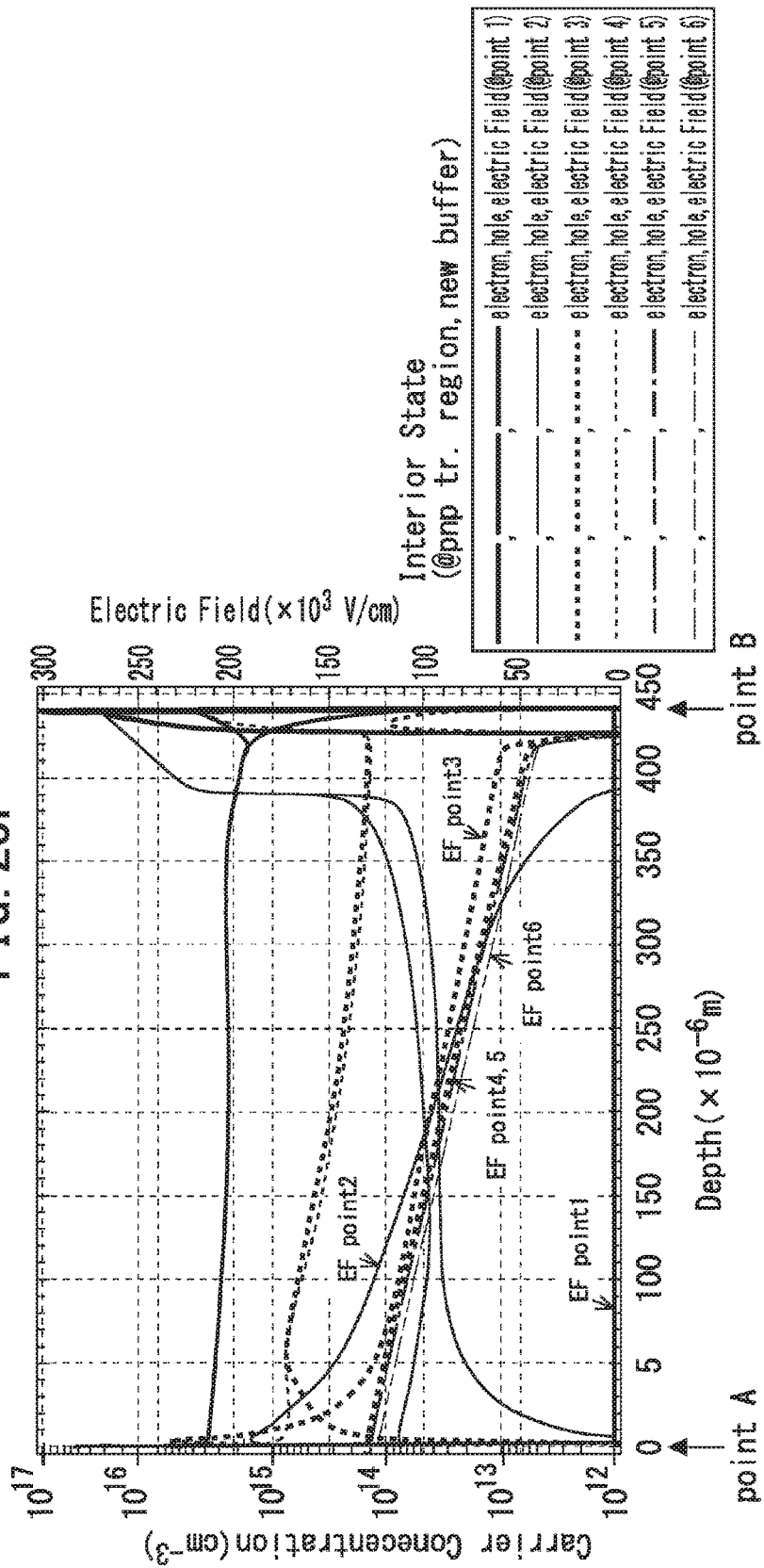
FIG. 25F is a diagram showing a device interior state at the inter-devise analysis points 1-6 of FIG. 25A in a pnp tr region within the 4500V class diode b structure in FIG. 2 using the buffer structure of present invention in FIG. 6A.

The diode interior states during the recovery operation shown in FIGS. 25B to 25F are interior states at analysis points (1) to (6) of FIG. 25A. FIGS. 25B to 25F show respective device interior states of a pin diode 19 and a pnp transistor 20 into which the device is divided as shown in FIG. 2C. The signs of "point A" and "point B" shown in FIGS. 25B to 25F mean the places of the point A and the point B in FIG. 2C. EF point 1 in FIGS. 25C to 25F represents the electric field strength at the analysis point (1) of FIG. 25A.

From the simulation result of FIG. 25A, it is understood that tremendous tail current occurs in the last half of the recovery operation in the structure of FIG. 2C using the conventional n-buffer layer 15 as shown in FIG. 22. The diode structure of FIG. 2C having the conventional n-buffer layer performs a characteristic recovery operation under the snappy recovery operation condition in the following steps, and tremendous tail current occurs in the last half of the recovery operation, which leads to device destruction.

Step 1: an operation time at which each of the pin diode region and the pnp transistor region limits the rate exists, and the device is set to an operation mode in which the operation of the pnp transistor region limits the rate from an area beyond the point (1) of FIG. 25A corresponding to JIR point at which the operation of the pin diode region is converged.

Step 2: the carrier concentration increases on the cathode side because the hole injection is promoted, and the electric field strength of the main junction portion between the p-anode layer 10 and the n-drift layer 14 increases while the electric field on the cathode side is moderated, whereby impact ionization is promoted.

Step 3: electrons generated by the impact ionization promoted at the main junction portion are injected into the n-drift layer 14 to increase the base current of the pnp transistor, whereby tremendous tail current occurs on the recovery waveform.

Step 4: tremendous tail current occurs, and at the same time the operation of the pnp transistor is started and uncontrollable, thereby leading to device destruction.

On other hand, in the diode structure of FIG. 2C using the n-buffer layer 15 of the present invention, the mode of the step 3 does not occur, and the recovery operation is finished without increase of the electric field strength of the main junction portion between the p-anode layer 10 and the n-drift layer 14. As a result, the operation of the npn transistor contained in the diode of FIG. 2C is suppressed to the minimum, and the recovery operation is finished without occurrence of tremendous tail current like the current density distribution of the new structure of FIG. 25B. Therefore, as shown in FIGS. 22 and 24, in the diode of FIG. 2C using the n-buffer layer 15 of the present invention, no tremendous tail current occurs in the snappy recovery operation at low temperature, and the guarantee temperature range for guaranteeing the recovery operation can be enlarged to the low-temperature side.

FIG. 26 is a diagram showing the n-buffer structure dependency of a recovery SOA (Safe Operating Area) in the diode structure shown in FIG. 2C of 1700V class. With respect to the n-buffer layer 15 of the present invention, results of samples with the value of $C_{nb2,p}/C_{n-,d}$ as a parameter is shown. $J_A$(break) on the ordinate axis in FIG. 26 represents the maximum breaking current density during the recovery operation, and max·dj/dt represents the maximum value of the time derivative of the maximum breaking current density under breaking. The inside of a line representing Vcc dependency in FIG. 26 corresponds to SOA.

It is understood from FIG. 26 that the n-buffer layer 15 of the present invention can improve the recovery SOA as compared with the case where the conventional n-buffer layer is used because the value of $J_A$(break) increases by setting a proper $C_{nb2,p}/C_{n-,d}$ value. In the case of the n-buffer layer 15 of the present invention having a large $C_{nb2,p}/C_{n-,d}$ value, it is understood from the plot data at Vcc=1400V that the breaking capability on the high voltage side decreases extremely.

Figure 27:
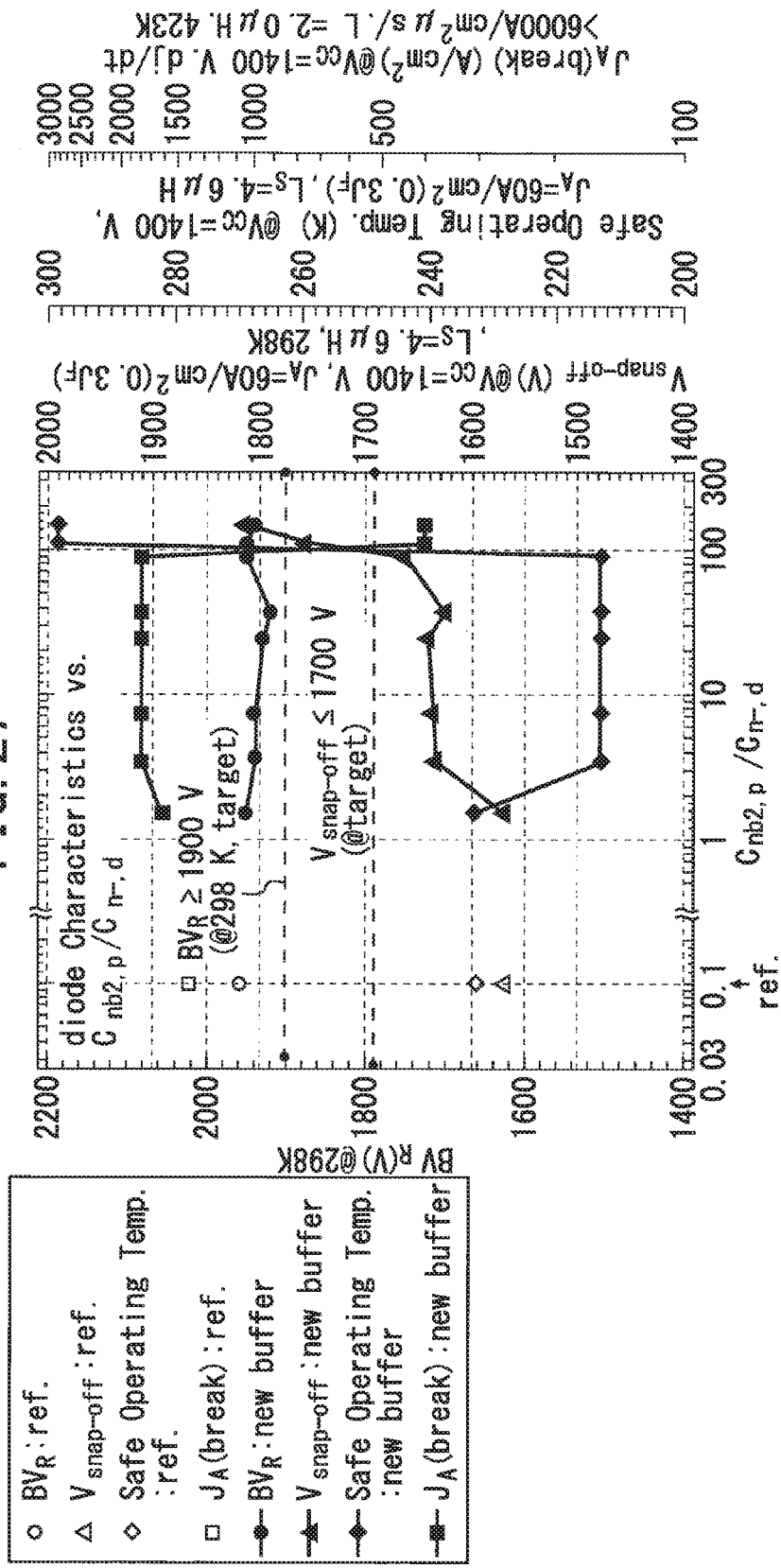
FIG. 27 is a diagram showing the relationship between $C_{nb2,p}/C_{n-,d}$ and the various device characteristics of the 1700V diode b structure of FIG. 2.

FIG. 27 is a diagram showing the relationship between $C_{nb2,p}/C_{n-,d}$ and the various device characteristics of the diode structure of FIG. 2C of 1700V class. A result in the case of the conventional n-buffer layer is shown at a point where $C_{nb2,p}/C_{n-,d}$ in FIG. 27 is equal to 0.1. It is understood from the relationship between the various characteristics of the diode and $C_{nb2,p}/C_{n-,d}$ in FIG. 27 that the range of $C_{nb2,p}/C_{n-,d}$ satisfying the various device characteristics of the diode ranges from 2.0 to 100.0 as in the case of FIG. 17. When the $C_{nb2,p}/C_{n-,d}$ value increases, hole injection from the p-cathode layer 18 is suppressed in the last half of the recovery operation, the carrier plasma layer in the neighborhood of the junction portion between the n-drift layer 14 and the second buffer portion nb2 lacks, the electric field strength of the junction portion between the n-drift layer 14 and the second buffer portion nb2 increases, the $V_{snap-off}$ value during the recovery operation increases, and the breaking capability during the recovery operation at a high voltage deteriorates. When $C_{nb2,p}/C_{n-,d}$ decreases, the depletion layer extends into the n-buffer layer 15, and is liable to impinge against the first buffer portion nb1, so that the n-buffer layer 15 exhibits a behavior close to the characteristic exhibited by the conventional n-buffer layer.

From the foregoing, even in the diode structure shown in FIG. 2C, the n-buffer layer 15 of the present invention which has the impurity profile as shown in FIG. 6A can realize a stable withstand voltage characteristic, reduction of the off-loss based on the low leak current under off-operation, that is, under withstand voltage retention, enlargement of the operation guarantee temperature range for guaranteeing the snappy recovery operation to the low-temperature side, and great improvement of the breaking capability during the recovery operation, which are technical targets to be solved in the present invention. In the embodiments 1 and 2 of the present invention, it is preferable that the permissible range of the impurity concentration gradient $\delta_{nb2}$ at a portion on the n-drift layer side of the second buffer portion nb2 ranges from 0.05 to 0.50 decade cm$^{-3}$/μm. However, the effect of the present invention can be obtained by making the impurity concentration gradient on the n-drift layer side of the second buffer portion nb2 gentler than the impurity concentration gradient on the n-drift layer side of the first buffer portion nb1.

Embodiment 3

There will be described an n-buffer layer 15 for suppressing the snap-off phenomenon during the recovery operation and the subsequent oscillation phenomenon caused by the snap-off phenomenon and improving the breakdown resistance during the recovery operation in a diode having the cathode side structure shown in FIG. 2B including only the n$^+$-cathode layer 17 as a semiconductor device according to an embodiment 3 of the present invention.

FIG. 2B shows a diode containing the technique of the present invention along the A-A' line in FIG. 1. The n-drift layer 14 shown in FIG. 2B is formed by using an FZ wafer which has an impurity concentration $C_{n-,d}$ ranging from $1.0 \times 10^{12}$ to $1.0 \times 10^{15}$ cm$^{-3}$ and is formed by the FZ method. The final thickness of the n-drift layer 14 is set such that $t_{device}$ in FIG. 2A substantially ranges from 40 to 700 μm. Each diffusion layer constituting the diode of FIG. 2B is formed by using the ion implantation and the annealing technique in the same process as the wafer process shown in FIG. 5 for manufacturing the diode of FIG. 2C so that the following parameters are set as follows.

p-anode layer 10: the surface impurity concentration is not less than $1.0 \times 10^{16}$ cm$^{-3}$, the peak impurity concentration ranges from $2.0 \times 10^{16}$ to $1.0E^{18}$ cm$^{-3}$, and the depth ranges from 2.0 to 10.0 μm.

n$^+$-cathode layer 17: the surface impurity concentration ranges from $1.0 \times 10^{18}$ to $1.0 \times 10^{21}$ cm$^{-3}$, and the depth ranges from 0.3 to 1.0 μm.

The n-buffer layer 15 has a first buffer portion nb1 on the side of the n$^+$-cathode layer 17, and a second buffer portion nb2 on the side of the n-drift layer 14. The peak impurity concentration $C_{nb1,p}$ of the first buffer portion nb1 ranges from $1.0 \times 10^{16}$ to $5.0 \times 10^{16}$ cm$^{-3}$, and the depth $X_{j,nb1}$ ranges from 2.0 to 5.0 μm. The peak impurity concentration $C_{nb2,p}$ of the second buffer portion nb2 ranges from $5.0 \times 10^{13}$ to $5.0 \times 10^{14}$ cm$^{-3}$, and the depth $X_{j,nb2}$ ranges from 4.0 to 50 μm.

Figure 28:
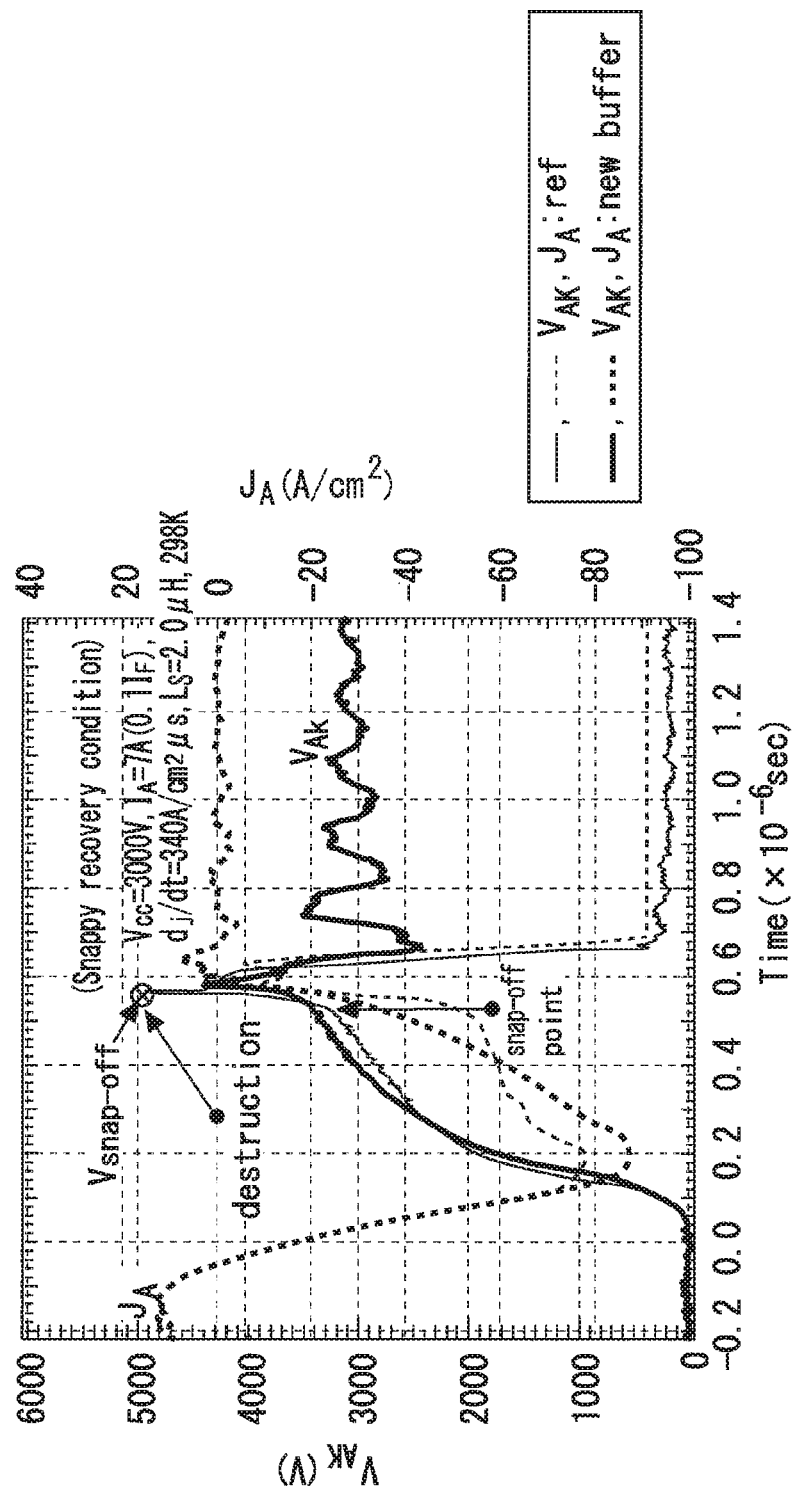
FIG. 28 is a diagram showing the n-buffer structure dependency of the waveform during the snappy recovery operation in the 4500V class diode a structure in FIG. 2.

FIG. 28 is a diagram showing the n-buffer structure dependency during the snappy recovery operation at 298K in the diode of FIG. 2B of 4500V class. In FIG. 28, "ref." represents a result of a sample using the conventional n-buffer layer 15, and "new buffer" represents a result of a sample using the n-buffer layer 15 of the present invention. In FIG. 28, a mark x surrounded by a circle represents a point at which the device is destroyed. The diode of FIG. 2B has a smaller snap-off phenomenon suppressing effect during the recovery operation than the diode of FIG. 2C. This is because the residual carrier plasma layer is liable to lack on the cathode side in the last half of the recovery operation. Accordingly, there is a risk that the snap-off phenomenon occurs like the waveform of the conventional n-buffer layer of FIG. 28 and the device is led to device destruction.

However, the diode having the structure of FIG. 2B using the n-buffer layer 15 of the present invention has an effect that when the depletion layer extending from the main junction shown in FIG. 2 during the recovery operation extends from the junction portion between the n-drift layer 14 and the second buffer portion nb2 to the second buffer portion nb2, the extending speed of the depletion layer is reduced by the gentle concentration gradient of the second buffer layer nb2, and the voltage is reduced regardless of occurrence of the snap-off phenomenon as compared with the case where the conventional n-buffer layer is used. Furthermore, at a point where the snap-off phenomenon occurs in the conventional n-buffer layer, the snap-off point can be delayed because the residual carrier plasma layer exists on the cathode side.

Figure 29:
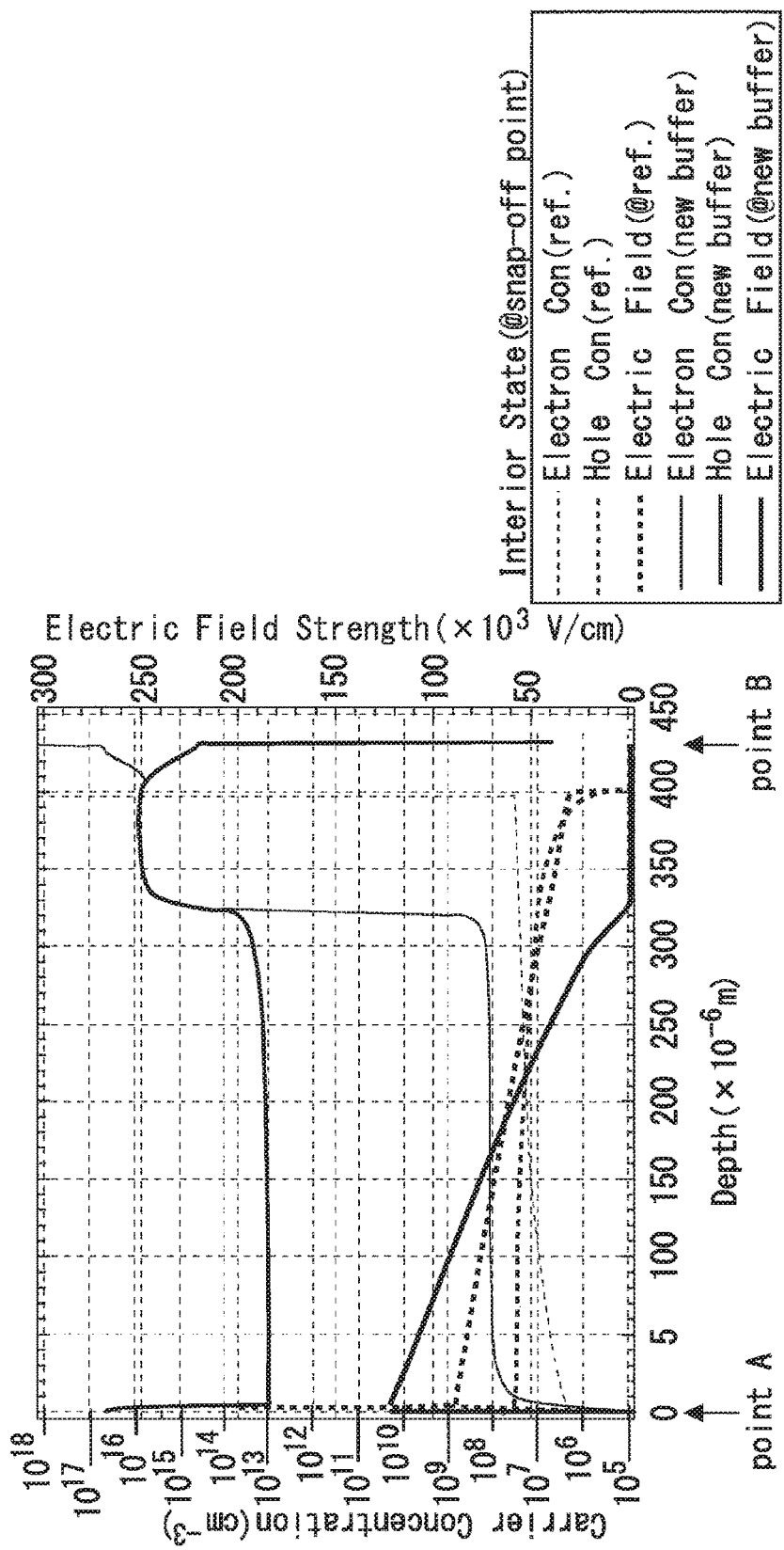
FIG. 29 is a diagram showing the n-buffer structure dependency of the device interior state at the snap-off point of FIG. 28 with regard to the 4500V class diode a structure in FIG. 2.

FIG. 29 shows a simulation result of the device interior state at the snap-off point in the diode of FIG. 2B using the conventional n-buffer layer shown in FIG. 28. The interior state associated with the n-buffer layer 15 of the present invention is shown in FIG. 29 together with the conventional n-buffer layer 15. From FIG. 29, the result shows that the residual carrier plasma layer lacks on the cathode side in the conventional n-buffer layer. On the other hand, the result shows that the carrier plasma layer exists on the cathode side as shown in FIG. 3B in the diode of FIG. 2B using the n-buffer layer 15 of the present invention, and no snap-off phenomenon occurs at the point where the snap-off phenomenon occurs in the sample of the conventional n-buffer layer as shown in FIG. 28.

Figure 30:
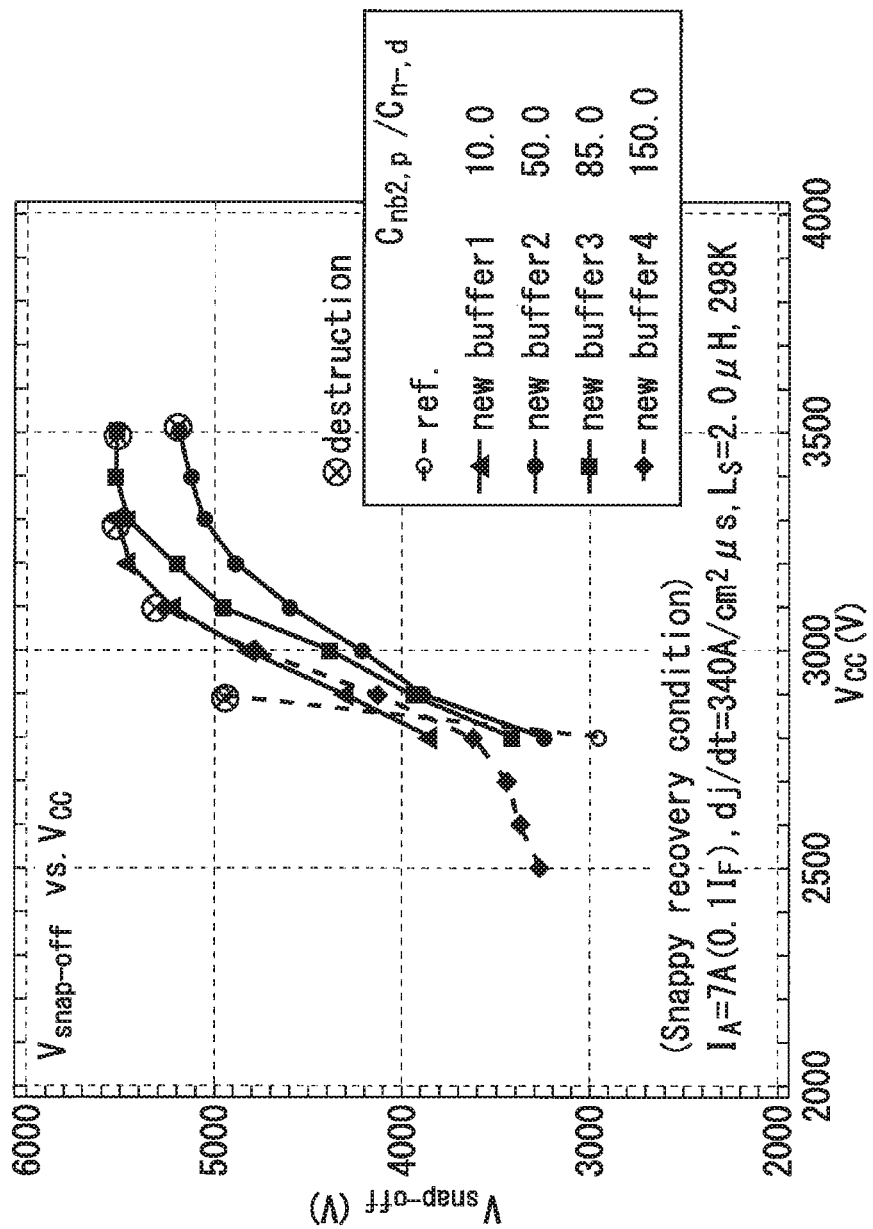
FIG. 30 is a diagram showing the n-buffer structure dependency of the relationship between $V_{snap\text{-}off}$ and Vcc in the 4500V class diode a structure in FIG. 2.

FIG. 30 is a diagram showing the n-buffer structure dependency of the relationship between $V_{snap\text{-}off}$ and Vcc at 298K in the diode of FIG. 2B of 4500V class. A mark x surrounded by a circle in FIG. 30 represents a point where the device is destroyed. It is understood from FIG. 30 that by using the n-buffer layer 15 of the present invention, the point where the device is destroyed shifts to a high Vcc side, and the breakdown resistance during the snappy recovery operation can be enhanced even in the structure of FIG. 2B. However, it is necessary to set proper parameters of the n-buffer layer 15 even in the diode structure of FIG. 2B when the n-buffer layer 15 of the present invention is used as in the case of the embodiments 1 and 2 as described above. That is, when the value of $C_{nb2,p}/C_{n\text{-},d}$ increases excessively, the electric field strength of the junction portion between the n-drift layer 14 and the second buffer portion nb2 conversely increases, so that the device is liable to be destroyed. Therefore, even when the n-buffer layer 15 of the present invention is used for the diode of FIG. 2B, it is necessary to set the value of $C_{nb2,p}/C_{n\text{-},d}$ in the permissible range described with reference to the embodiments 1 and 2.

Embodiment 4

Figure 31:
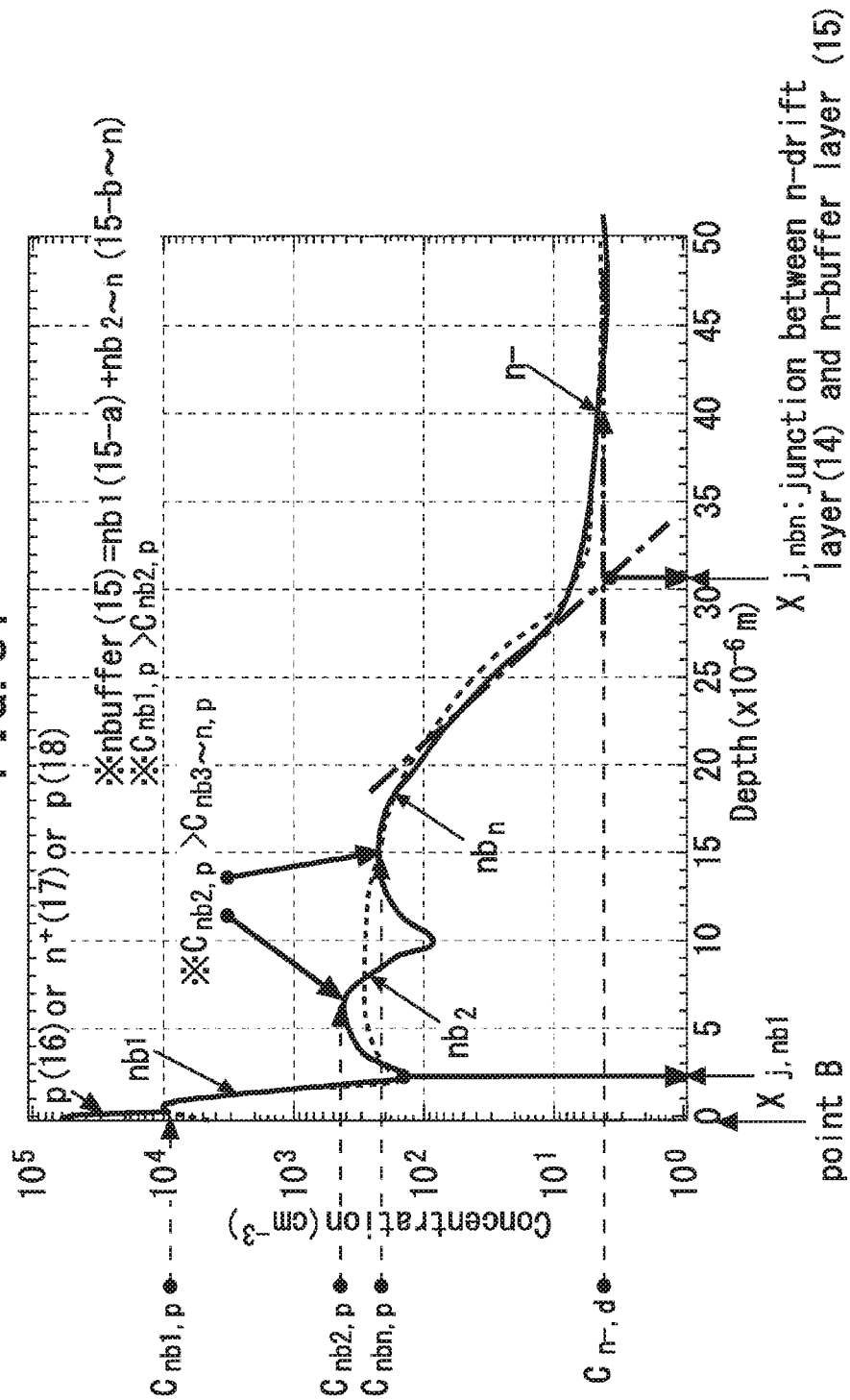
FIG. 31 is diagram showing, in a solid line, the impurity profile of the present invention along B-B' line, C-C' line, and D-D' line in FIG. 2.

A semiconductor device according to an embodiment 4 of the present invention has an n-buffer layer different from the n-buffer layer according to the embodiments 1 to 3. FIG. 31 is a diagram showing an impurity distribution of the n-buffer layer of the semiconductor device according to the embodiment 4. FIG. 31 discloses that the n-buffer layer 15 comprises a first buffer portion nb1, a second buffer portion nb2 and a third buffer portion nb3. From another viewpoint, this means that plural second buffer portions nb2 are formed. The effect to the device characteristics as shown in the embodiments 1 to 3 is expected by the configuration as described above.

In this case, the peak position when ion species are introduced into Si by the ion implantation, the irradiation technique or the like to form plural buffer portions is set to be deeper than the junction portions (Xj, nb2 to n) of the respective buffer portions. For example, the impurity peak position of the second buffer portion is set to be deeper than the junction portion between the first buffer portion and the second buffer portion, and the impurity peak position of the third buffer portion is set to be deeper than the junction portion between the second buffer portion and the third buffer portion.

The vertical structure on the substrate bottom side frequently has an impurity layer doped with impurities, an n-buffer layer provided on the impurity layer, and an n-drift layer on the n-buffer layer. The impurity layer is a collector layer in the case of an IGBT, and a cathode layer in the case of a diode. When the n-buffer layer 15 has buffer portions of three or more layers which are different in the peak impurity concentration and the distance from the back surface of the n-buffer layer 15 as in the embodiment 4 of the present invention, after completion of activation annealing on the first buffer portion which is a buffer portion nearest to the impurity layer among the buffer portions, the remaining buffer portions are formed. In other words, with respect to the plural buffer portions, they are successively formed from the collector layer side or the cathode layer side.

The n-buffer layer 15, and the first buffer portion nb1 and the second to n-th buffer portions nb2 to n which constitute the n-buffer layer 15 satisfy the following relationship. The second to n-th buffer portions nb2 to n can express plural portions like a second buffer portion nb2, a third buffer portion nb3, a fourth buffer portion nb4, etc. by inputting an integer larger than 3 as n.

The n-buffer layer having the plural buffer portions is formed so as to satisfy the following relationship.

$$C_{nb1,p} > C_{nb2 \text{ to } n,p}$$

$$X_{j,nb1} < X_{j,nb2 \text{ to } n}$$

$$\delta_{nb1} > \delta_{nb2 \text{ to } n}$$

$C_{nb1,p} > C_{nb2 \text{ to } n,p}$ means that the peak impurity concentration of the first buffer portion is highest among the plural buffer portions.

$\delta_{nb1} > \delta_{nb2 \text{ to } n}$ means that the first buffer portion nb1 has the highest impurity concentration gradient among the plural buffer portions. Furthermore, from the foregoing relationship, the relationship between the role of each of the first buffer portion nb1 and the second to n-th buffer portions nb2 to n constituting the n-buffer layer 15 of the embodiment, and the role of the targeted n-buffer layer shown in FIG. 3 is as follows.

First buffer portion: takes a role in stopping the depletion layer extending from the main junction portion under static state to achieve a stable withstand voltage characteristic and reduce the off-loss based on low leak current under off-operation, that is, under withstand voltage retention.

Second to n-th buffer portions: takes a role in increasing the base width of the pnp transistor, and consequently takes a role in decreasing αpnp to reduce the off-loss based on low leak current under off-operation, that is, under withstand voltage retention, a role in making the extending speed of the depletion layer extending from the main junction under static and dynamic states slower than that when the depletion layer moves in the n-drift layer 14, and causing a residual carrier plasma layer to maintain its existence from ON-state to control the electric field strength distribution.

With respect to the permissible range of the parameters of the n-buffer layer 15 described with reference to the embodiment 1, the following relationship is satisfied in the case of the impurity profile shown in FIG. 31.

With respect to the value of $C_{nb1,p}/C_{n-,d}$, the portions other than the first buffer portion out of the plural buffer portions, and the n-drift layer satisfy the following relationship.

[Math. 2]

$$\frac{\sum_{i=2}^{n} C_{nbi,p}}{C_{n-,d}} = 2 \sim 100$$

Here, $C_{n-,d}$: the impurity concentration of the n-drift layer 14, $C_{nbi,p}$: the peak concentrations of the second to n-th buffer portions nb2 to n, more specifically, the peak impurity concentration in the area from the position near the lower surface of the n-buffer layer to an i-th buffer portion, and α value is as follows.

[Math. 3]

$$\alpha = \frac{\sum_{i=2}^{n} Dose_{nbi,effect}}{Dose_{nb1,effect} + \sum_{i=2}^{n} Dose_{nbi,effect}} \times 100,$$

$$\alpha = 0.5 \sim 5.0\%$$

Here, $Dose_{nb1,effect}$: the effective dose amount after activation of the first buffer portion nb1, $Dose_{nb2\ to\ n,\ effect}$: the effective dose amount after activation of the second to n-th buffer portions nb2 to n.

The first buffer portion nb1 has the largest effective dose amount after activation among the plural buffer portions. This relational expression represents that the rate α of the effective dose amount after activation of the buffer portions other than the first buffer portion out of the plural buffer portions, which occupies the effective dose amount after activation of the n-buffer layer, ranges from 0.5 to 5%.

In the IGBT, the buffer portion nearest to the p-collector layer is the first buffer portion. In the diode, the buffer portion nearest to the cathode layer is the first buffer portion. In order to obtain the effect of the present invention, the impurity concentration gradient of the buffer portion nearest to the n-drift layer is set in the range from 0.05 to 0.50 decade $cm^{-3}/\mu m$. As described above, the n-buffer layer 15 having buffer portions of three or more layers which are different in the peak impurity concentration and the distance from the back surface of the n-buffer layer can be provided. Comparing the impurity concentration gradients of the plural buffer portions on the n-drift layer side out of the plural buffer portions, the effect of the present invention can be obtained by making the impurity concentration gradient of the buffer portion nearest to the n-drift layer gentlest.

Embodiment 5

A semiconductor device according to an embodiment 5 of the present invention relates to a technique for improving the breaking capability under turn-off operation of an IGBT and a diode from the relationship between the constituent elements of the power semiconductor shown in FIG. 1 and the characteristic n-buffer layers 15 shown in the embodiments 1 to 4.

FIGS. 32A, 32B and FIGS. 32C to 32G are cross-sectional views of the IGBT and the diode using the n-buffer layer 15 of the present invention added with the constituent elements of FIG. 1, the cross-sectional views being taken along the A"-A'" line shown in FIG. 1. As shown in the figures, the vertical structure in contact with the metal 29 is different between the active cell region 1 and the area from the intermediate region 2 to the edge termination region 5 in both of the IGBT and the diode. That is, the structure shown in FIG. 32 is a structure for suppressing injection of carriers from the collector side or cathode side from the intermediate region 2 to the edge termination region 5 from ON-state in both the IGBT and the diode.

Figure 32A:
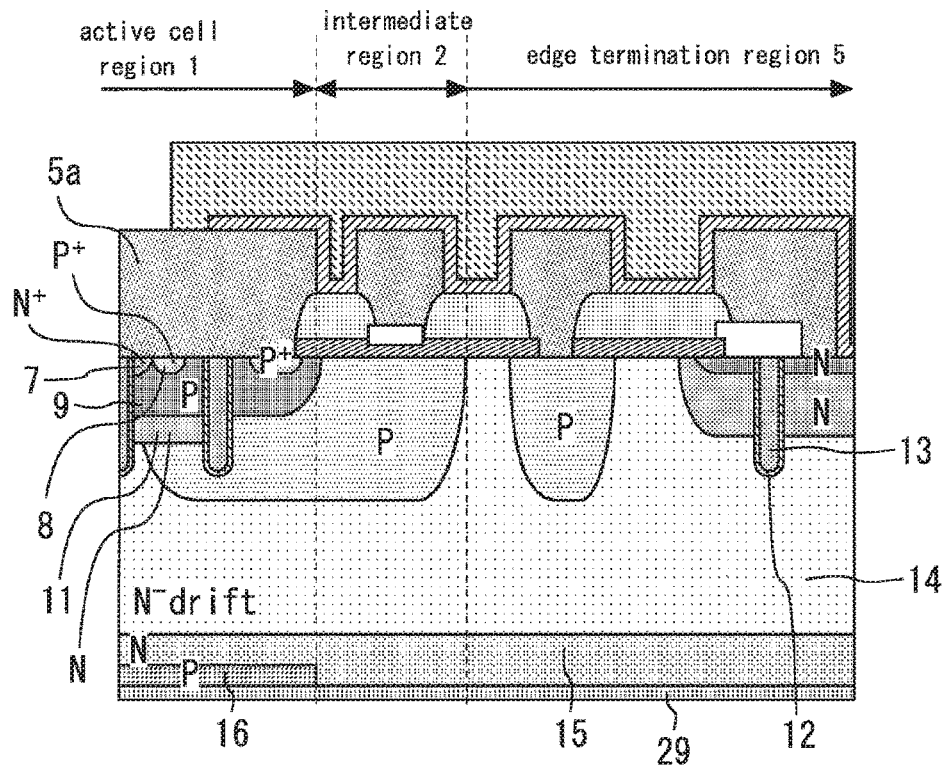
FIG. 32A is a structural diagram of trench gate type IGBT having a n-buffer layer of the present invention shown in FIG. 6A or 31.

FIG. 32A shows the IGBT in which the collector layer 16 and the metal 29 are in contact with each other in the active cell region 1 while the n-buffer layer 15 and the metal 29 are in contact with each other in the intermediate region 2 and the edge termination region 5.

Figure 32B:
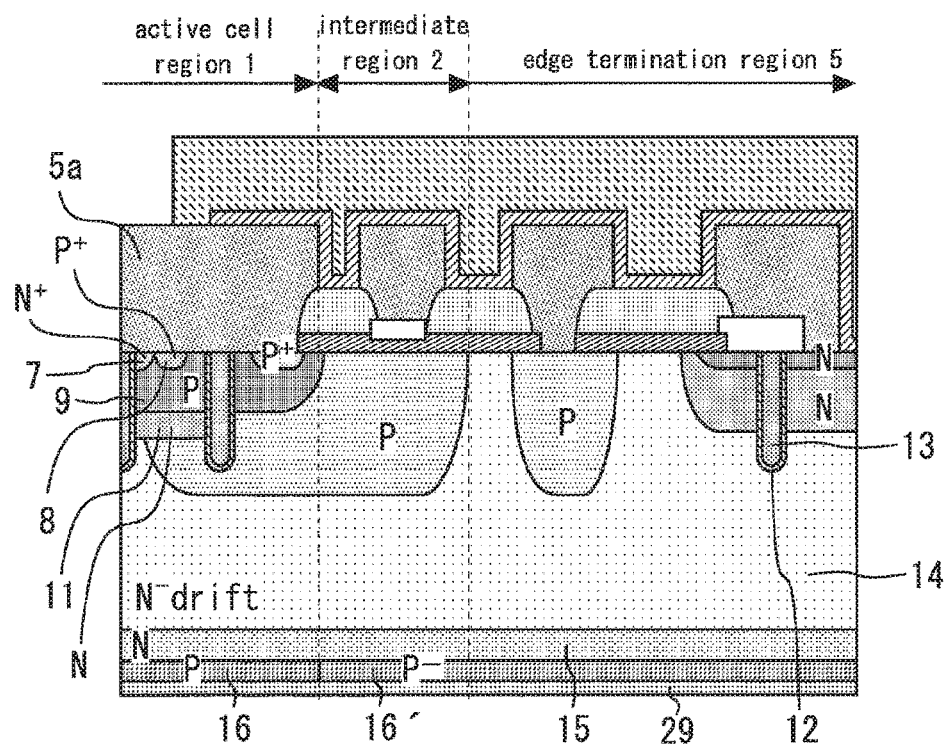
FIG. 32B is a structural diagram of trench gate type IGBT having a n-buffer layer of the present invention shown in FIG. 6A or 31.

A low concentration p-collector layer 16' in contact with the metal 29 from the intermediate region 2 to the edge termination region 5 shown in FIG. 32B is a diffusion layer whose surface concentration is lower than the p-collector layer 16 existing in the active cell region 1. In the active cell region 1, the p-collector layer 16 is in contact with the metal 29, whereas in the intermediate region 2 and the edge termination region 5, the p-collector layer 16' having a lower impurity concentration than the p-collector layer 16 is in contact with the metal 29. That is, the vertical structure on the bottom side of the intermediate region 2 and the edge termination region 5 has the n-drift layer 14, the n-buffer layer 15 and the lower concentration p-collector layer 16'. As a result, the structure of the present invention has an action of moderating the electric field strength of the main junction pn junction portion existing in the intermediate region 2 during turn-off operation, suppressing increase of the local electric field strength and suppressing thermal destruction caused by local temperature increase which occurs due to current concentration caused by impact ionization.

The details of the mechanism and effect of this phenomenon are disclosed in Japanese Patent No. 5,708,803 and Japanese Patent No. 5,701,447 for the IGBT, and also disclosed in JP2014-241433A (U.S. Pat. No. 8,686,469) for the diode. In the structure shown in FIG. 32, not only the foregoing action and effect inherent to the structure shown in FIG. 32 is obtained, but also an effect associated with the device performance aspect by the n-buffer layer 15 of the present invention shown in the examples 1 to 4 is additionally obtained by using the n-buffer layer 15 of the present invention.

Figure 32C:
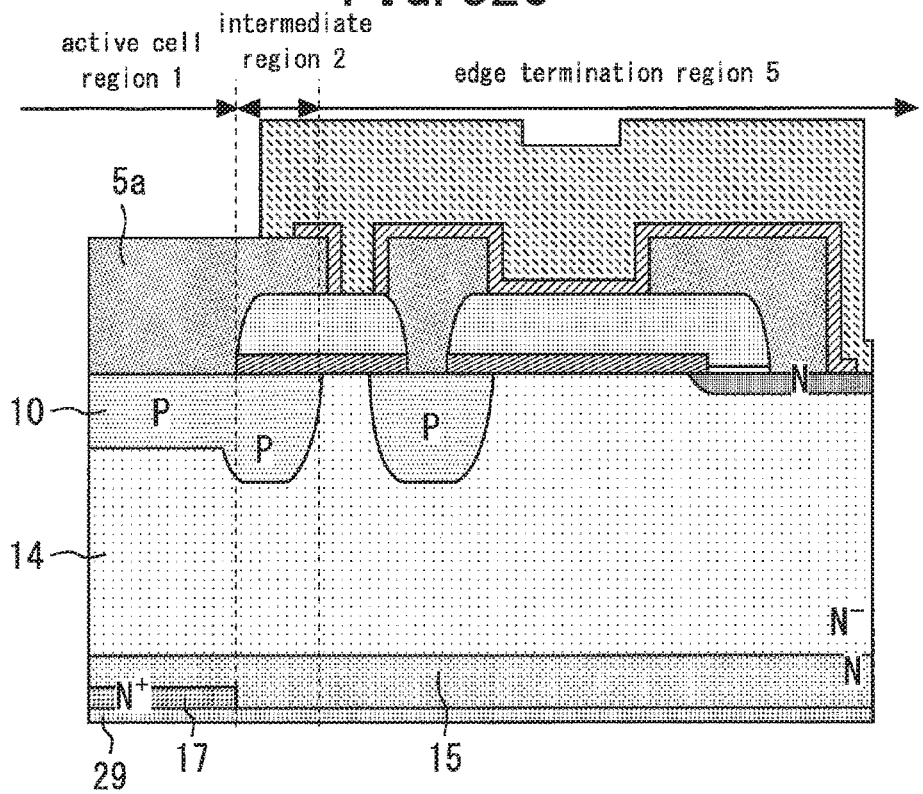
FIG. 32C is a structural diagram of diode having a n-buffer layer of the present invention shown in FIG. 6A or 31.

FIG. 32C discloses a diode in which the cathode layer 17 and the metal 29 are in contact with each other in the active cell region 1, and the n-buffer layer 15 and the metal 29 are in contact with each other in the intermediate region 2 and the edge termination region 5. That is, the vertical structure in the edge termination region 5 and the intermediate region 2 has only the n-drift layer 14 and the n-buffer layer 15.

Figure 32D:
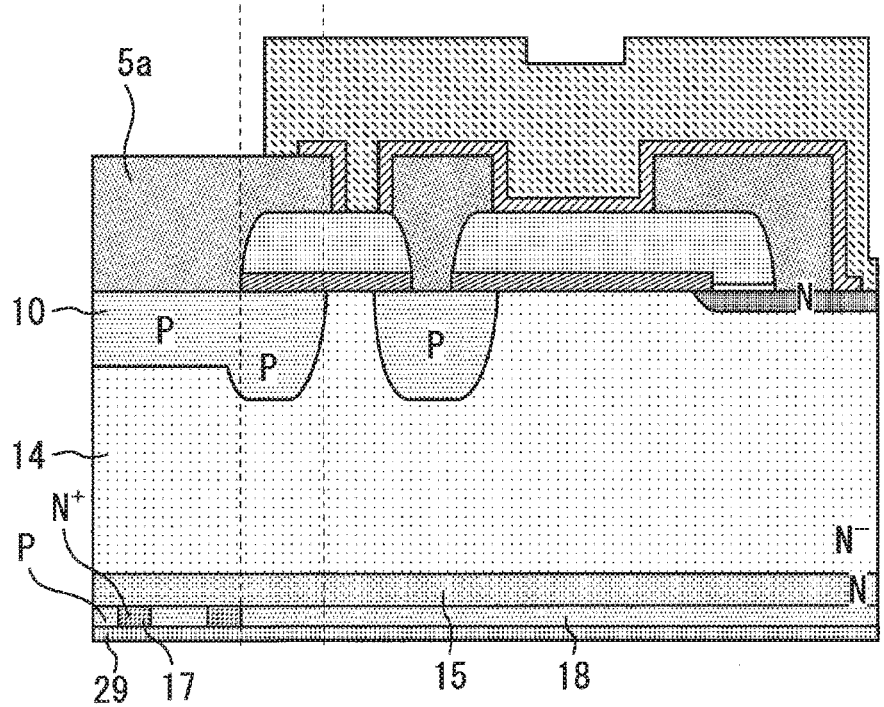
FIG. 32D is a structural diagram of diode having a n-buffer layer of the present invention shown in FIG. 6A or 31.
Figure 32E:
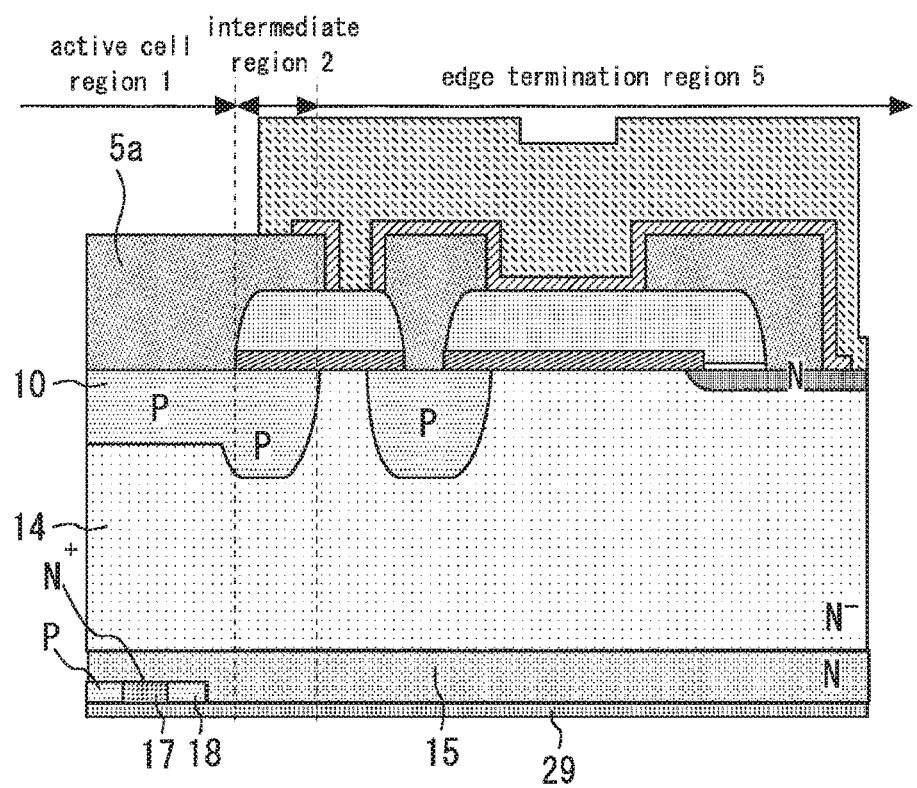
FIG. 32E is a structural diagram of diode having a n-buffer layer of the present invention shown in FIG. 6A or 31.
Figure 32F:
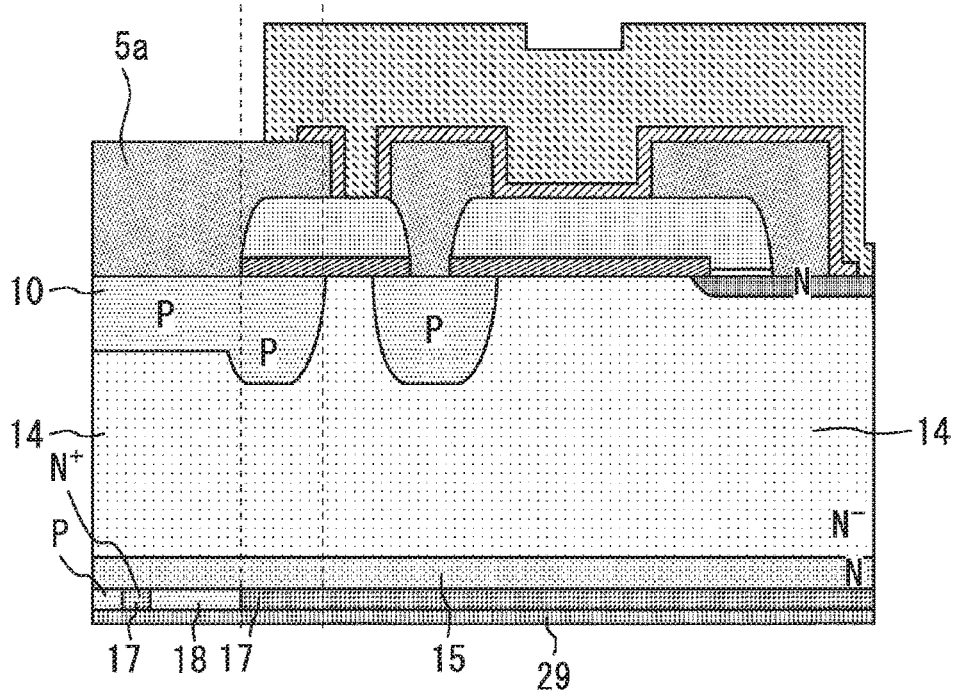
FIG. 32F is a structural diagram of diode having a n-buffer layer of the present invention shown in FIG. 6A or 31.
Figure 32G:
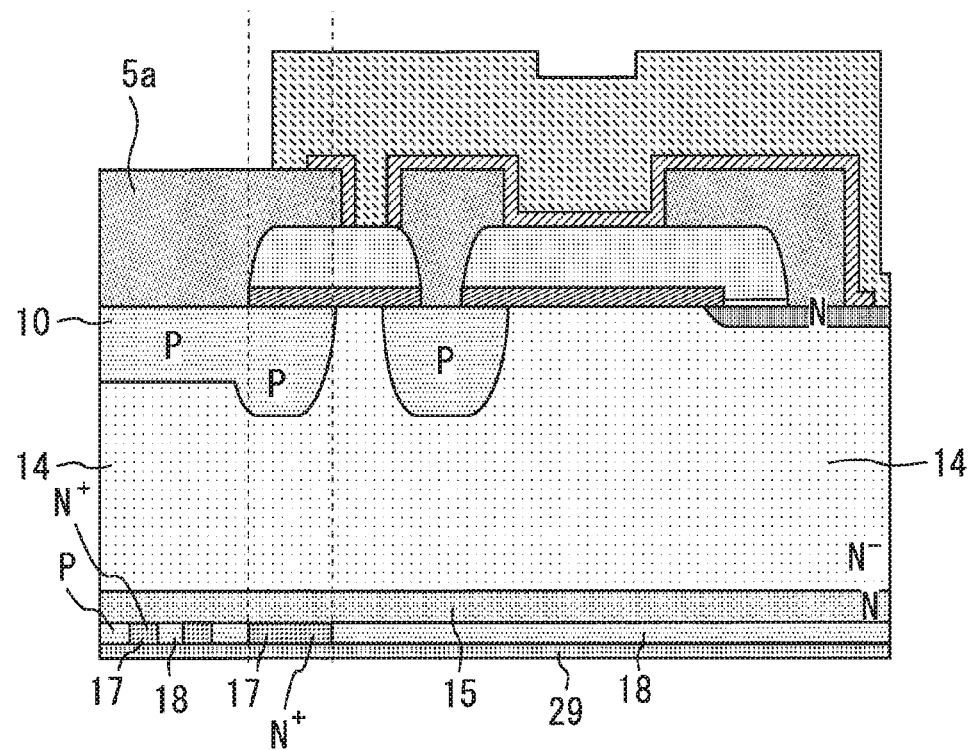
FIG. 32G is a structural diagram of diode having a n-buffer layer of the present invention shown in FIG. 6A or 31.

FIG. 32D discloses a diode in which the n-cathode layer 17 and the p-cathode layer 18 are in contact with the metal 29 in the active cell region 1, and the p-cathode layer 18 and the metal 29 are in contact with each other in the intermediate region 2 and the edge termination region 5. That is, the vertical structure in the edge termination region 5 and the intermediate region 2 has the n-drift layer 14, the n-buffer layer 15 and the p-cathode layer 18.

Figure 35B:
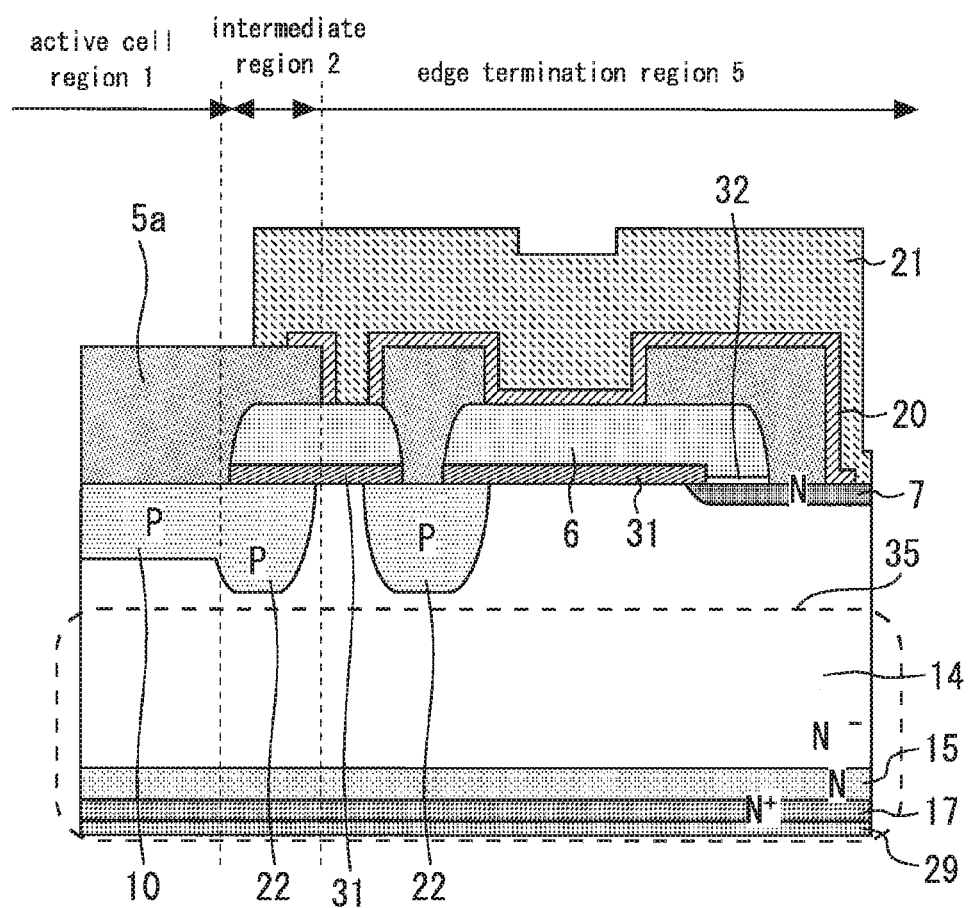
FIG. 35B is a structural diagram of diode a of FIG. 2 having a conventional n-buffer layer of FIG. 6A.

FIG. 35A discloses that the vertical structure on the bottom side of the intermediate region 2 and the edge termination region 5 has the n-drift layer 14, the n-buffer layer 15 and the p-collector layer 16. Furthermore, FIG. 35B discloses that the vertical structure on the bottom side of the intermediate region 2 and the edge termination region 5 has the n-drift layer 14, the n-buffer layer 15 and the cathode layer 17.

Figure 33:
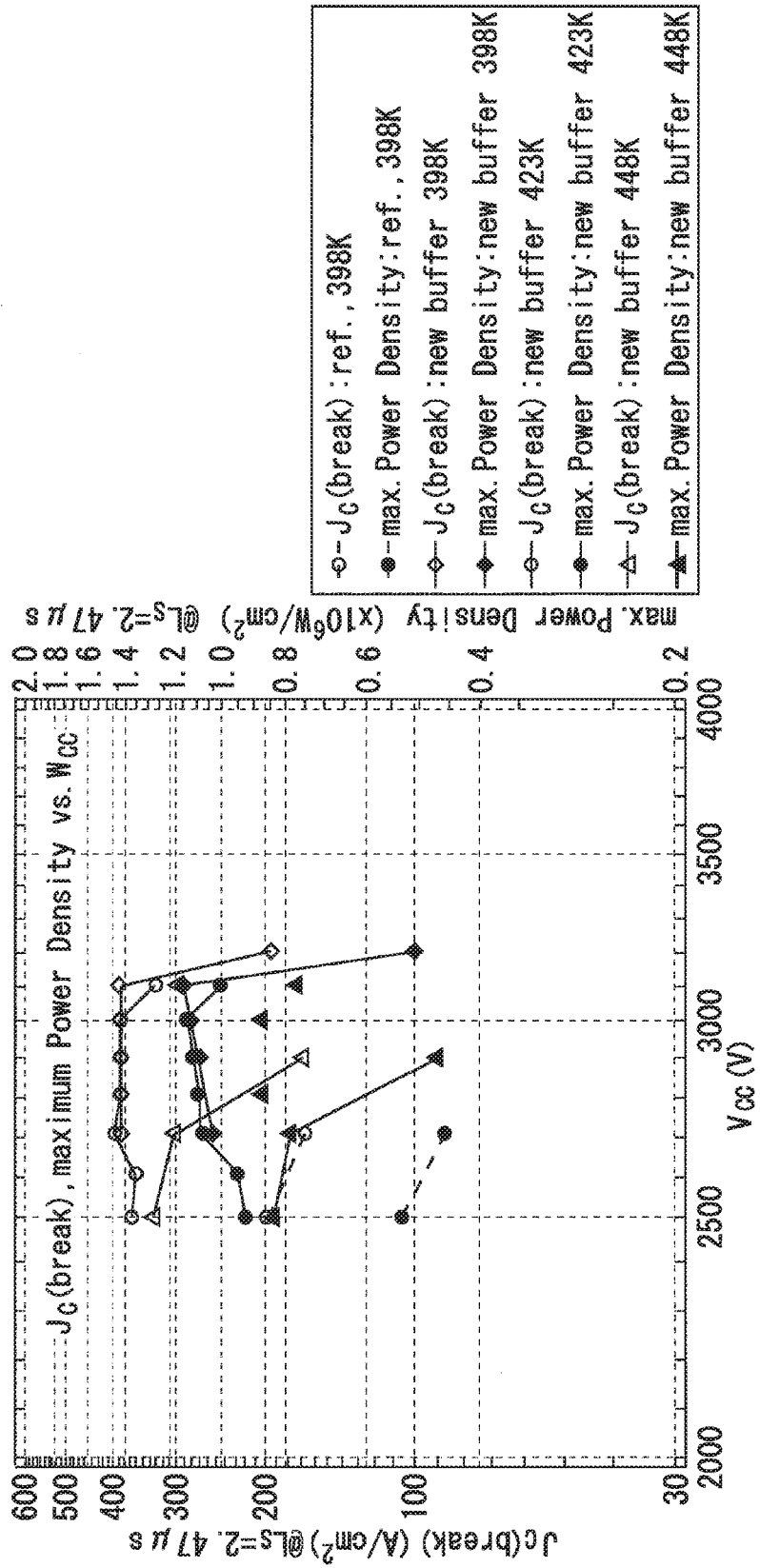
FIG. 33 shows a comparison between IGBT having present invention n-buffer layer of FIG. 32A and IGBT having a conventional n-buffer layer of FIG. 35A with regard to the RBSOA of 3300V class IGBT of FIG. 2. Temperature dependence of RBSOA is provided as to IGBT structure having present invention n-buffer layer of FIG. 32A.

FIG. 33 shows an RBSOA of the structure in which the conventional n-buffer layer 15 is provided to the IGBT shown in FIG. 2A of 3300V class, and an RBSOA of the structure in which the n-buffer layer 15 of the present invention shown in FIG. 6A is provided to the IGBT shown in FIG. 2A of 3300V class. The structure of the IGBT is the structure of FIG. 32A. The result of the sample using the n-buffer layer 15 of the present invention also additionally exhibits the operating temperature dependency. Jc(break) and max. Power Density on the ordinate axis represent the maximum breaking current density and the maximum power density under turn-off operation, respectively. In FIG. 33, "new buffer" represents the result of the sample using the n-buffer layer 15 of the present invention. The inside of a line representing the Vcc dependency of each parameter corresponds to an SOA.

Figure 34:
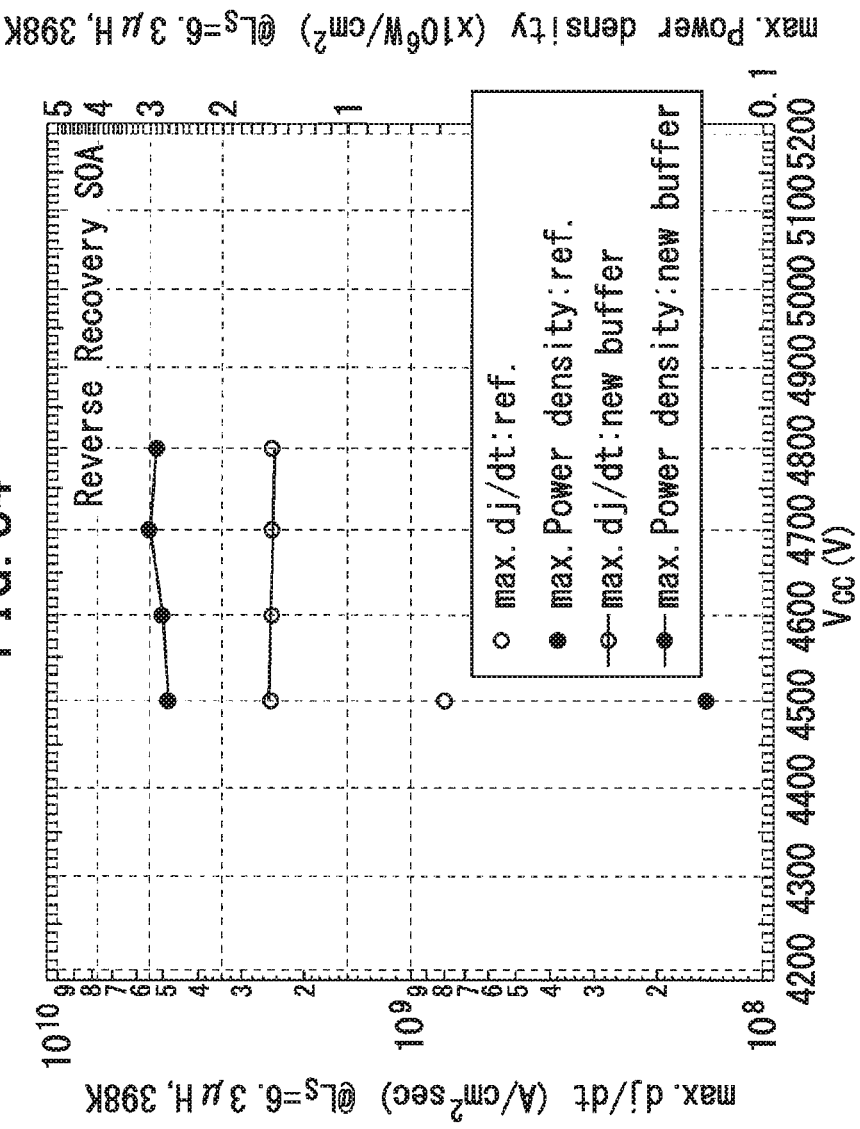
FIG. 34 shows a comparison between diode having present invention n-buffer layer of FIG. 32D and diode having a conventional n-buffer layer of FIG. 35C with regard to the recovery SOA of 6500V class diode b structure of FIG. 2.
Figure 35C:
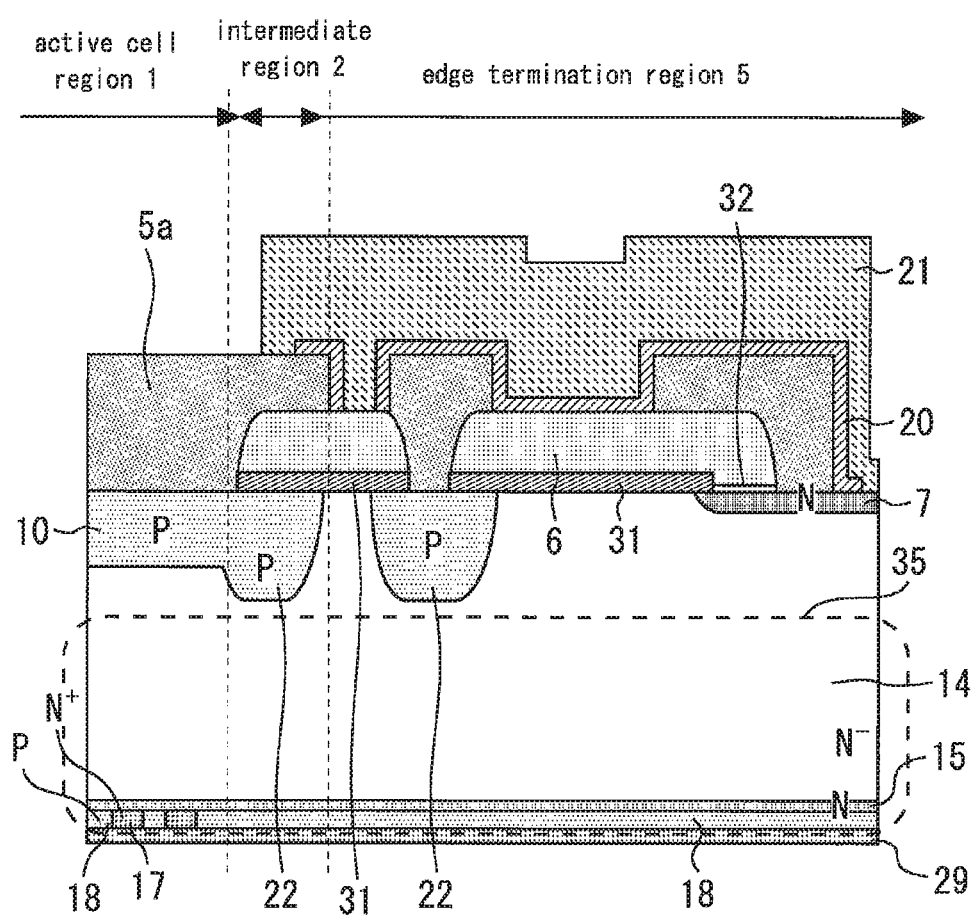
FIG. 35C is a structural diagram of diode b of FIG. 2 having a conventional n-buffer layer of FIG. 6A.

FIG. 34 shows a recovery SOA in the diode of FIG. 35C having the conventional n-buffer layer 15 of 6500V class and a recovery SOA in the structure having the n-buffer layer 15 of the present invention shown in FIG. 32D, E of 6500V class. On the ordinate axis, max·$dj_A/dt$ and max. Power Density represent the maximum value of the time derivative dj/dt of the maximum breaking current density and maximum power density during the recovery operation, respectively.

In FIG. 34, "new buffer" represents the result of a sample using the n-buffer layer 15 of the present invention. The inside of a line representing the Vcc dependency of each parameter in FIG. 34 represents an SOA. From FIGS. 33 and 34, the SOA during turn-off operation is more greatly enlarged in the IGBT and the diode which have the n-buffer layer and suppress injection of carriers from the collector side, the cathode side from the intermediate region 2 to the edge termination region 5 as compared with the IGBT and the diode which have the conventional n-buffer layer. Accordingly, the great enhancement of the turn-off breaking capability which is one object of the present invention can be realized.

Furthermore, the action for suppressing injection of carriers from the collector side, the cathode side from the intermediate region to the edge termination region 5 under ON-state is exhibited. Even in the structures shown in FIGS. 31B, 31C, 31F and 31G, the same effect as the effect shown in FIGS. 33 and 34 can be obtained.

The effect of the present invention may be further enhanced by properly combining the features of the semiconductor devices according to the foregoing embodiments.

1 active cell region, 2 intermediate region, 5 edge termination region, 15 n-buffer layer, nb1 first buffer portion, nb2 second buffer portion, 35 vertical structure

The invention claimed is:

1. A semiconductor device comprising:
an active cell region;
an edge termination region surrounding the active cell region; and
an intermediate region located at an intermediate position between the active cell region and the edge termination region, wherein
the active cell region has a trench gate type MOS structure on a top side thereof, and has a p-collector layer, an n-buffer layer on the p-collector layer, and an n-drift layer on the n-buffer layer as a vertical structure on a bottom side thereof, and the n-buffer layer has a first buffer portion provided on a p-collector layer side, and a second buffer portion provided on an n-drift layer side,
a peak impurity concentration of the first buffer portion is higher than a peak impurity concentration of the second buffer portion, and an impurity concentration gradient on the n-drift layer side of the second buffer portion is gentler than an impurity concentration gradient on the n-drift layer side of the first buffer portion, and
the n-buffer layer is included in each of the edge termination region and the intermediate region.

2. The semiconductor device according to claim 1, wherein the impurity concentration gradient of the first buffer portion is larger than the impurity concentration gradient of the second buffer portion.

3. The semiconductor device according to claim 1, wherein an effective dose amount after activation of the first buffer portion is larger than an effective dose amount after activation of the second buffer portion.

4. The semiconductor device according to claim 1, wherein a peak position of an impurity concentration of the second buffer portion is located to be nearer to a junction portion between the first buffer portion and the second buffer portion than a center portion of the second buffer portion.

5. The semiconductor device according to claim 1, wherein a value obtained by dividing the peak impurity concentration of the second buffer portion by an impurity concentration of the n-drift layer ranges from 2 to 100.

6. The semiconductor device according to claim 1, wherein a value obtained by dividing the peak impurity concentration of the first buffer portion by the peak impurity concentration of the second buffer portion ranges from 20 to 1000.

7. The semiconductor device according to claim 1, wherein a rate of an effective dose amount after activation of the second buffer portion that occupies an effective dose amount after activation of the n-buffer layer ranges from 0.5 to 5.0%.

8. The semiconductor device according to claim 1, wherein a vertical structure of the edge termination region and the intermediate region has only the n-drift layer and the n-buffer layer.

9. The semiconductor device according to claim 1, wherein a vertical structure on a bottom side of the edge termination region and the intermediate region has the n-drift layer, the n-buffer layer, and a low concentration collector layer having a lower impurity concentration than the p-collector layer.

10. The semiconductor device according to claim 1, wherein a vertical structure on a bottom side of the edge termination region and the intermediate region has the n-drift layer, the n-buffer layer, and the p-collector layer.

11. The semiconductor device according to claim 1, wherein the active cell region, the edge termination region and the intermediate region are formed by a wide bandgap semiconductor.

12. The semiconductor device according to claim 11, wherein the wide bandgap semiconductor is silicon carbide, gallium-nitride based material or diamond.

13. The semiconductor device according to claim 1, wherein an impurity concentration gradient of a portion on the n-drift layer side of the second buffer portion ranges from 0.05 to 0.50 decade cm$^{-3}$/μm.

14. A semiconductor device comprising:
an active cell region;
an edge termination region surrounding the active cell region; and
an intermediate region located at an intermediate position between the active cell region and the edge termination region, wherein
the active cell region has a p-anode layer on a top side, and has a cathode layer having an n-cathode layer, an n-buffer layer provided on the cathode layer, and an n-drift layer on the n-buffer layer,
the n-buffer layer has a first buffer portion provided on a cathode layer side, and a second buffer portion provided on an n-drift layer side,
a peak impurity concentration of the first buffer portion is higher than a peak impurity concentration of the second buffer portion, and an impurity concentration gradient on the n-drift layer side of the second buffer portion is gentler than an impurity concentration gradient on the n-drift layer side of the first buffer portion, and
the n-buffer layer is included in each of the edge termination region and the intermediate region.

15. The semiconductor device according to claim 14, wherein the cathode layer has a p-cathode layer.

16. The semiconductor device according to claim 14, wherein the cathode layer has a p-cathode layer, and a vertical structure of the edge termination region and the intermediate region has the n-drift layer, the n-buffer layer and the p-cathode layer.

17. The semiconductor device according to claim 14, wherein a vertical structure on a bottom side of the edge termination region and the intermediate region has the n-drift layer, the n-buffer layer, and the cathode-layer.

18. A semiconductor device comprising:
an active cell region;
an edge termination region surrounding the active cell region; and
an intermediate region located at an intermediate position between the active cell region and the edge termination region, wherein
the active cell region has a trench gate type MOS structure on a top side thereof, and has a p-collector layer, an n-buffer layer on the p-collector layer, and an n-drift layer on the n-buffer layer as a vertical structure on a bottom side thereof, and the n-buffer layer has buffer portions of three or more layers that are different in peak impurity concentration and distance from a back surface of the n-buffer layer,
the peak impurity concentration of a first buffer portion that is a buffer portion nearest to the p-collector layer is highest among a plurality of the buffer portions, and comparing impurity concentration gradients on the n-drift layer side of the plurality of buffer portions, the impurity concentration gradient of a buffer potion nearest to the n-drift layer is gentlest, and
the n-buffer layer is included in each of the edge termination region and the intermediate region.

19. The semiconductor device according to claim 18, wherein the first buffer portion has a highest impurity concentration gradient among the plurality of buffer portions.

20. The semiconductor device according to claim 18, wherein the first buffer portion has a largest effective dose amount after activation among the plurality of buffer portions.

21. The semiconductor device according to claim 18, wherein portions excluding the first buffer portions out of the plurality of buffer portions, and the n-drift layer satisfies the following relational expression:

$$\frac{\sum_{i=2}^{n} C_{nbi,p}}{C_{n-,d}} = 2 \sim 100$$

wherein Cnbi,p represents a peak impurity concentration of an i-th buffer portion from a position near a lower surface of the n-buffer layer, and Cn-,d represents an impurity concentration of the n-drift layer.

22. The semiconductor device according to claim 18, wherein a value obtained by dividing the peak impurity concentration of the first buffer portion by a peak impurity concentration of a second buffer portion which is a buffer portion adjacent to the first buffer portion ranges from 20 to 1000.

23. The semiconductor device according to claim 18, wherein a rate α of an effective dose amount after activation of buffer portions other than the first buffer portion out of the plurality of buffer portions, which occupies an effective dose amount after activation of the n-buffer layer, ranges from 0.5 to 5%.

24. The semiconductor device according to claim 18, wherein an impurity concentration gradient of a portion on the n-drift layer side out of the buffer portions ranges from 0.05 to 0.50 decade cm$^{-3}$/μm.

25. A semiconductor device comprising:
an active cell region;
an edge termination region surrounding the active cell region; and
an intermediate region located at an intermediate position between the active cell region and the edge termination region, wherein
the active cell region has a p-anode layer on a top side thereof, and has a cathode layer having an n-cathode layer, an n-buffer layer on the cathode layer, and an n-drift layer on the n-buffer layer as a vertical structure on a bottom side thereof, and the n-buffer layer has buffer portions of three or more layers that are different in peak impurity concentration and distance from a back surface of the n-buffer layer,
the peak impurity concentration of a first buffer portion that is a buffer portion nearest to the cathode layer is highest among a plurality of the buffer portions, and comparing impurity concentration gradients on the n-drift layer side of the plurality of buffer portions, the impurity concentration gradient of a buffer potion nearest to the n-drift layer is gentlest, and
the n-buffer layer is included in each of the edge termination region and the intermediate region.

26. A method for manufacturing a semiconductor device including an active cell region, an edge termination region surrounding the active cell region, and an intermediate region located at an intermediate position between the active cell region and the edge termination region, characterized in that a vertical structure on a bottom side of a substrate includes an impurity layer doped with impurities, an n-buffer layer provided on the impurity layer in the active cell region, the edge termination region, and the intermediate region, and an n-drift layer on the n-buffer layer, and the n-buffer layer having buffer portions of three or more layers that are different in peak impurity concentration and distance from a back surface of the n-buffer layer is formed by completing activation annealing on a first buffer portion which is a buffer portion nearest to the impurity layer among a plurality of the buffer portions, and then forming the remaining buffer portions.

27. The method for manufacturing a semiconductor device according to claim 26, wherein the peak impurity concentration of the first buffer portion is highest among the plurality of buffer portions.

28. The method for manufacturing a semiconductor device according to claim 26, wherein an impurity concentration gradient of a portion on the n-drift layer side out of the buffer portions ranges from 0.05 to 0.50 decade $cm^{-3}$/ μm.

* * * * *